(12) United States Patent
Hwang

(10) Patent No.: US 9,136,474 B2
(45) Date of Patent: Sep. 15, 2015

(54) METHOD OF FABRICATING PHASE-CHANGE RANDOM ACCESS MEMORY DEVICE

(71) Applicant: Samsung Electronics Co., Ltd., Suwon-Si, Gyeonggi-Do (KR)

(72) Inventor: Young-Nam Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 13/867,378

(22) Filed: Apr. 22, 2013

(65) Prior Publication Data

US 2013/0280882 A1    Oct. 24, 2013

(30) Foreign Application Priority Data

Apr. 23, 2012    (KR) .......................... 10-2012-0042168

(51) Int. Cl.
*H01L 47/00* (2006.01)
*H01L 45/00* (2006.01)
*H01L 27/24* (2006.01)

(52) U.S. Cl.
CPC ........ *H01L 45/1666* (2013.01); *H01L 27/2436* (2013.01); *H01L 45/00* (2013.01); *H01L 45/1233* (2013.01); *H01L 45/1246* (2013.01); *H01L 45/144* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 8,148,193 B2 | 4/2012 | Park et al. | |
| 2008/0078984 A1 | 4/2008 | Park et al. | |
| 2009/0039333 A1 | 2/2009 | Chang et al. | |
| 2009/0230376 A1* | 9/2009 | Ryoo et al. | 257/2 |
| 2010/0127234 A1* | 5/2010 | Park | 257/4 |
| 2010/0181549 A1* | 7/2010 | Kim et al. | 257/3 |
| 2011/0312149 A1 | 12/2011 | Chang et al. | |

FOREIGN PATENT DOCUMENTS

| | | |
|---|---|---|
| KR | 100766504 B1 | 10/2007 |
| KR | 2009-0026679 A | 3/2009 |
| KR | 2009-0093393 A | 9/2009 |
| KR | 2009-0093401 A | 9/2009 |
| KR | 100967682 B1 | 7/2010 |
| KR | 2010-0092117 A | 8/2010 |

* cited by examiner

*Primary Examiner* — Yu Chen
*Assistant Examiner* — Nilufa Rahim
(74) *Attorney, Agent, or Firm* — Harness, Dickey & Pierce, P.L.C.

(57) ABSTRACT

A method of fabricating a semiconductor device is provided. The method includes forming semiconductor patterns on a semiconductor substrate, such that sides are surrounded by a lower interlayer insulating layer. A lower insulating layer is formed that covers the semiconductor patterns and the lower interlayer insulating layer. A contact structure is formed that penetrates the lower insulating layer and the lower interlayer insulating layer and is spaced apart from the semiconductor patterns. The contact structure has an upper surface higher than the semiconductor patterns. An upper insulating layer is formed covering the contact structure and the lower insulating layer. The upper and lower insulating layers form insulating patterns exposing the semiconductor patterns and covering the contact structure, and each of the insulating patterns includes a lower insulating pattern and an upper insulating pattern sequentially stacked. After the insulating patterns are formed, metal-semiconductor compounds are formed on the exposed semiconductor patterns.

6 Claims, 49 Drawing Sheets

METHOD OF FABRICATING PHASE-CHANGE RANDOM ACCESS MEMORY DEVICE

CROSS-REFERENCE TO RELATED APPLICATION

This application claims priority under 35 U.S.C. §119 to Korean Patent Application No. 10-2012-0042168 filed on Apr. 23, 2012, the disclosure of which is hereby incorporated by reference in its entirety.

BACKGROUND

1. Field

Example embodiments of inventive concepts relate to a semiconductor device having a contact structure and a metal-semiconductor compound, a method of fabricating the same, and an electronic device and electronic system employing the same.

2. Description of Related Art

With high integration of semiconductor devices, unexpected problems occur due to reducing the dimensions of components constituting the semiconductor devices.

SUMMARY

Some example embodiments of inventive concepts provide a semiconductor device capable of preventing agglomerations of a metal-semiconductor compound such as silicide, and a method of fabricating the same.

Other example embodiments of inventive concepts provide a semiconductor device having a metal-semiconductor compound and a contact structure, and a method of fabricating the same.

Other example embodiments of inventive concepts provide a semiconductor device including a semiconductor pattern and a contact structure having upper surfaces with different heights, and a method of fabricating the same.

Other example embodiments of inventive concepts provide a semiconductor device capable of improving process margin, and a method of fabricating the same.

Other example embodiments of inventive concepts provide an electronic device and electronic system having the above-described semiconductor devices.

Example embodiments of inventive concepts should not be limited by the above description, and other unmentioned aspects will be clearly understood by one of ordinary skill in the art from example embodiments described herein.

In accordance with some example embodiments of inventive concepts, a method of fabricating a semiconductor device is provided. The method may include forming semiconductor patterns on a semiconductor substrate, such that sides of the semiconductor patterns are surrounded by a lower interlayer insulating layer. A lower insulating layer may be formed that covers the semiconductor patterns and the lower interlayer insulating layer. A contact structure may be formed that penetrates the lower insulating layer and the lower interlayer insulating layer and is spaced apart from the semiconductor patterns. The contact structure may have an upper surface higher than the semiconductor patterns. An upper insulating layer may be formed that covers the contact structure and the lower insulating layer. The upper and lower insulating layers may be patterned to form insulating patterns that expose the semiconductor patterns and cover the contact structure, and each of the insulating patterns includes a lower insulating pattern and an upper insulating pattern sequentially stacked.

After forming the insulating patterns, metal-semiconductor compounds may be formed on the exposed semiconductor patterns.

In some example embodiments, before forming the contact structure, the method may further include forming a contact hole that penetrates the lower insulating layer and the lower interlayer insulating layer and exposes the semiconductor substrate, and forming an impurity region in the semiconductor substrate exposed by the contact hole.

In other example embodiments, the insulating patterns may include first insulating patterns between the semiconductor patterns, and a second insulating pattern on the contact structure. A distance between the first insulating patterns may be greater than a distance between the semiconductor patterns.

In another example embodiment, the method may further include forming lower electrodes on the metal-semiconductor compounds, and forming data storage patterns on the lower electrodes.

The method may further include forming an upper interlayer insulating layer on the semiconductor substrate having the data storage patterns, forming a first groove and a second groove, the first groove penetrating the upper interlayer insulating layer and having a portion overlapping the data storage patterns, and a second groove penetrating the upper interlayer insulating layer and the upper insulating pattern and having a portion overlapping the contact structure, and forming a first conductive pattern in the first groove, and a second conductive pattern in the second groove.

A lower surface of the second conductive pattern may be lower than a lower surface of the first conductive pattern.

The first conductive pattern may be formed in a line shape.

The method may further include forming upper electrodes on the data storage patterns before forming the upper interlayer insulating layer, and the upper electrodes may be electrically connected to the data storage patterns and the first conductive structure.

In accordance with some example embodiments of inventive concepts, a method of fabricating a semiconductor device is provided. The method may include forming semiconductor patterns on a semiconductor substrate, such that sides of the semiconductor patterns are surrounded by a lower interlayer insulating layer. A lower insulating layer, that covers the semiconductor patterns and the lower interlayer insulating layer, may be formed. A contact structure, that penetrates the lower insulating layer and the lower interlayer insulating layer and is spaced apart from the semiconductor patterns, may be formed. An upper insulating layer, that covers the contact structure and the lower insulating layer, may be formed. The upper and lower insulating layers may be patterned to form insulating patterns that expose the semiconductor patterns and cover the contact structure, and each of the insulating patterns includes a first insulating pattern between the semiconductor patterns and a second insulating pattern on the contact structure. The first insulating pattern may include a first lower insulating pattern and a first upper insulating pattern sequentially stacked, and the second insulating pattern may include a second lower insulating pattern and a second upper insulating pattern sequentially stacked. After forming the insulating patterns, metal-semiconductor compounds may be formed on the exposed semiconductor patterns. Lower electrodes may be formed on the metal-semiconductor compounds. Data storage patterns may be formed on the lower electrodes.

In some example embodiments, the second lower insulating pattern may be on sides of the contact structure, and the second upper insulating pattern may cover an upper surface of the contact structure and an upper surface of the second lower insulating pattern.

In other example embodiments, the method may further include forming an upper interlayer insulating layer on the semiconductor substrate having the data storage patterns, forming a first groove and a second groove, the first groove penetrating the upper interlayer insulating layer and having a portion overlapping the data storage patterns, and the second groove penetrating the upper interlayer insulating layer and the second upper insulating pattern and having a portion overlapping the contact structure, and forming a first conductive pattern in the first groove, and a second conductive pattern in the second groove.

The method may further include forming upper electrodes on the semiconductor substrate having the data storage patterns before forming the upper interlayer insulating layer, and the upper electrodes may be electrically connected to the data storage patterns and the first conductive structure.

In other example embodiments, forming the lower electrodes and the data storage patterns may include after the forming metal-semiconductor compounds, forming first spacers on sides of the insulating patterns, sequentially forming a lower electrode layer and a spacer layer on the substrate having the first spacers, anisotropically etching the lower electrode layer and the spacer layer to form lower electrode lines and second spacers, forming an insulating separation layer on the substrate having the lower electrode lines and the second spacers, planarizing the first separation layer to form a first separation pattern until the first and second insulating patterns are exposed, forming a trench for cutting the lower electrode lines to form lower electrode patterns disposed on the metal-semiconductor compounds, forming an insulating second separation pattern filling the trench, partially etching the lower electrode patterns to form holes and the lower electrodes, and forming the data storage patterns in the holes.

In other example embodiments, forming the lower electrodes and the data storage patterns may include sequentially forming a lower electrode layer and a spacer layer on the substrate including the metal-semiconductor compounds, anisotropically etching the lower electrode layer and the spacer layer to form lower electrode lines and spacers, forming an insulating first separation layer on the substrate having the lower electrode lines and the spacers, planarizing the first separation layer to form a first separation pattern until the first and second insulating patterns are exposed, forming a trench for cutting the lower electrode lines to form lower electrode patterns disposed on the metal-semiconductor compounds, forming an insulating second separation pattern filling the trench, partially etching the lower electrode patterns to form empty spaces and to form the lower electrodes, and forming the data storage patterns in the empty spacers.

In another example embodiment, a portion of an upper surface of each of the semiconductor patterns may be covered with the first insulating pattern, and a remaining portion thereof may be covered with a corresponding metal-semiconductor compound.

In another example embodiment, the first and second upper insulating patterns may have a vertical thickness smaller than that of the first and second lower insulating patterns.

According to some example embodiments, a method of fabricating a semiconductor device includes forming semiconductor patterns at regular intervals on a semiconductor substrate, such that spaces between the semiconductor patterns are filled with a lower interlayer insulating layer; forming a lower insulating layer covering the semiconductor patterns and the lower interlayer insulating layer; removing a portion of the lower insulating layer and the lower interlayer insulating layer; forming a contact structure where the portion of the lower insulating layer and the lower interlay insulating layer was removed, an upper surface of the contact structure being higher than the semiconductor pattern; forming an upper insulating layer that covers the contact structure and the lower insulating layer; selectively removing the upper and lower insulating layers to expose the semiconductor patterns without exposing the contact structure; and forming metal-semiconductor compounds on the exposed semiconductor patterns after removing the upper and lower insulating layers.

The method may further include forming a contact hole, before forming the contact structure, the contact hole penetrating the lower insulating layer and the lower interlayer insulating layer and exposing the semiconductor substrate; and forming an impurity region in the semiconductor substrate exposed by the contact hole before forming the contact structure.

The selectively removing the upper and lower insulating layers may form first insulating patterns formed between the semiconductor patterns, and a second insulating pattern formed on the contact structure, and a distance spaced between the first insulating patterns is greater than a distance spaced between the semiconductor patterns.

Details of other example embodiments are included in the detailed description and drawings.

BRIEF DESCRIPTION OF THE DRAWINGS

The foregoing and other features and advantages of example embodiments of inventive concepts will be apparent from the description of some example embodiments of inventive concepts, as illustrated in the accompanying drawings in which like reference characters refer to the same parts throughout the different views. The drawings are not necessarily to scale, emphasis instead being placed upon illustrating the principles of example embodiments of inventive concepts. In the drawings.

DETAILED DESCRIPTION OF EXAMPLE EMBODIMENTS

Figure 1:
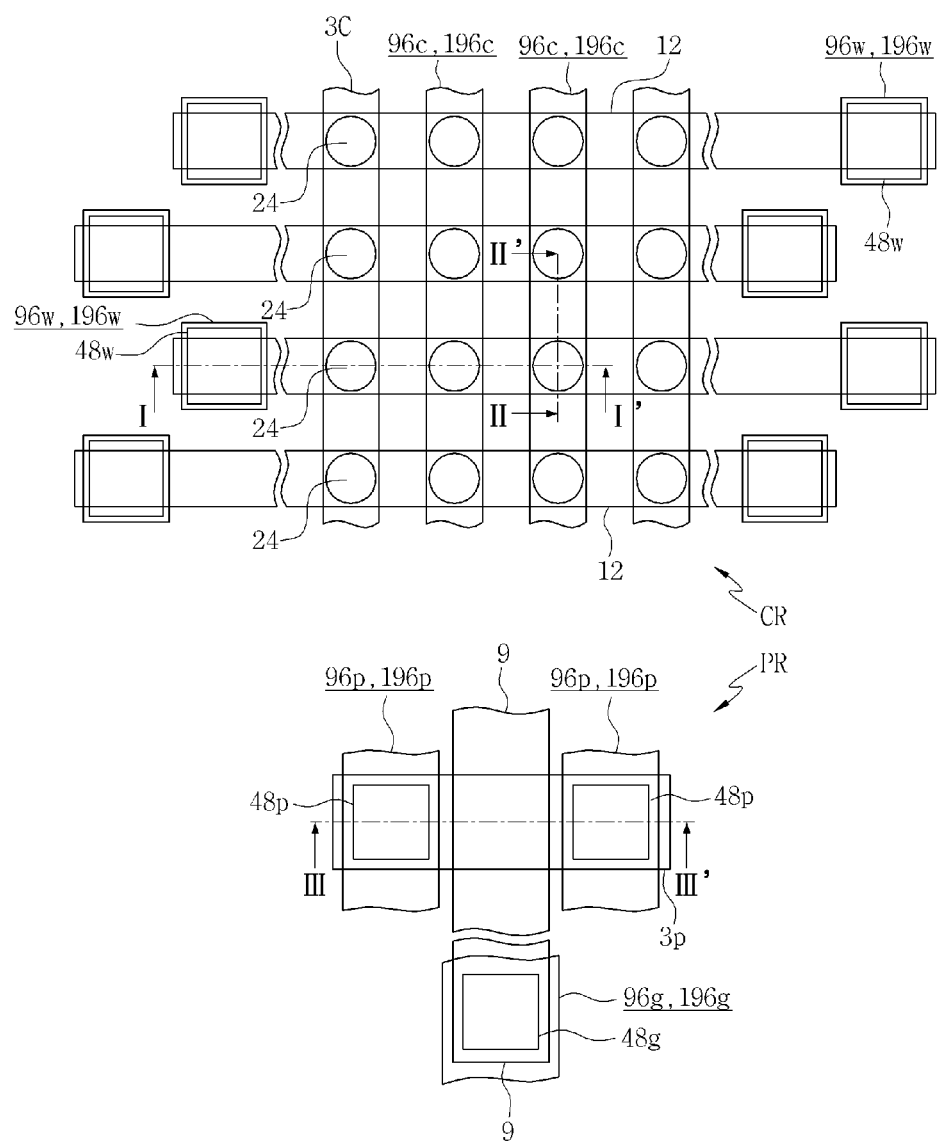
FIG. 1 is a plan view illustrating a semiconductor device according to some example embodiments of inventive concepts.

Various example embodiments will now be described more fully with reference to the accompanying drawings in which some example embodiments are shown. Example embodiments of inventive concepts may, however, be embodied in different forms and should not be construed as limited to the example embodiments set forth herein. Rather, these example embodiments are provided so that this disclosure is thorough and complete and fully conveys the scope of example embodiments of inventive concepts to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

Example embodiments are described herein with reference to cross-sectional illustrations, plane illustrations, and block illustrations that are schematic illustrations of example embodiments (and intermediate structures). As such, variations from the shapes of the illustrations as a result, for example, of manufacturing techniques and/or tolerances, may be expected. Thus, example embodiments should not be construed as limited to the particular shape illustrated herein but may include deviations in shapes that result, for example, from manufacturing. Thus, the regions illustrated in the figures are schematic in nature and their shapes do not necessarily illustrate the actual shape of a region of a device and do not limit the scope.

In the drawings, the thicknesses of layers and regions may be exaggerated for clarity. It is also understood that when a layer is referred to as being "on" another layer or substrate, it can be directly on the other or substrate, or intervening layers may also be present. Like reference numerals in the drawings denote like elements.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Spatially relative terms, such as "top end", "bottom end", "top surface", "bottom surface", "upper", and "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
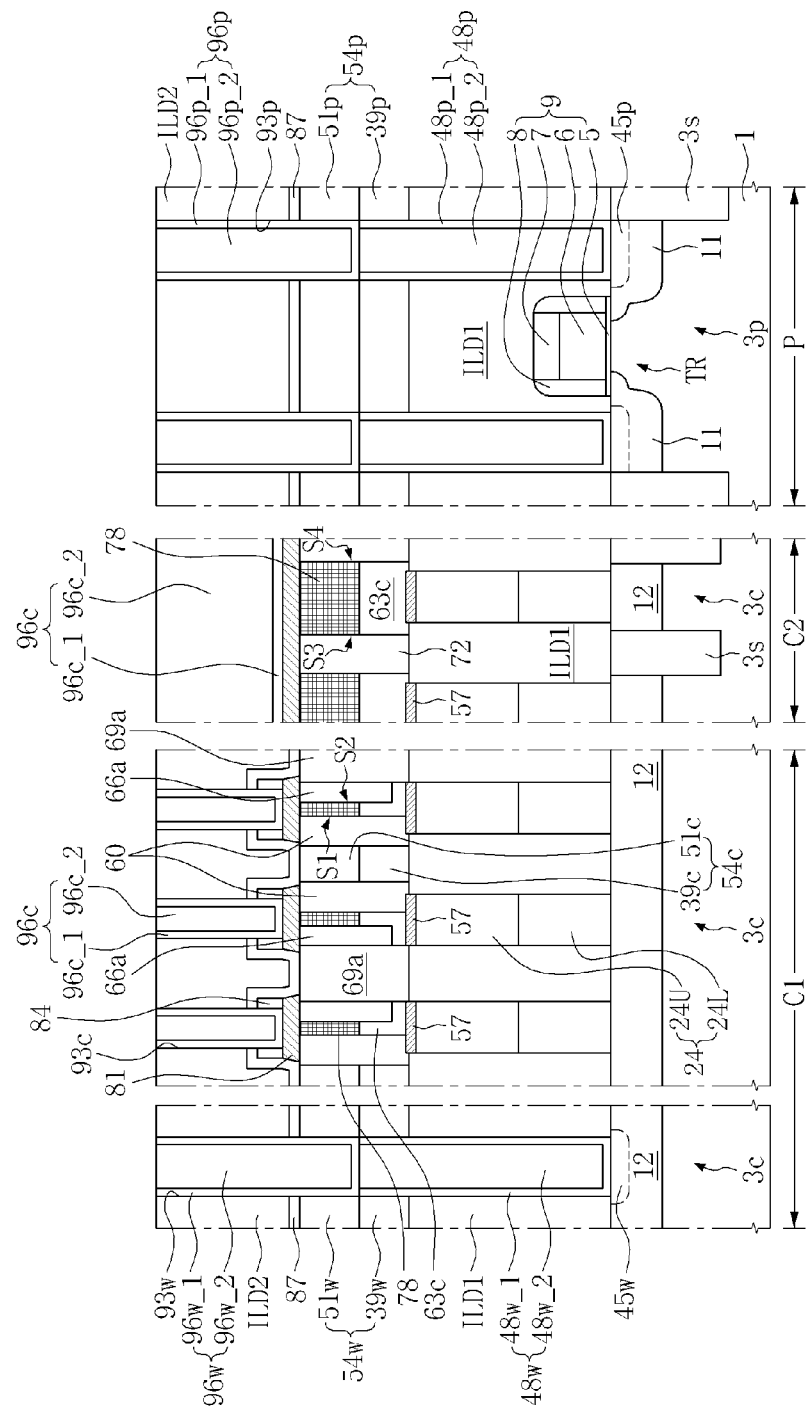
FIG. 2 is a cross-sectional view illustrating a semiconductor device according to an example embodiment of inventive concepts.
Figure 3:
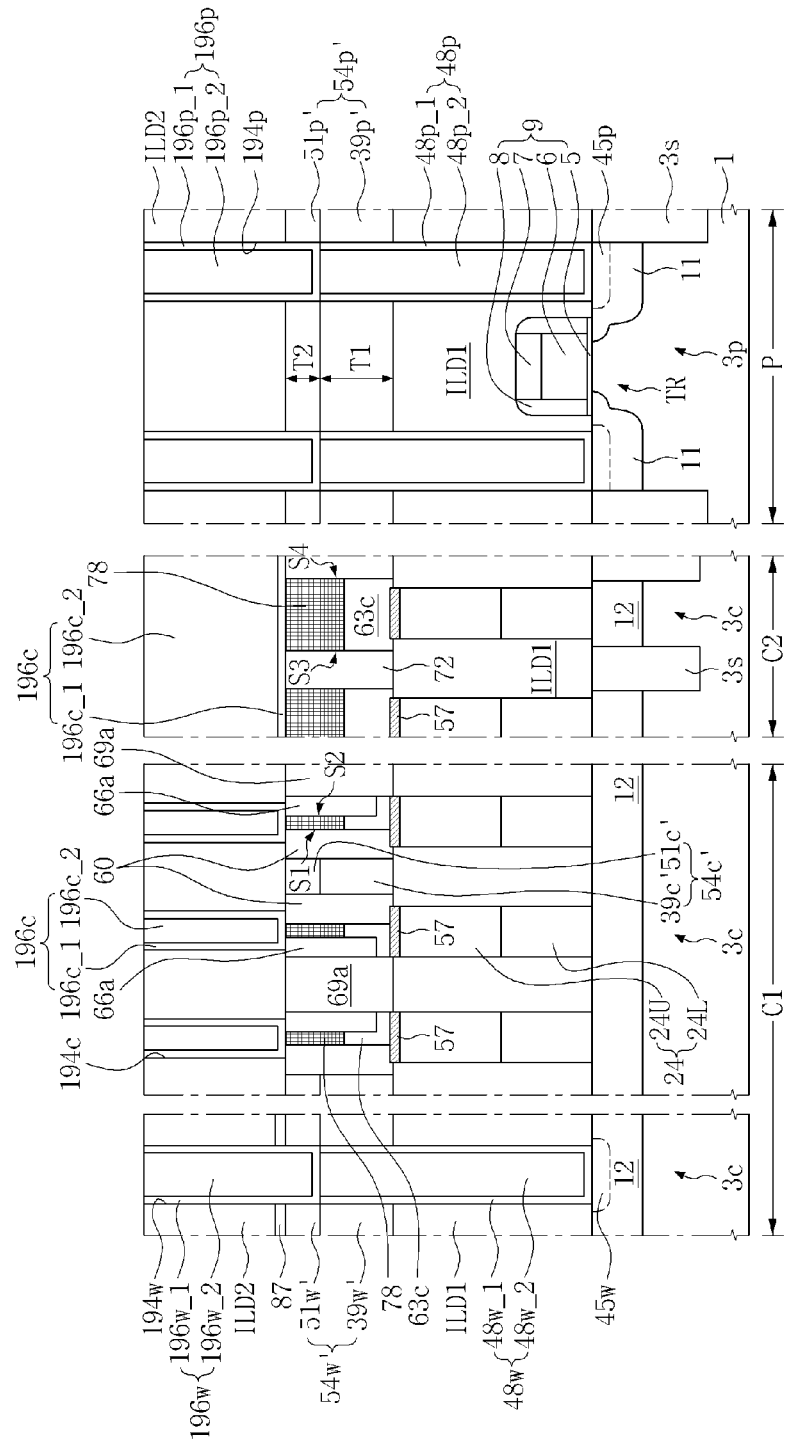
FIG. 3 is a cross-sectional view illustrating a semiconductor device according to an example embodiment of inventive concepts.
Figure 4:
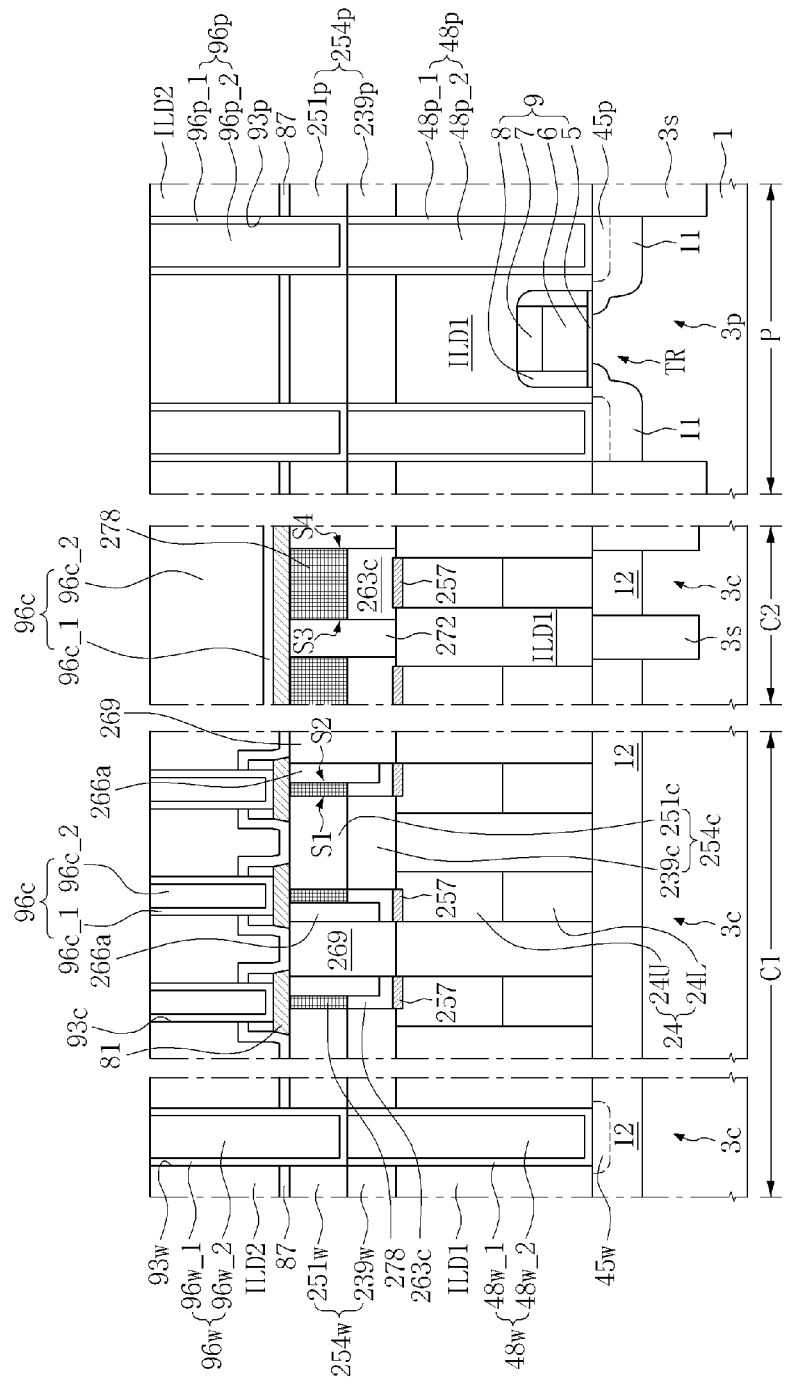
FIG. 4 is a cross-sectional view illustrating a semiconductor device according to another example embodiment of inventive concepts.
Figure 5:
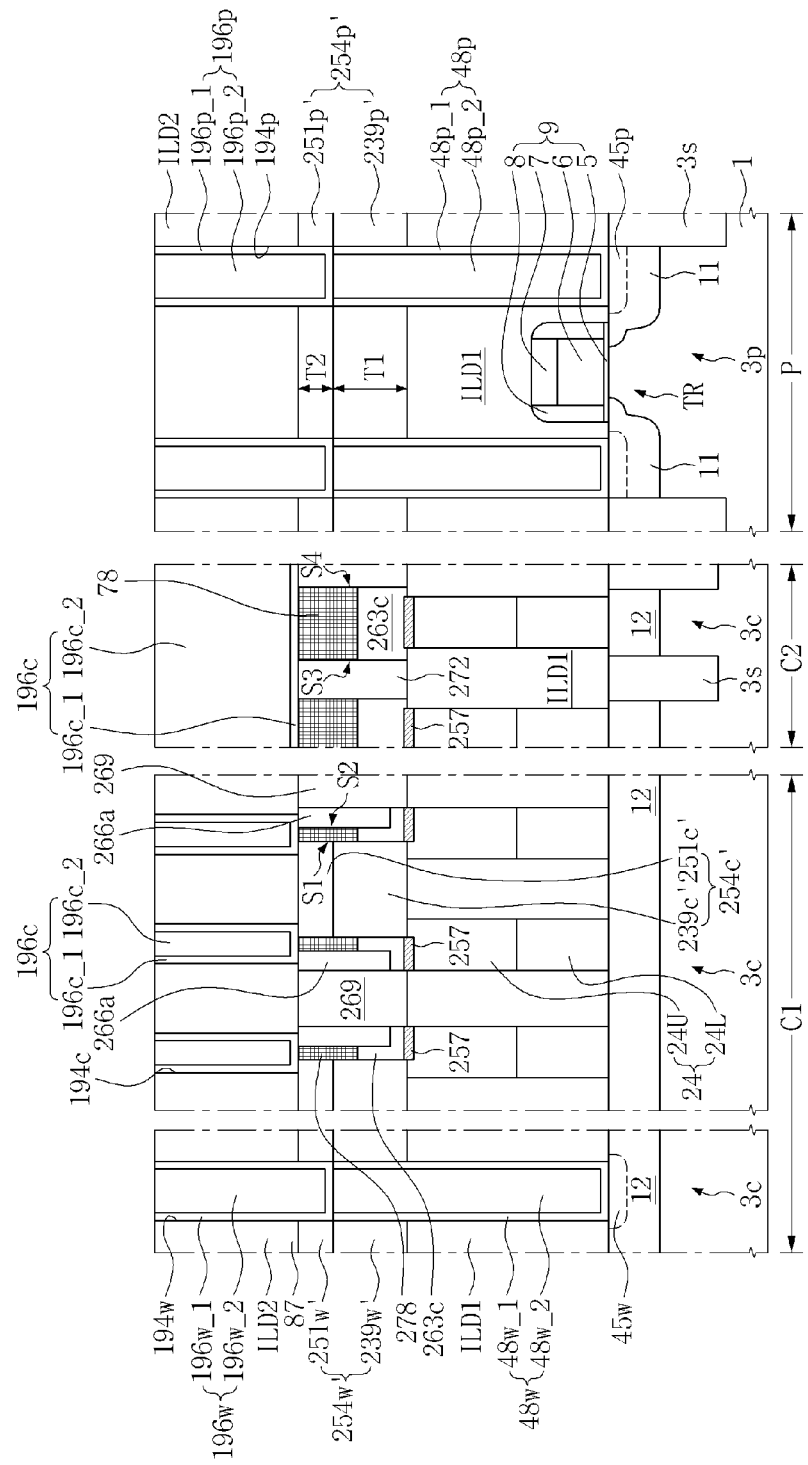
FIG. 5 is a cross-sectional view illustrating a semiconductor device according to another example embodiment of inventive concepts.

FIG. 1 is a plan view illustrating a semiconductor device according to some example embodiments of inventive concepts. FIG. 2 is a cross-sectional view illustrating a semiconductor device according to an example embodiment of inventive concepts, and FIGS. 3 to 5 are cross-sectional views illustrating semiconductor devices according some example embodiments of inventive concepts. In FIG. 1, a portion indicated by "CR" denotes a cell array area, and a portion indicated by "PR" denotes a peripheral circuit area. In FIGS. 2 to 5, a portion indicated by "C1" shows a region taken along line I-I' of FIG. 1, a portion indicated by "C2" shows a region taken along line II-II', and a portion indicated by "P" shows a region taken along line III-III' of FIG. 1.

First, a semiconductor device according to an example embodiment of inventive concepts will be described with reference to FIGS. 1 and 2.

Referring to FIGS. 1 and 2, a substrate 1 may be prepared. The substrate 1 may be a semiconductor substrate. The substrate 1 may be a silicon substrate. The substrate 1 may include a cell array area CR and a peripheral circuit area PR.

A device isolation region 3s defining cell active regions 3c and a peripheral active region 3p may be provided in the substrate 1. The device isolation region 3s may be formed with a shallow trench isolation. The cell active regions 3c may be provided in the cell array area CR, and the peripheral active region 3p may be provided in the peripheral circuit area PR.

Word lines 12 may be provided in the cell active regions 3c. The word lines 12 may be formed by implanting impurities in the cell active regions 3c and may include impurity regions having a different conductivity from the cell active regions 3c. For example, the word lines 12 may have an N-type conductivity and the cell active regions 3c may have a P-type conductivity.

A transistor TR may be formed in the peripheral circuit area PR. The transistor TR may include a gate structure 9 formed on the peripheral active region 3p, and source/drain regions 11 formed in the peripheral active region 3p at both sides of the gate structure 9.

The gate structure 9 may include a gate dielectric 5, a gate electrode 6, and an insulating gate capping pattern 7 sequentially stacked. The gate structure 9 may further include insulating gate spacers 8 formed on sides of the gate electrode 6 and the gate capping pattern 7.

A lower interlayer insulating layer ILD1 may be provided on the substrate having the word lines 12 and the transistor TR. The lower interlayer insulating layer ILD1 may be formed of silicon oxide or low-k dielectric. The low-k dielectric may be dielectric having a lower dielectric constant than silicon oxide.

Semiconductor patterns 24 may be provided that penetrate the lower interlayer insulating layer ILD1 and are electrically connected to the word lines 12. The semiconductor patterns 24 may be formed of crystalline silicon. Sides of the semiconductor patterns 24 may be surrounded by the lower interlayer insulating layer ILD1.

A PN diode may be formed in each of the semiconductor patterns 24. For example, each of the semiconductor patterns 24 may include a lower semiconductor region 24L and an upper semiconductor region 24U. The upper semiconductor region 24U may have a P-type conductivity and the lower semiconductor region 24L may have an N-type conductivity. Therefore, the upper semiconductor region 24U and the lower semiconductor region 24L may form a PN diode.

Metal-semiconductor compounds 57 may be provided on the semiconductor patterns 24. The metal-semiconductor compounds 57 may be formed of metal silicide. For example, the metal-semiconductor compounds 57 may include any material selected from the group consisting of a cobalt-silicon (Co—Si) compound, a titanium-silicon (Ti—Si) compound, a tantalum-silicon (Ta—Si) compound, a tungsten-silicon (W—Si) compound, and a nickel-silicon (Ni—Si) compound.

Lower electrodes 63c and data storage patterns 78 that are sequentially stacked may be provided on the metal-semiconductor compounds 57. Each of the lower electrodes 63c may be formed in an L shape. For example, each of the lower electrodes 63c may include a first portion in direct contact with a corresponding metal-semiconductor compound 57, and a second portion protruding upward from a portion of the first portion. Each of the data storage patterns 78 may be in contact with an upper end portion of each of the lower electrodes 63c.

The data storage patterns 78 may be formed of a material for storing information of a phase-change memory device. For example, the data storage patterns 78 may be formed of a phase-changeable material having an amorphous phase with high resistivity and a crystalline phase with low resistivity according to heating temperature and heating time. For example, the data storage patterns may be formed of a material including a chalcogenide compound, such as germanium-antimony-tellurium (GeSbTe), germanium-tellurium-arsenic (GeTeAs), tin-tellurium-tin (SnTeSn), germanium-tellurium (GeTe), antimony-tellurium (SbTe), selenium-tellurium-tin (SeTeSn), germanium-tellurium-selenium (GeTeSe), antimony-selenium-bismuth (SbSeBi), germanium-bismuth-tellurium (GeBiTe), germanium-tellurium-titanium (GeTeTi), induium-selenium (InSe), gallium-tellurium-selenium (GaTeSe), or indium-antimony-tellurium (InSbTe). Alternatively, the data storage pattern 78 may be formed of a material in which any element selected from the group consisting of carbon (C), nitrogen (N), silicon (Si), and oxygen (O) is contained in any material selected from the group consisting of a GeSbTe layer, a GeTeAs layer, an SnTeSn layer, a GeTe layer, an SbTe layer, an SeTeSn layer, a GeTeSe layer, an SbSeBi layer, a GeBiTe layer, a GeTeTi layer, an InSe layer, a GaTeSe layer, and an InSbTe layer.

The lower electrodes 63c may be formed of a material capable of serving as a heater to heat the data storage patterns 78. For example, the lower electrode 63c may include any material selected from the group consisting of titanium nitride (TiN), titanium aluminum nitride (TiAlN), tantalum nitride (TaN), tungsten nitride (TW), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), tungsten (TiW), titanium aluminum (TiAl), titanium oxynitride (TiON), titanium aluminum oxynitride (TiAlON), tungsten oxynitride (WON), and tantalum oxynitride (TaON).

The sequentially stacked lower electrodes 63c and data storage patterns 78 may have a first side S1 and a second side S2 facing each other, and further have a third side S3 and a fourth side S4 facing each other. The first and second sides S1 and S2 may be parallel to each other, and the third and fourth sides S3 and S4 may be parallel to each other. In addition, the first and second sides S1 and S2 may be parallel to a first direction, and the third and fourth sides S3 and S4 may be parallel to a second direction crossing the first direction. For example, the first direction may be perpendicular to the second direction. The third and fourth sides S3 and S4 may be perpendicular to the first and second sides S1 and S2.

The first to fourth sides S1 to S4 of the sequentially stacked lower electrodes 63s and data storage patterns 78 may be surrounded by first insulating patterns 54c, first separation patterns 69a, and second separation patterns 72. A first lower electrode 63c and a first data storage pattern 78 sequentially stacked on a first semiconductor pattern 24 of the semiconductor patterns 24 may be disposed between a pair of second separation patterns 72 adjacent to each other and between the first insulating pattern 54c and the first separation pattern 69a adjacent to each other.

Each of the first insulating patterns 54c may include stacked layers, each of the first separation patterns 69a may be an insulating single layer, and each of the second separation patterns 72 may be an insulating single layer. Each of the first insulating patterns 54c may include a first lower insulating pattern 39c and a first upper insulating pattern 51c.

The first and second sides S1 and S2 of the sequentially stacked lower electrodes 63c and data storage patterns 78 may be disposed between the first insulating pattern 54c and the first separation pattern 69a adjacent to each other. The first insulating patterns 54c may be closer to the first sides S1 of the sequentially stacked lower electrodes 63c and data storage patterns 78 than the second sides S2 thereof. The first separation patterns 69a may be closer to the second sides S2 of the sequentially stacked lower electrodes 63c and data storage patterns 78 than the first sides S1 thereof.

The third and fourth sides S3 and S4 of the sequentially stacked lower electrodes 63c and data storage patterns 78 may be disposed between the second separation patterns 72 adjacent to each other.

Insulating first spacers 60 may be interposed between the first sides S1 of the sequentially stacked lower electrodes 63c and the data storage patterns 78 and the first insulating patterns 54c.

Insulating second spacers 66a may be interposed between the second sides S2 of the sequentially stacked lower electrodes 63c and data storage patterns 78 and the first separation patterns 69a.

Each of the lower electrodes 63c may include the second portion interposed between the first spacer 60 and the second spacer 66a, and the first portion interposed between the second spacer 66a and the metal-semiconductor compound 57.

A second insulating pattern 54w and a peripheral insulating pattern 54p may be provided on the lower interlayer insulating layer ILD1. The second insulating pattern 54w and the peripheral insulating pattern 54p may include the same material as the first insulating patterns 54c and be positioned at the same level as the first insulating patterns 54c.

Each of the first insulating patterns 54c may include a sequentially stacked first lower insulating pattern 39c and upper insulating pattern 51c. The second insulating pattern 54w may include a sequentially stacked second lower insulating pattern 39w and second upper insulting pattern 51w. The peripheral insulating patterns 54p may include a sequentially stacked peripheral lower insulating pattern 39p and peripheral upper insulating pattern 51p.

Conductive word line contact structures 48w may be provided that penetrate the second lower insulating pattern 39w and the lower interlayer insulating layer ILD1 and are electrically connected to the word lines 12. Sides of the word line contact structures 48w may be surrounded by the second lower insulating pattern 39w and the lower interlayer insulating layer ILD1, and bottoms of the word line contact structures 48w may be electrically connected to end portions of the word lines 12. The second upper insulating pattern 51w may be at a level higher than the word line contact structures 48w.

Conductive peripheral contact structures 48p may be provided that penetrate the peripheral lower insulating pattern 39p and the lower interlayer insulating layer ILD1 and are electrically connected to the source/drain regions 11. Sides of the peripheral contact structures 48p may be surrounded by the peripheral lower insulating pattern 39p and the lower interlayer insulating layer ILD1. The peripheral upper insulating pattern 51p may be at a level higher than the peripheral contact structures 48p.

A conductive gate contact structure 48g may be provided that penetrates the peripheral lower insulating pattern 39p, the lower interlayer insulating layer ILD1 and the gate capping pattern 7 and is electrically connected to the gate electrode 6.

Sequentially stacked conductive upper electrodes 81 and insulating upper electrode capping patterns 84 may be provided on the data storage patterns 78. The upper electrodes 81 may be electrically connected to the data storage patterns 78. An insulating etch stop layer 87 may be provided on the substrate having the sequentially stacked upper electrodes 81 and upper electrode capping patterns 84.

An upper interlayer insulating layer ILD2 may be formed on the etch stop layer 87. The upper interlayer insulating layer ILD2 may be formed of silicon oxide and the etch stop layer 87 may be formed of silicon nitride.

First conductive structures 96c may be provided that sequentially penetrate the upper interlayer insulating layer ILD2, the etch stop layer 87 and the upper electrode capping patterns 84, and are electrically connected to the upper electrodes 81. The first conductive structures 96c may have line shapes spaced apart from each other. The first conductive structures 96c may be formed in the line shape crossing the word lines 12. The first conductive structures 96c may be bit lines of a memory device. Each of the first conductive structures 96c may include a second conductive material layer 96c_2 sequentially penetrating the upper interlayer insulating layer ILD2, the etch stop layer 87, and the upper electrode capping pattern 84, and a first conductive material layer 96c_1 covering a side and a bottom of the second conductive material layer 96c_2.

Second conductive structures 96w may be provided that sequentially penetrate the upper interlayer insulating layer ILD2, the etch stop layer 87, and the second upper insulating pattern 51w and are electrically connected to the word line contact structures 48w. The second conductive structures 96w may include the same material as the first conductive structures 96c. The second conductive structures 96w may have upper surfaces positioned at the same level as upper surfaces of the first conductive structures 96c, and bottoms positioned at a lower level than the bottoms of the first conductive structures 96c. Each of the second conductive structures 96w may include a second conductive material layer 96w_2 sequentially penetrating the upper interlayer insulating layer ILD2, the etch stop layer 87, and the second upper insulating pattern 51w, and a first conductive material layer 96w_1 covering a side and a bottom of the second conductive material layer 96w_2.

Peripheral conductive structures 96p may be provided that sequentially penetrate the upper interlayer insulating layer ILD2, the etch stop layer 87, and the peripheral upper insulating pattern 51p, and are electrically connected to the peripheral contact structures 48p. The peripheral conductive structures 96p may include the same material as the second conductive structures 96w and may be positioned at the same level as the second conductive structures 96w. Each of the peripheral conductive structures 96p may include a second conductive material layer 96p_2 sequentially penetrating the upper interlayer insulating layer ILD2, the etch stop layer 87, and the peripheral upper insulating pattern 51p, and a first conductive material layer 96p_1 covering a side and a bottom of the second conductive material layer 96p_2.

A gate conductive structure 96g may be provided that sequentially penetrates the upper interlayer insulating layer ILD2, the etch stop layer 87, and the peripheral upper insulating pattern 51p, and is electrically connected to the gate contact structure 48g. The gate conductive structure 96g may include the same material as the second conductive structures 96w and may be positioned at the same level as the second conductive structures 96w.

The structures of the first conductive structures 96c, which may be used as the bit lines and the upper electrodes 81 according to some example embodiments of inventive concepts, are not limited to the structures as described in FIG. 2. For example, some example embodiments of inventive concepts may provide a structure of the upper electrodes 81 and the first conductive structures 96c to be formed simultaneously. The structure of the upper electrodes 81 and the bit lines 87 formed simultaneously will be described now with reference to FIG. 3.

Referring to FIGS. 1 and 3, semiconductor patterns 24, of which sides are surrounded by a lower interlayer insulating layer ILD1 and which are electrically connected to word lines 12, may be provided on a substrate 1 having the word lines 12 and a transistor TR as described in FIG. 2. Further, metal-semiconductor compounds 57 may be provided on the semiconductor patterns 24, and sequentially stacked lower electrodes 63c and data storage patterns 78 may be provided on the metal-semiconductor compounds 57. The sequentially stacked lower electrodes 63c and data storage patterns 78 may have first to fourth sides S1 to S4 as described in FIG. 2. The first and second sides S1 and S2 may face each other and be parallel to each other, and the third and fourth sides S3 and S4 may face each other and be parallel to each other. The third and fourth sides S3 and S4 may be perpendicular to the first and second sides S1 and S2.

The first to fourth sides S1 to S4 of the sequentially stacked lower electrodes 63c and data storage patterns 78 may be surrounded by first insulating patterns 54c', first separation patterns 69a, and second separation patterns 72.

The first and second sides S1 and S2 of the sequentially stacked lower electrodes 63c and data storage patterns 78 may be disposed between the first insulating patterns 54c' and the first separation patterns 69 adjacent to each other. The first insulating patterns 54c' may be closer to the first sides S1 of the sequentially stacked lower electrodes 63c and data storage patterns 78 than the second sides S2 thereof. The first separation patterns 69 may be closer to the second sides S2 of the sequentially stacked lower electrodes 63c and data storage patterns 78 than the first sides S1 thereof. The third and fourth sides S3 and S4 of the sequentially stacked lower electrodes 63c and data storage patterns 78 may be disposed between the second separation patterns 72 adjacent to each other.

Insulating first spacers 60 may be interposed between the first sides S1 of the sequentially stacked lower electrodes 63c and data storage patterns 78 and the first insulating patterns 54c'. Insulating second spacers 66a may be interposed between the second sides S2 of the sequentially stacked lower electrodes 63c and data storage patterns 78 and the first separation patterns 69a.

Each of the lower electrodes 63c may include a first portion interposed between the first spacer 60 and the second spacer 66a, and a second portion interposed between the second spacer 66a and the metal-semiconductor compound 57.

A second insulating pattern 54w' and a peripheral insulating pattern 54p' may be provided on the lower interlayer insulating layer ILD1. The second insulating pattern 54w' and the peripheral insulating pattern 54p' may include the same material as the first insulating patterns 54c' and be positioned at the same level as the first insulating pattern 54c'.

Each of the first insulating patterns 54c' may include a sequentially stacked first lower insulating pattern 39' and first upper insulating pattern 51c'. The second insulating pattern 54w' may include a sequentially stacked second lower insulating pattern 39w' and second upper insulating pattern 51w'. The peripheral insulating pattern 54p' may include a sequentially stacked peripheral lower insulating pattern 39p' and peripheral upper insulating pattern 51p'.

The first lower insulating pattern 39c' may have a thickness different from the first upper insulating pattern 51c'. The first lower insulating pattern 39c' may have a vertical thickness greater than the first upper insulating pattern 51c'. For example, the first lower insulating pattern 39c' may have a first vertical thickness T1, and the first upper insulating pattern 51c' may have a second vertical thickness T2 smaller than the first vertical thickness. The first vertical thickness T1 may be a distance between an upper surface and a lower surface of the first lower insulating pattern 39c', and the second vertical thickness T2 may be a distance between an upper surface and a lower surface of the first upper insulating pattern 51c'.

The second lower insulating pattern 39w' and the peripheral lower insulating pattern 39p' may have the same first vertical thickness T1 as the first lower insulating pattern 39c'. The second upper insulating pattern 51w' and the peripheral upper insulating pattern 51p' may have the same second vertical thickness T2, which is smaller than the first vertical thickness T1, as the first upper insulating pattern 51c'.

Conductive word line contact structures 48w may be provided that penetrates the second lower insulating pattern 39w' and the lower interlayer insulating layer ILD1 and are electrically connected to the word lines 12. Conductive peripheral contact structures 48p may be provided that penetrate the peripheral lower insulating pattern 39p' and the lower interlayer insulating layer ILD1 and are electrically connected to source/drain regions 11. A conductive gate contact structure 48g may be provided that sequentially penetrates the peripheral lower insulating pattern 39p', the lower interlayer insulating layer ILD1 and a gate capping pattern 7, and is electrically connected to the gate electrode 6.

An upper interlayer insulating layer ILD2 may be provided on the substrate including the first insulating patterns 54c', the second insulating pattern 54w', the peripheral insulating pattern 54p', the data storage patterns 78, the first separation patterns 69a, the second separation patterns 72, the first spacers 60, and the second spacers 66a.

First grooves 194c may be provided that penetrate the upper interlayer insulating layer ILD2 and expose the data storage patterns 78. First conductive patterns 196c filling the first grooves 194c may be provided. Each of the first conductive patterns 196c may include a first conductive material layer 196c_1 covering an inner surface of each of the first grooves 194c, and a second conductive material layer 196c_2 formed on the first conductive material layer 196c_1 to be filled within each of the first grooves 194c. The first conductive patterns 196c may have line shapes to be spaced apart from each other. The first conductive patterns 196c may be used as bit lines of a memory device and the first conductive material layers 196c_1 of the first conductive patterns 196c may serve as upper electrodes of the memory device. Therefore, the first conductive patterns 196c may include the upper electrodes 196c_1 and the bit lines 196c_2 of the memory device.

Second grooves 194w may be provided that sequentially penetrate the upper interlayer insulating layer ILD2 and the second upper insulating pattern 51w' and expose the word line contact structures 48w. Second conductive patterns 196w filling the second grooves 194w may be provided. Each of the second conductive patterns 196w may include a first conductive material layer 196w_1 formed on an inner surface of each of the second grooves 194w, and a second conductive material layer 196w_2 formed on the first conductive material layer 196w_1 to be filled within each of the second grooves 194w.

Peripheral grooves 194p may be provided that sequentially penetrate the upper interlayer insulating layer ILD2 and the peripheral upper insulating pattern 51p' and expose the peripheral contact structures 48p. Peripheral conductive patterns 196p filling the peripheral grooves 194p may be provided. Each of the peripheral conductive patterns 196p may include a first conductive material layer 196p_1 formed on an inner surface of the peripheral grooves 194p, and a second conductive material layer 196p_2 formed on the first conductive material layer 196p_1 to be filled within the peripheral grooves 194p.

A gate conductive structure 196g may be provided that sequentially penetrates the upper interlayer insulating layer ILD2 and the peripheral upper insulating pattern 51p' and is electrically connected to the gate contact structure 48g.

Next, a semiconductor device according to another example embodiment will be described with reference to FIGS. 1 and 4.

Referring to FIGS. 1 and 4, a semiconductor substrate 1 including a cell array area CR and a peripheral circuit area PR may be provided. The substrate 1 may be a semiconductor substrate. A device isolation region 3s defining cell active regions 3c and a peripheral active region 3p may be provided in the substrate 1.

Word lines 12 may be provided the cell active regions 3c. A transistor TR may be provided in the peripheral circuit area PR. The transistor TR may include a gate structure 9 formed on the peripheral active region 3p and source/drain regions 11 formed in the peripheral active region 3p at both sides of the gate structure 9. The gate structure 9 may include a gate dielectric 5, a gate electrode 6, and an insulating gate capping pattern 7 sequentially stacked. The gate structure 9 may further include an insulating gate spacers 8 formed on sidewalls of the gate electrode 6 and the gate capping pattern 7.

A lower interlayer insulating layer ILD1 may be provided on the substrate including the word lines 12 and the transistor TR. Semiconductor patterns 24 may be provided that penetrate the lower interlayer insulating layer ILD1 and is electrically connected to the word lines 12. The semiconductor patterns 24 may be formed of crystalline silicon. Sides of the semiconductor patterns 24 may be surrounded by the lower interlayer insulating layer ILD1. Each of the semiconductor patterns 24 may include a lower semiconductor region 24L and an upper semiconductor region 24U. The upper semiconductor region 24U may have a P-type conductivity and the lower semiconductor region 24L may have an N-type conductivity. Therefore, the upper semiconductor region 24U and the lower semiconductor region 24L may form a PN diode.

Metal-semiconductor compounds 257 may be provided on the semiconductor patterns 24. Each of the semiconductor patterns 24 may be partially covered by each of the metal-semiconductor compounds 257. Therefore, the metal-semiconductor compounds 257 may have a width smaller than that of the semiconductor patterns 24. The metal-semiconductor compounds 257 may be formed of metal silicide. For example, the metal-semiconductor compounds 257 may include any material selected from the group consisting of a Co—Si compound, a Ti—Si compound, a Ta—Si compound, a W—Si compound, and a Ni—Si compound.

Lower electrodes 263c and data storage patterns 278 sequentially stacked on the metal-semiconductor compounds 257 may be provided. Each of the lower electrodes 263c may be formed in an "L" shape. For example, each of the lower electrodes 263c may include a first portion in direct contact with each of the metal-semiconductor compounds 257, and a second portion protruding upward from a portion of the first portion. The data storage patterns 278 may be in contact with upper ends of the lower electrodes 263c.

The sequentially stacked lower electrodes 263c and data storage patterns 278 may have a first side S1 and a second side S2 facing each other, and a third side S3 and a fourth side S4 facing each other. The first and second sides S1 and S2 may be parallel to each other, and the third and fourth sides S3 and S4 may be parallel to each other. In addition, the first and second sides S1 and S2 may be parallel to a first direction, and the third and fourth sides S3 and S4 may be parallel to a second direction crossing the first direction. The first direction is perpendicular to the second direction. The third and fourth sides S3 and S4 may be perpendicular to the first and second sides S1 and S2.

The first to fourth sides S1 to S4 of the sequentially stacked lower electrodes 263c and data storage patterns 278 may be surrounded by first insulating patterns 254c, first separation patterns 269, and second separation patterns 272. For example, a first lower electrode 263c and a first data storage pattern 278 sequentially stacked on any one of the semiconductor patterns 24 may be disposed between a pair of second separation patterns 272 adjacent to each other and between the first insulating pattern 254c and the first separation pattern 269 adjacent to each other.

Each of the first insulating patterns 254c may include stacked layers, each of the first separation patterns 269 may include an insulating single layer, and each of the second separation patterns 272 may be an insulating single layer. Each of the insulating patterns 254c may include a first lower insulating pattern 239c and a first upper insulating pattern 251c sequentially stacked.

The first and second sides S1 and S2 of the sequentially stacked lower electrodes 263c and data storage patterns 278 may be disposed between the first insulating patterns 254c and the first separation patterns 269 adjacent to each other.

The first insulating patterns 254c may be closer to the first sides of the sequentially stacked lower electrodes 263c and data storage patterns 278 than the second sides S2 thereof. Each of the first insulating patterns 254c may have a width greater than a distance between semiconductor patterns 24. The first insulating patterns 254c may be disposed on the lower interlayer insulating layer ILD1 between the semiconductor patterns 24 and cover portions of the semiconductor patterns 24. Upper surfaces of the semiconductor patterns 24 may be covered by the metal-semiconductor compounds 257 and the first insulating patterns 254c.

The first separation patterns 269 may be closer to the second sides S2 of the sequentially stacked lower electrodes 263c and data storage patterns 278 than the first sides S1 thereof. The third sides S3 and the fourth sides S4 of the sequentially stacked lower electrodes 263c and data storage patterns 278 may be disposed between the second separation patterns 272 adjacent to each other. Insulating spacers 266a may be interposed between the second sides S2 of the sequentially stacked lower electrodes 263c and data storage patterns 278 and the first separation patterns 269. Meanwhile, each of the lower electrodes 263c may include a portion interposed between each of spacers 266a and each of the first insulating patterns 254c, and a second portion interposed between each of the spacers 266a and each of the metal-semiconductor compounds 257.

A second insulating pattern 254w and a peripheral insulating pattern 254p may be provided on the lower interlayer insulating layer ILD1. The second insulating pattern 254w and the peripheral insulating pattern 254p may include the same material as the first insulting patterns 254c and may be positioned at the same level as the first insulating patterns 254c.

Each of the first insulating patterns 254c may include the first lower insulating pattern 239c and the first upper insulating pattern 251c sequentially stacked. The second insulating pattern 254w may include a second lower insulating pattern 239w and a second upper insulating pattern 251w sequentially stacked. The peripheral insulating pattern 254p may include a peripheral lower insulating pattern 239p and a peripheral upper insulating pattern 251p.

As described in FIG. 2, conductive word line contact structures 48w may be provided that sequentially penetrate the second lower insulating pattern 239w and the lower interlayer insulating layer ILD1 and are electrically connected to the word lines 12. The second upper insulating pattern 251w may be at a level higher than the word line contact structures 48w.

Peripheral contact structures 48p may be provided that sequentially penetrate the peripheral lower insulating pattern 239p and the lower interlayer insulating layer ILD1 and are electrically connected to the source/drain regions 11. The peripheral upper insulating pattern 251p may be at a level higher than the peripheral contact structures 48p. A conductive gate contact structure 48g may be provided that sequentially penetrates the peripheral lower insulating pattern 239p, the lower interlayer insulating layer ILD1 and the gate capping pattern 7 and is electrically connected to the gate electrode 6.

As described in FIG. 2, on the substrate including the data storage patterns 278, the lower electrodes 263c, the spacers 266a, the first and second separation patterns 269 and 272, the first insulating patterns 254c, the second insulating pattern 254w, and the peripheral insulating pattern 254p, upper electrodes 81, upper electrode capping patterns 84, etching stop layer 87, an upper interlayer insulating layer ILD2, first and second conductive structures 96c and 96w, peripheral conductive structures 96p, and a gate conductive structure 96g may be provided.

Next, a semiconductor device according to another example embodiment will be described with reference to FIGS. 1 and 5.

Referring to FIGS. 1 and 5, as described in FIG. 4, semiconductor patterns 24 with sides surrounded by a lower interlayer insulating layer ILD1 and electrically connected to word lines 12, may be provided on a substrate including the word lines 12 and a transistor TR, and metal-semiconductor compounds 257 may be provided on the semiconductor patterns 24. Each of the metal-semiconductor compounds 257 may partially cover each of the semiconductor patterns 24. Lower electrodes 263c and data storage patterns 278 sequentially stacked on the metal-semiconductor compounds 257 may be provided. Further, the sequentially stacked lower electrodes 263c and data storage patterns 278 may have first and second sides S1 and S2 facing each other, and third and fourth sides S3 and S4 substantially perpendicular to the first and second sides S1 and S2 as described in FIG. 4. The first to fourth sides S1 to S4 of the sequentially stacked lower electrodes 263c and data storage patterns 278 may be surrounded by first insulating patterns 254c', first separation patterns 269, and second separation patterns 272.

The first and second sides S1 and S2 of the sequentially stacked lower electrodes 263c and data storage patterns 278 may be disposed between the first insulating patterns 254c' and the first separation patterns 269 adjacent to each other. The first insulating patterns 254c' may be closer to the first sides S1 of the sequentially stacked lower electrodes 263c and data storage patterns 278 than the sides S2 thereof. Each of the first insulating patterns 254c' may have a width greater than a distance spaced between the semiconductor patterns 24. The first insulating patterns 254c' may be disposed on the lower interlayer insulating layer ILD1 between the semiconductor patterns 24 and partially cover the semiconductor patterns 24.

The first separation patterns 269 may be closer to the second sides S2 of the sequentially stacked lower electrodes 263c and data storage patterns 278 than the side S1 thereof. The third sides S3 and the fourth sides S4 of the sequentially stacked lower electrodes 263c and data storage patterns 278 may be disposed between the second separation patterns 272 adjacent to each other. Insulating spacers 266a may be interposed between the second sides S2 of the sequentially stacked lower electrodes 263c and data storage patterns 278 and the first separation patterns 269. Each of the lower electrodes 263c may include a first portion interposed between each of the spacers 266a and each of the first insulating patterns 254c', and a second portion interposed between each of spacers 266a and each of the metal-semiconductor compounds 257.

A second insulating pattern 254w' and a peripheral insulating pattern 254p' may be provided on the interlayer insulating layer ILD1. The second insulating patterns 254w' and the peripheral insulating pattern 254p' may include the same material as the first insulating patterns 254c' and be positioned at the same level as the first insulating patterns 254c'. Each of the first insulating patterns 254c' may include a first lower insulating pattern 239c' and a first upper insulating pattern 251c' sequentially stacked. The second insulating pattern 254w' may include a second lower insulating pattern 239w' and a second upper insulating pattern 251w' sequentially stacked. The peripheral insulating pattern 254p' may include a peripheral lower insulating pattern 239' and a peripheral upper insulating pattern 251p' sequentially stacked.

The first lower insulating pattern 239c', the second lower insulating pattern 239w', and the peripheral lower insulating pattern 239p' may have a first vertical thickness T1, and the first upper insulating pattern 251c', the second upper insulating pattern 251w', and the peripheral upper insulating pattern 251p' may have a second vertical thickness T2 smaller than the first vertical thickness T1.

Conductive word line contact structures 48w may be provided that sequentially penetrate the second lower insulating pattern 239w' and the lower interlayer insulating layer ILD1 and are electrically connected to the word lines 12. Conductive peripheral contact structures 48p may be provided that sequentially penetrate the peripheral lower insulating pattern 239p' and the lower interlayer insulating layer ILD1 and are electrically connected to source/drain regions 11. A conductive gate contact structure 48g may be provided that sequentially penetrates the peripheral lower insulating pattern 239p', the lower interlayer insulating layer ILD1 and a gate capping pattern 7 and is electrically connected to a gate 6.

An upper interlayer insulating layer ILD2 may be provided on the substrate including the data storage patterns 278, the lower electrodes 263c, the spacers 266a, the first and second separation patterns 269 and 272, the first insulating patterns 254c', the second insulating pattern 254w', and the peripheral insulating pattern 254p'.

First grooves 194c may be provided that penetrate the upper interlayer insulating layer ILD2 and expose the data storage patterns 278. First conductive patterns 196c filling the first grooves 194c may be provided. Each of the first conductive patterns 196c may include a first conductive material layer 196c_1 covering an inner surface of each of the first grooves 194c, and a second conductive material layer 196c_2 formed on the first conductive material layer 196c_1 and filling each of the first grooves 194c.

Second grooves 196w may be provided that sequentially penetrate the upper interlayer insulating layer ILD2 and the second upper insulating patterns 251w' and expose the word line contact structures 48w. Second conductive patterns 196w filling the second grooves 194w may be provided. Each of the second conductive patterns 196w may include a first conductive material layer 196w_1 formed on an inner surface of each of the second grooves 194w, and a second conductive material layer 196w_2 formed on the first conductive material layer 196w_1 and filling each of the second grooves 194w.

Peripheral grooves 194p may be provided that sequentially penetrate the upper interlayer insulating layer ILD2 and the peripheral upper insulating pattern 251p' and expose the peripheral contact structures 48p. Peripheral conductive patterns 196p filling the peripheral grooves 194p may be provided. Each of the peripheral conductive patterns 196p may include a first conductive material layer 196p_1 formed on an inner surface of each of the peripheral grooves 194p, and a second conductive material layer 196p_2 formed on the first conductive material layer 196p_1 and filling each of the peripheral grooves 194p. A gate conductive structure 196g may be provided that sequentially penetrates the upper interlayer insulating layer IDL2 and the peripheral upper insulating pattern 251p' and is electrically connected to the gate contact structure 48g.

FIGS. 6, 7A to 7C, 8A, and 8B are process sequence diagrams illustrating methods of fabricating semiconductor devices according to some example embodiments of inventive concepts. Hereinafter, the methods of fabricating semiconductor substrate according to some example embodiments of inventive concepts will be described with reference to FIGS. 6, 7A to 7C, 8A, and 8B.

First, a method of fabricating a semiconductor device according to an example embodiment will be described with reference FIG. 6.

Figure 6:
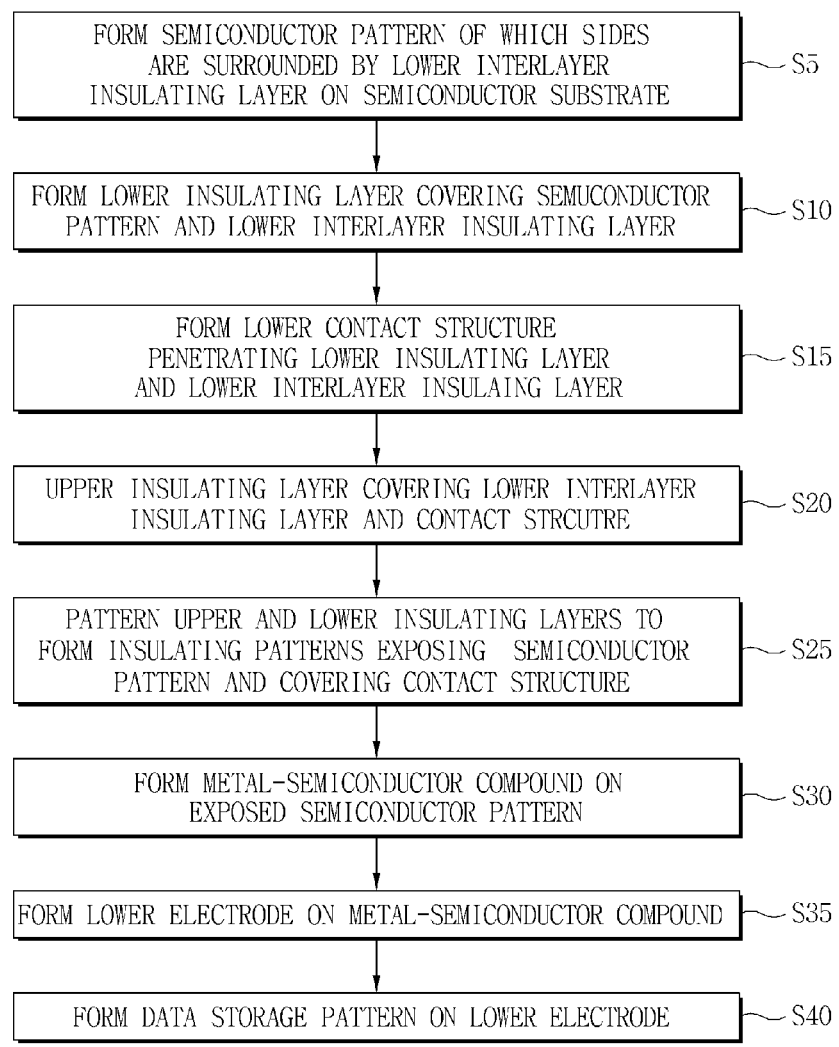
FIG. 6 is a process sequence diagram illustrating a method of fabricating a semiconductor device according to an example embodiment of inventive concepts.

Referring to FIG. 6, a semiconductor pattern may be formed on a semiconductor substrate with a side surrounded by a lower interlayer insulating layer (S5). The semiconductor pattern may be formed of crystalline silicon. A PN diode may be formed in the semiconductor pattern. A lower insulating layer may cover the lower interlayer insulating layer and the semiconductor pattern (S10). The lower insulating layer may be formed of silicon oxide or silicon nitride. A conductive structure, which penetrates the lower insulating layer and the lower interlayer insulating layer, may be formed (S15).

An upper insulating layer may cover the lower insulating layer and the contact structure (S20). The upper insulating layer may be formed of silicon oxide or silicon nitride.

The lower insulating layer and the upper insulating layer are patterned to form an insulating pattern structure which covers the contact structure and exposes the semiconductor pattern (S25). The upper and lower insulating layers may be selectively removed to expose the semiconductor patterns without exposing the contact structure.

A metal-semiconductor compound may be formed on the exposed semiconductor pattern (S30). The metal-semiconductor compound may be formed of metal silicide. For example, the metal-semiconductor compound may include any material selected from the group consisting of a Co—Si compound, a Ti—Si compound, a Ta—Si compound, a W—Si compound, and a Ni—Si compound.

A lower electrode may be formed on the metal-semiconductor compound (S35). A data storage pattern may be formed on the lower electrode (S40).

The data storage pattern may be formed of a material for storing information of a phase-change random access memory device. For example, the data storage pattern may include a phase-changeable material having an amorphous state with high resistivity and a crystalline phase with low resistivity according to heating temperature and heating time. The data storage pattern may include a material including a chalcogenide compound such as GeSbTe, GeTeAs, SnTeSn, GeTe, SbTe, SeTeSn, GeTeSe, SbSeBi, GeBiTe, GeTeTi, InSe, GaTeSe, or InSbTe. Alternatively, the data storage pattern may include a material in which any element selected from the group consisting of carbon (C), nitrogen (N), silicon (Si), and oxygen (O) is contained in any material selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, a InSe layer, a GaTeSe layer, and a InSbTe layer.

The lower electrode may include a material serving as a heater configured to heat the data storage pattern. For example, the lower electrode may include any material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

According to some example embodiments of inventive concepts, the process S5 of forming the semiconductor pattern with the side surrounded by the lower interlayer insulating layer may be performed through various methods. Hereinafter, the process S5 of forming the semiconductor pattern with the side surrounded by the lower interlayer insulating layer will be described with reference to FIGS. 7A to 7C.

First, an example embodiment of the process S5 of forming the semiconductor pattern with the side surrounded by the lower interlayer insulating layer will be described with reference to FIG. 7A.

Figure 7A:
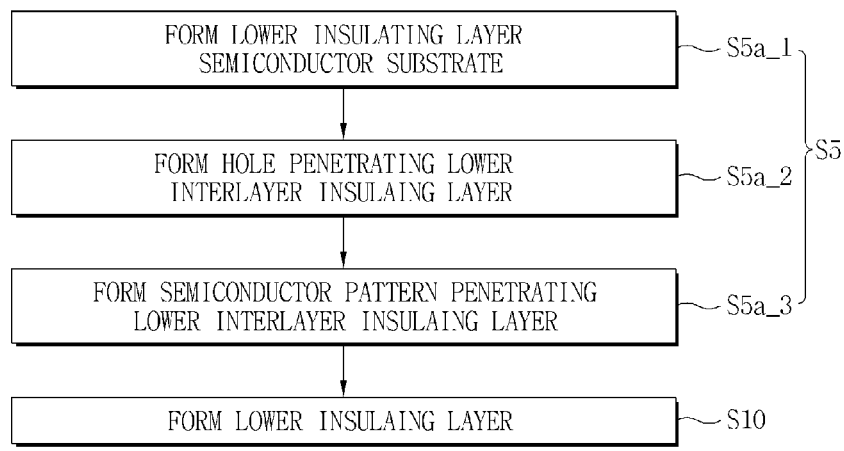
FIG. 7A is a process sequence diagram illustrating a method of fabricating a semiconductor device according to an example embodiment of inventive concepts.

Referring to FIG. 7A, the lower interlayer insulating layer may be formed on the semiconductor substrate (S5a_1). The lower interlayer insulating layer is patterned to form a hole in the lower interlayer insulating layer (S5a_2). The semiconductor pattern may be formed in the hole (S5a_3). The semiconductor pattern may be formed using epitaxial technology. A PN diode may be formed in the semiconductor pattern. Therefore, the semiconductor pattern may be formed that penetrates the lower interlayer insulating layer and the side thereof surrounded by the lower interlayer insulating layer (S5).

Next, one variation of the process S5 of forming the semiconductor pattern with the side surrounded by the lower interlayer insulating will be described with reference to FIG. 7B.

Figure 7B:
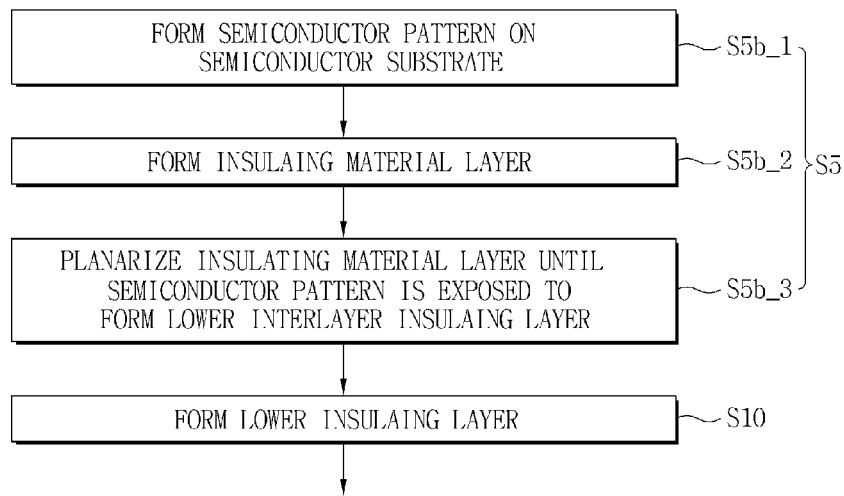
FIG. 7B is a process sequence diagram illustrating a method of fabricating a semiconductor device according to another example embodiment of inventive concepts.

Referring to FIG. 7B, the semiconductor pattern may be formed on the semiconductor substrate (S5b_1). An insulating material layer may be formed on the semiconductor substrate including the semiconductor pattern (S5b_2). The insulating material layer may be planarized until the semiconductor pattern is exposed to form the lower interlayer insulating layer (S5b_3). Therefore, the semiconductor pattern with the side surrounded by the lower interlayer insulating layer may be formed (S5).

Next, another variation of the process S5 of forming the semiconductor pattern with the side surrounded by the lower interlayer insulating layer will be described with reference to FIG. 7C.

Figure 7C:
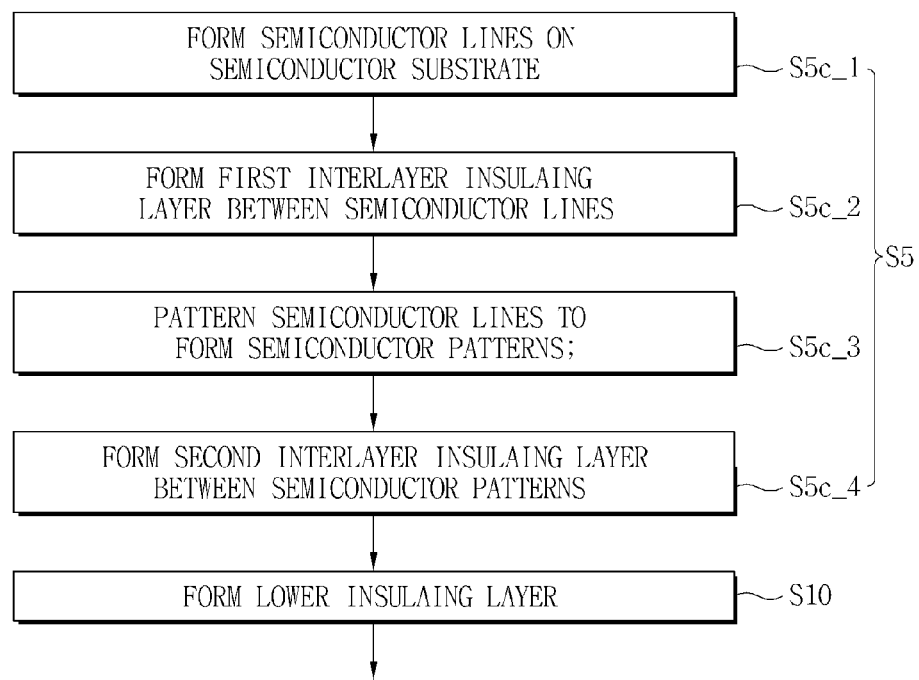
FIG. 7C is a process sequence diagram illustrating a method of fabricating a semiconductor device according to another example embodiment of inventive concepts.

Referring to FIG. 7C, semiconductor lines may be formed on the semiconductor substrate (S5c_1). A first interlayer insulating layer may be formed between the semiconductor lines (S5c_2). The semiconductor lines are patterned to form semiconductor patterns (S5c_3). A second interlayer insulating layer may be formed between the semiconductor patterns (S5c_4). The first and second interlayer insulating layer may constitute the lower interlayer insulating layer. Therefore, the semiconductor pattern with the side surrounded by the lower interlayer insulating layer may be formed (S5).

Hereinafter, a method of fabricating a semiconductor device according to some example embodiments of inventive concepts will be described with reference to FIGS. 6 and 8A.

Figure 8A:
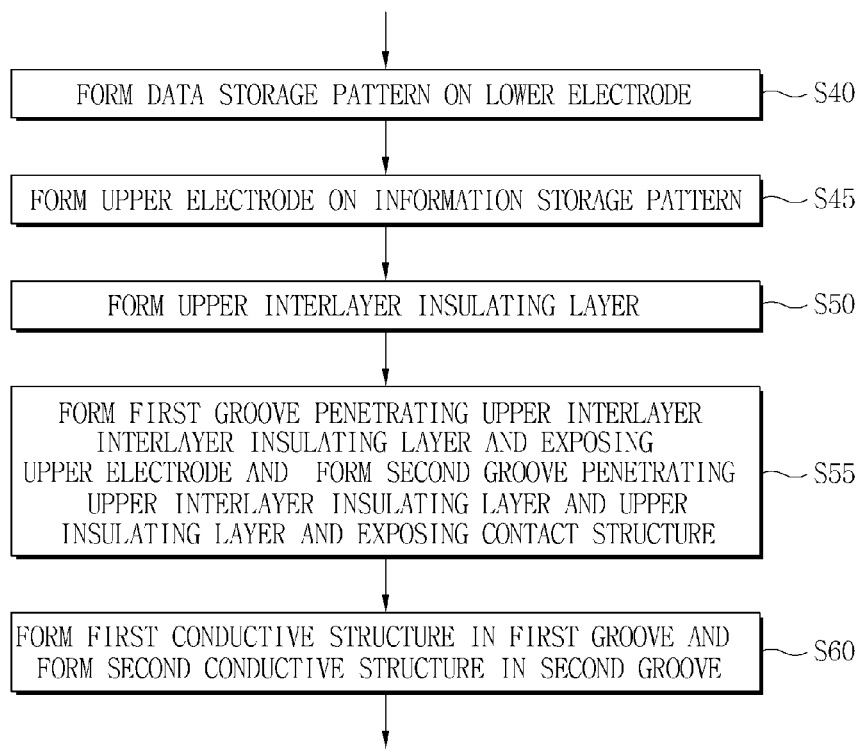
FIG. 8A is a process sequence diagram illustrating a method of fabricating a semiconductor device according to another example embodiment of inventive concepts.

Referring to FIGS. 6 and 8A, a substrate may be provided in which the processes from the forming a semiconductor pattern (S5) to the forming data storage pattern on the lower electrode (S40) as described in FIG. 6 are performed. Subsequently, an upper electrode may be formed on the data storage pattern (S45). An upper interlayer insulating layer may be formed on the substrate including the upper electrode (S50).

A first groove, which penetrates the upper interlayer insulating layer and exposes the upper electrode, and a second groove, which penetrates the upper interlayer insulating layer and the upper insulating layer and exposes the contact structure, may be formed (S55). A first conductive structure may be formed in the first groove and simultaneously, a second conductive structure may be formed in the second groove (S60).

Next, a method of fabricating a semiconductor device according to some example embodiments of inventive concepts will be described with reference to FIGS. 6 and 8B.

Figure 8B:
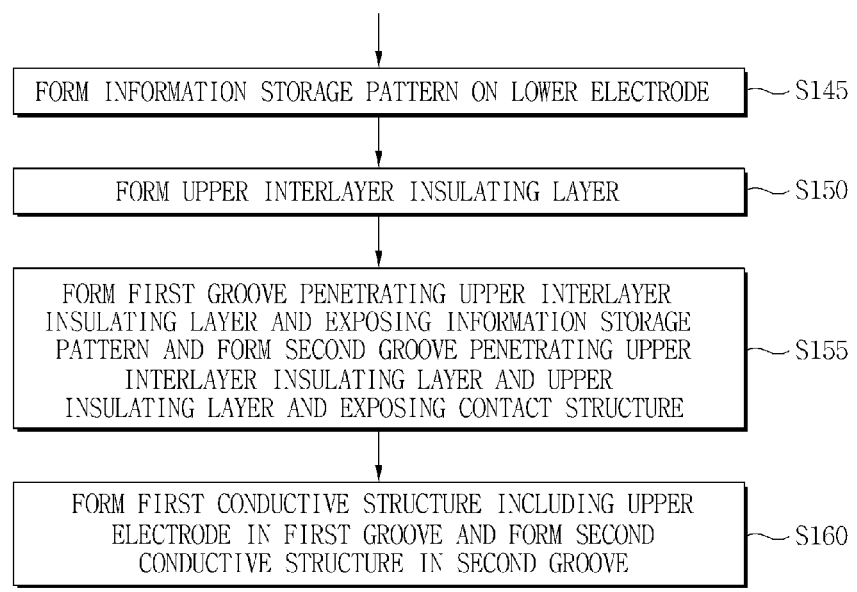
FIG. 8B is a process sequence diagram illustrating a method of fabricating a semiconductor device according to another example embodiment of inventive concepts.

Referring to FIGS. 6 and 8B, a substrate may be provided in which the processes from the forming a semiconductor pattern (S5) to the forming data storage pattern on the lower electrode (S40) as described in FIG. 6 are performed (S145). An upper interlayer insulating layer may be formed on the semiconductor substrate including the data storage pattern (S150).

A first groove, which penetrates the upper interlayer insulating layer and exposes the data storage pattern, and a second groove, which penetrates the upper interlayer insulating layer and the upper insulating layer and exposes the contact structure, may be formed (S155). A first conductive structure may be formed in the first groove and simultaneously, a second conductive structure may be formed in the second groove (S160). The first conductive structure may include the same material as the second conductive structure.

Figure 9A:
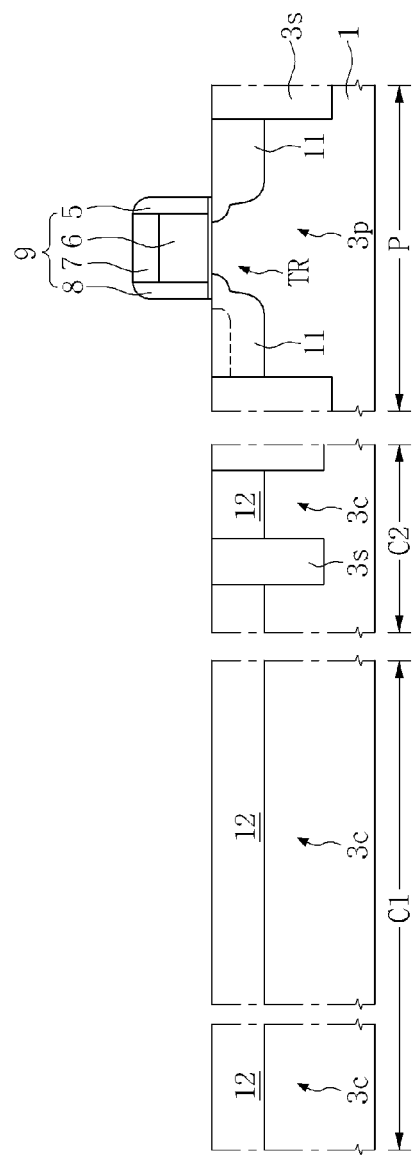
FIGS. 9A to 9W are cross-sectional views illustrating a method of fabricating a semiconductor device according to an example embodiment of inventive concepts.

A method of fabricating a semiconductor device according to an example embodiment will be described with reference to FIGS. 1 and 9A to 9W. In FIGS. 9A to 9W, a portion indicated by "C1" shows a region taken along line I-I' of FIG. 1, a portion indicated by "C2" shows a region taken along line II-II' of FIG. 1, and a portion indicated by "P" shows a region taken along line III-III' of FIG. 1.

Referring to FIGS. 1 and 9A, a substrate 1 including a first area CR and a second area PR may be provided. The substrate 1 may be a semiconductor substrate. The substrate 1 may be a silicon substrate. The first area CR may be a cell array area of a memory device and a second area PR may be a peripheral circuit area of the memory device.

A device isolation region 3s defining active regions may be formed in the substrate 1. The device isolation region 3s may be formed using trench isolation technology. The device isolation region 3s may define cell active regions 3c in the substrate 1 of the cell array area CR, and a peripheral active region 3p in the substrate 1 of the peripheral circuit area PR.

In some example embodiments, the cell active regions 3c may have line shapes spaced apart from each other when viewed in a plane.

A peripheral transistor TR may be formed on the substrate of the peripheral circuit area PR. The peripheral transistor TR may include a gate structure 9 formed on the peripheral active region 3p, and source/drain regions 11 formed in the peripheral active region 3p at both sides of the gate structure 9. The gate structure 9 may include a gate dielectric 5, a conductive gate electrode 6, and an insulating gate capping pattern 7 sequentially stacked on the peripheral active region 3p, and may further include insulating gate spacers 8 formed on sides of the gate electrode 6 and the gate capping pattern 7.

Word lines 12 may be formed in the cell active regions 3c. The word line 12 may be formed by ion-implanting impurities into the cell active region 3c. The word lines 12 may have a different conductivity from that of the cell active regions 3c. For example, the cell active regions 3c may have a P-type conductivity and the word line 12 may have an N-type conductivity.

Figure 9B:
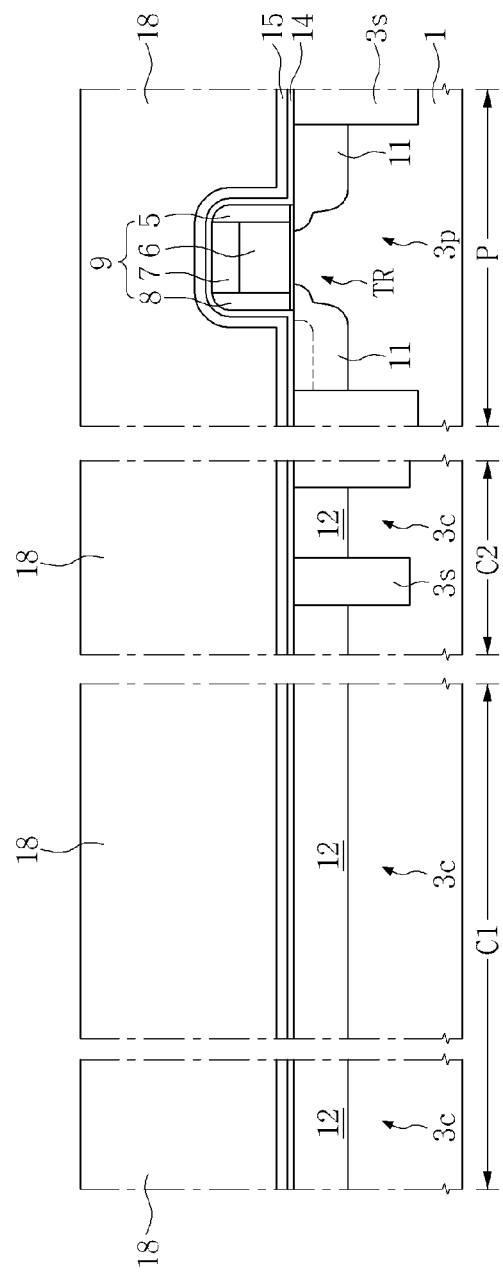

Referring to FIGS. 1 and 9B, a buffer oxide layer 14 and an etch stop layer 15 may be sequentially formed on the substrate including the peripheral transistor TR and the word lines 12. The buffer oxide layer 14 may be formed of silicon oxide and the etch stop later 15 may be formed of silicon nitride. A lower interlayer insulating layer 18 may be formed on the etch stop layer 15. The lower interlayer insulating layer 18 may be formed of silicon oxide or a low-k dielectric.

Figure 9C:
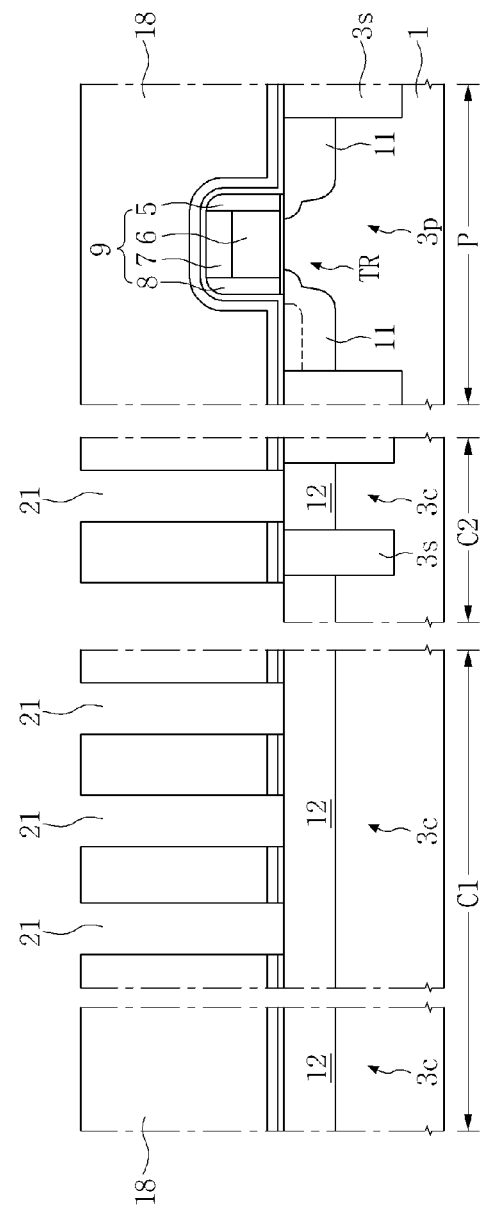

Referring to FIGS. 1 and 9C, the lower interlayer insulating layer 18, the etch stop layer 15, and the buffer oxide layer 14 may be patterned to form diode holes 21 which penetrate the lower interlayer insulating layer 18, the etch stop layer 15, and the buffer layer 14 and expose the word lines 12.

The diode holes 21 may be spaced apart from each other. A plurality of diode holes may be formed on one word line 12 to be spaced apart from each other.

Figure 9D:
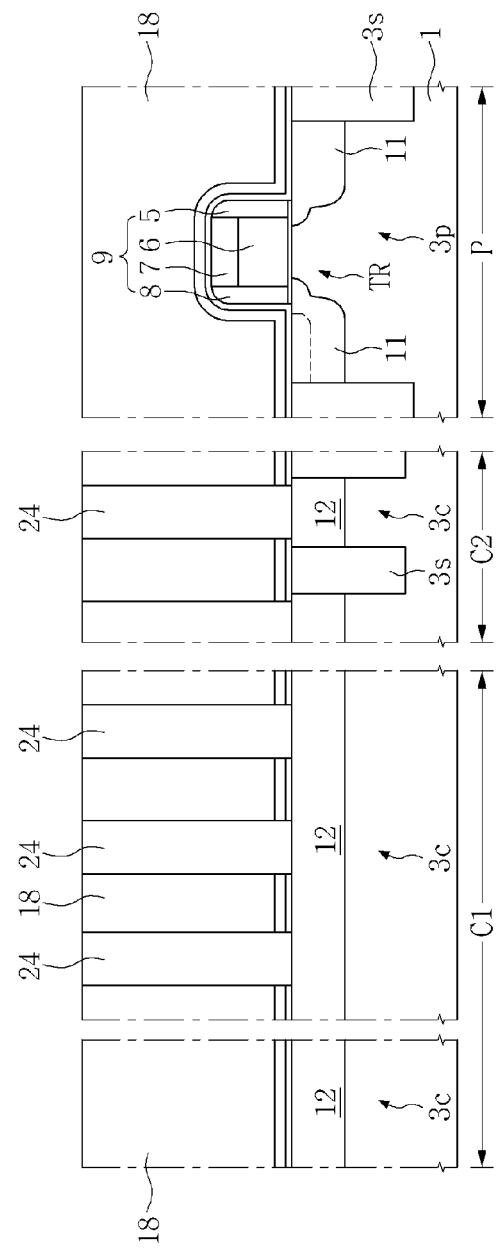

Referring to FIGS. 1 and 9D, semiconductor patterns 24 may be formed in the diode holes 21. Sides of the semiconductor patterns 24 may be surrounded by the lower interlayer insulating layer 18. The lower interlayer insulating layer 18 may be formed on the semiconductor substrate of the cell array area CR and the peripheral circuit area PR. The semiconductor patterns 24 may penetrate the lower interlayer insulating layer 18 formed on the semiconductor substrate of the cell array area CR. The semiconductor patterns 24 may be formed on the semiconductor substrate of the cell array area CR.

The semiconductor patterns 24 may be formed of a crystalline semiconductor material. The semiconductor patterns 24 may be formed of crystalline silicon. For example, the semiconductor patterns 24 may include a single crystalline silicon grown from the word lines 12 exposed by the diode holes 21 using a selective epitaxial growth process. However, example embodiments of inventive concepts are not limited thereto. For example, the process of forming the semiconductor patterns 24 may include forming an amorphous silicon filling the diode holes 21, and crystallizing the amorphous silicon into a crystalline silicon through an annealing process. The crystalline silicon may include polycrystalline silicon or single crystalline silicon.

The semiconductor patterns 24 with the sides surrounded by the lower interlayer insulating layer 18 have been illustrated in FIGS. 9A to 9D. For example, in FIGS. 9A to 9D, as described in FIG. 7A, the method (S5a_1 to S5a_3) of forming the semiconductor patterns 24 after forming the lower interlayer insulating layer 18 has been described, but example embodiments of inventive concepts are not limited thereto. For example, as described in FIG. 7B, the lower interlayer insulating layer may be formed after forming the semiconductor patterns (see S5b1_1 to S5b_3). Alternatively, as described in FIG. 7C, the semiconductor patterns 24 and the lower interlayer insulating layer 18 may be formed using the method of forming semiconductor lines on the semiconductor substrate, patterning the semiconductor lines to form the semiconductor patterns, and forming a second interlayer insulating layer between the semiconductor patterns 24.

Figure 9E:
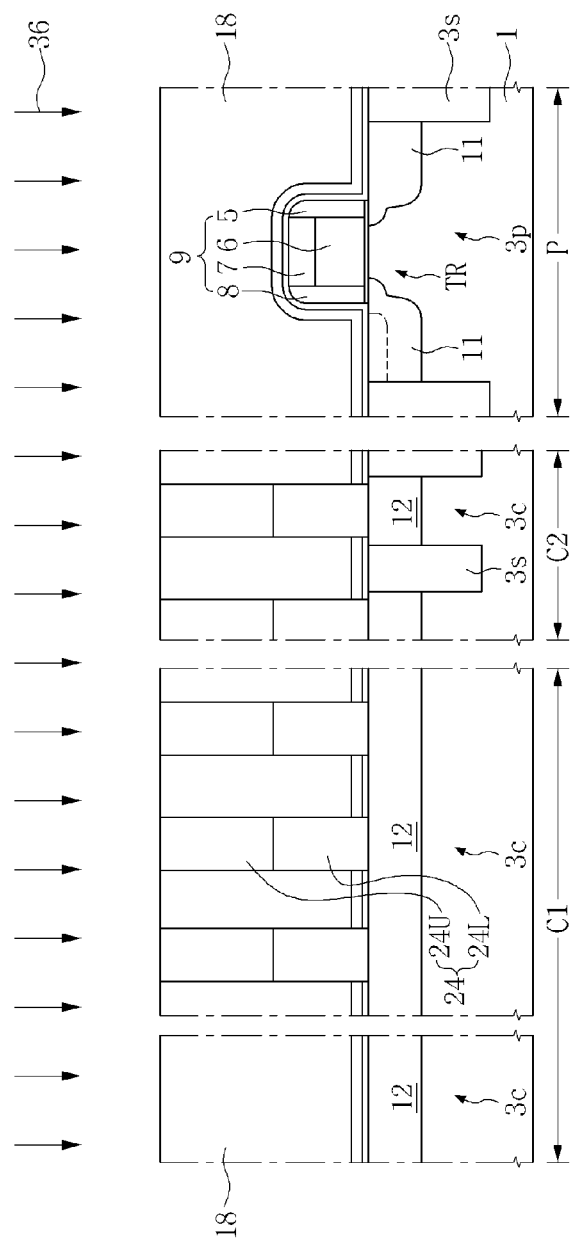

Referring to FIGS. 1 and 9E, a first impurity implantation process 36 may be performed to form upper semiconductor regions 24U within the semiconductor patterns 24. The first impurity implantation process 36 may include implanting impurities such as boron (B) into upper regions of the semiconductor patterns 24, and performing an annealing process to activate the implanted impurities. Further, during the annealing process, impurities in the word lines 12 may be diffused into lower regions of the semiconductor patterns 24 to form lower semiconductor regions 24L. Therefore, each of the semiconductor patterns 24 may include the upper semiconductor region 24U and the lower semiconductor region 24L disposed below the upper semiconductor region 24U.

In another example embodiment, the process of forming the upper semiconductor region 24U and the lower semiconductor region 24L may include implanting impurities of group III on the periodic table such as boron (B) into the upper regions of the semiconductor patterns 24, implanting impurities of group V on the periodic table such as phosphorus (P) or arsenic (As) into the lower regions of the semiconductor patterns 24, and performing an annealing process to activate the injected impurities to form the upper semiconductor regions 24U in the upper regions of the semiconductor patterns 24 and the lower semiconductor regions 24L in the lower regions of the semiconductor patterns 24.

The upper semiconductor region 24U and the lower semiconductor region 24L in each of the semiconductor patterns 24 may form a PN diode.

Figure 9F:
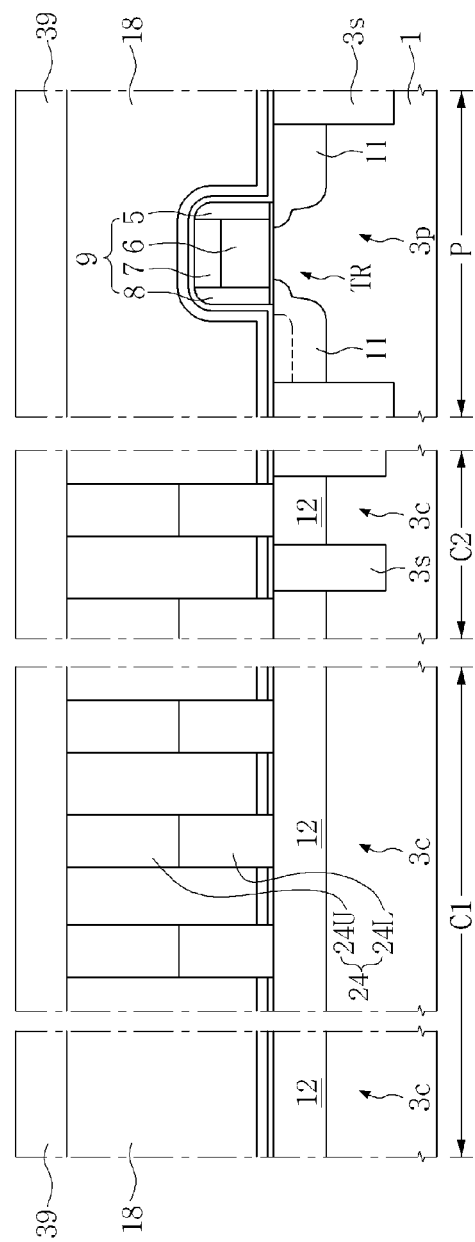

Referring to FIGS. 1 and 9F, a lower insulating layer 39 may be formed on the substrate including the upper semiconductor regions 24U and the lower semiconductor regions 24L. The lower insulating layer 39 may cover the semiconductor patterns 24 and the lower interlayer insulating layer 18.

In some example embodiments, the lower insulating layer 39 may include a material layer having an etch selectivity to the lower interlayer insulating layer 18. For example, the lower interlayer insulating layer 18 may be formed of silicon oxide. The lower insulating layer 39 may be formed of silicon nitride. Alternatively, the lower insulating layer 39 may be formed of silicon oxide.

Figure 9G:
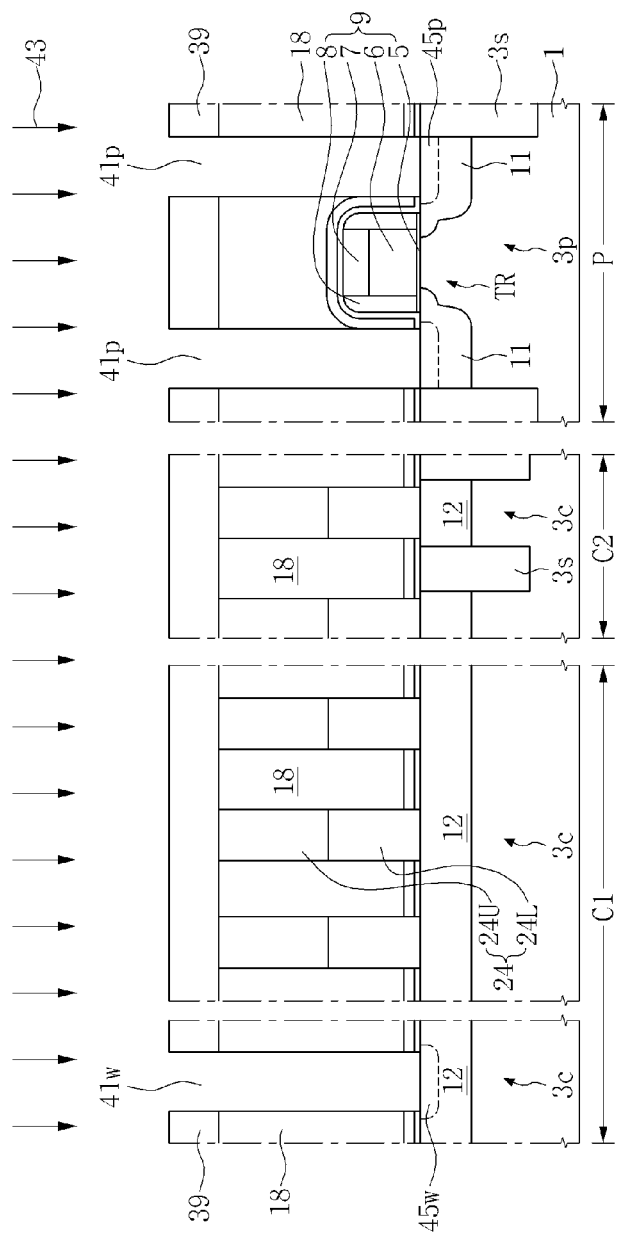

Referring to FIGS. 1 and 9G, word line contact holes 41w and peripheral contact holes 41p may be formed that sequentially penetrate the lower insulating layer 39, the lower interlayer insulating layer 18, the etch stop layer 15, and the buffer oxide layer 14.

The word line contact holes 41w may expose the word lines 12 and may be spaced apart from the semiconductor patterns 24. The peripheral contact holes 41p may expose the source/drain regions 11. In addition, while forming the word line contact holes 41w and the peripheral contact holes 41p, a gate contact hole may be formed that sequentially penetrates the lower insulating layer 39, the lower interlayer insulating layer 18, the etch stop layer 15, the buffer oxide layer 14, and the gate capping pattern 7.

A second impurity implantation process 43 may be performed to form additional cell impurity regions 45w in the word lines 12 exposed by the word line contact holes 41w, and additional peripheral impurity regions 45p in the source/drain regions 11 exposed by the peripheral contact holes 41p. The second impurity implantation process 43 may include an ion implantation process of implanting impurities into the word line 12 and/or the source/drain regions 11, and an annealing process of activating the implanted impurities. The impurities implanted into the word lines 12 and/or the source/drain regions 11 through the second impurity implantation process 43 may be an element of group 3B on the periodic table such as boron (B). Alternatively, the impurities implanted into the word lines 12 and/or the source/drain regions 11 through the second impurity implantation process 43 may be an element of group 5B on the periodic table such as phosphorus (P) or arsenic (As). The additional cell impurity region 45w may have the same conductivity as the word lines 12, and the additional peripheral impurity region 45p may have the same conductivity as the source/drain regions 11. The annealing process of activating the impurities implanted in the word lines 12 and/or the source/drain regions 11 in the second impurity implantation process 43 may be performed at a temperature of about 1000° C. to about 1200° C. using a rapid thermal annealing process.

In some example embodiments, when the word lines 12 and the source/drain regions 11 have the same conductivity, the additional cell impurity regions 45w and the additional peripheral impurity regions 45p may be simultaneously formed through the second impurity implantation process 43. Alternatively, when the word lines 12 and the source/drain regions 11 have a different conductivity from each other, any one of the additional cell impurity regions 45w and the additional peripheral impurity regions 45p may be first formed.

Figure 9H:
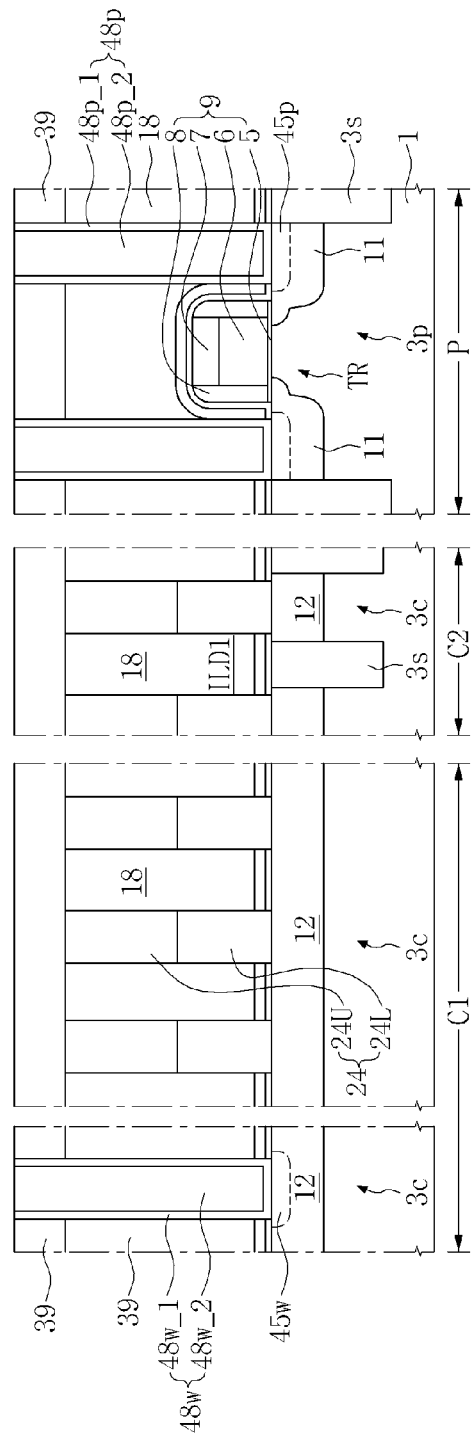

FIGS. 1 and 9H, word line contact structures 48w filling the word line contact holes 41w, and peripheral contact structures 48p filling the peripheral contact holes 41p may be formed on the substrate including the additional cell impurity regions 45w and the additional peripheral impurity regions 45p. Further, a gate contact structure 48g filling the gate contact hole may be formed.

The word line contact structures 48w may sequentially penetrate the lower insulating layer 39, the lower interlayer insulating layer 18, the etch stop layer 15, and the buffer oxide layer 14 and may be electrically connected to the word lines 12. The peripheral contact structures 48p may sequentially penetrate the lower insulating layer 39, the lower interlayer insulating layer 18, the etch stop layer 15, and the buffer oxide layer 14 and may be electrically connected to the source/drain regions 11 of the peripheral transistor TR. The gate contact structure 48g may sequentially penetrate the lower insulating layer 39, the lower interlayer insulating layer 18, the etch stop layer 15, the buffer oxide layer 14, and the gate capping pattern 7 and may be electrically connected to the gate electrode 6.

The process of forming the word line contact structures 48w, the peripheral contact structures 48p, and the gate contact structure 48g may include conformally forming a first conductive material layer on the substrate including the additional cell impurity regions 45w and the additional peripheral impurity regions 45p, forming a second conductive material layer filling the word line contact holes 41w, the peripheral contact holes 41p, and the gate contact hole on the first conductive material layer, and planarizing the second conductive material layer and the first conductive material layer until the lower insulating layer 39 is exposed. The planarization may be performed using an etch back process and/or a chemical mechanical polishing (CMP) process. Therefore, the word line contact structures 48w may include the first conductive material layers 48w_1 and the second conductive material layers 48w_2 remaining in the word line contact holes 41w. The peripheral contact structures 48p may include the first conductive material layers 48p_1 and the second conductive material layers 48p_2 remaining in the peripheral contact holes 41p. The gate contact structures 48g may include the first conductive material layer and the second conductive material layer remaining in the gate contact hole.

Figure 9I:
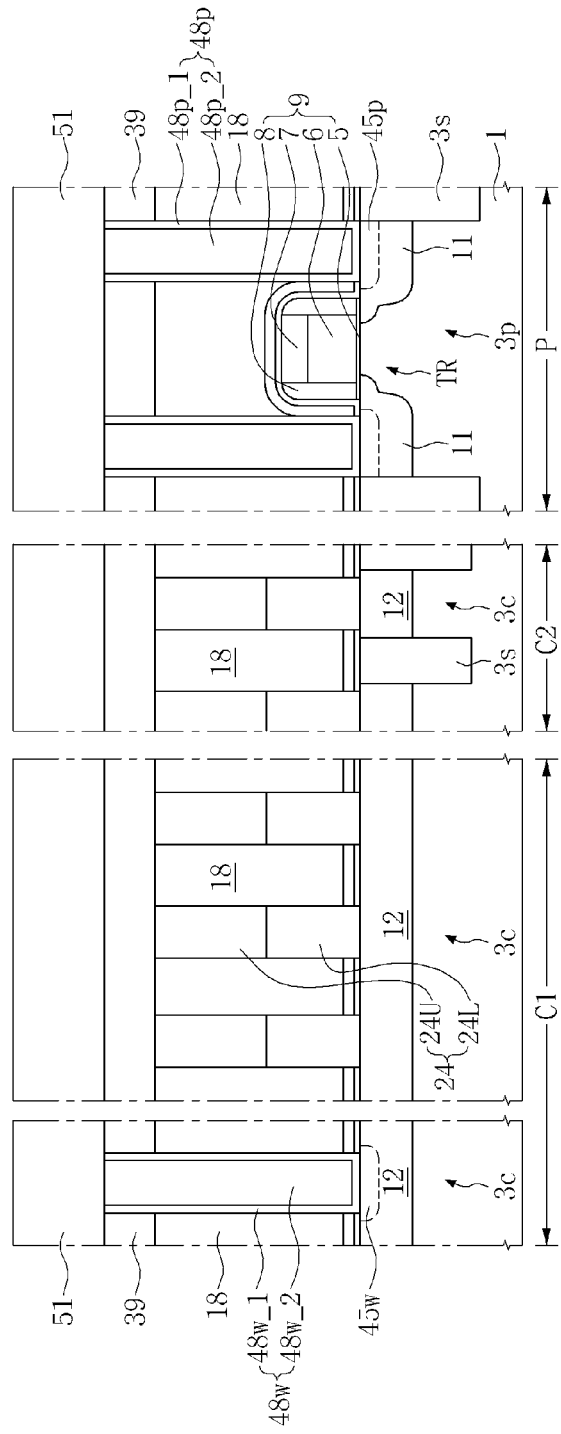

Referring to FIGS. 1 and 9I, an upper insulating layer 51 may be formed on the substrate including the word line contact structures 48w, the peripheral contact structures 48p, and the gate contact structure 48g. The upper insulating layer 51 may cover the lower insulating layer 39, the word line contact structures 48w, the peripheral contact structures 48p, and the gate contact structure 48g. The upper insulating layer 51 may be formed of an insulating material such as silicon oxide and/or silicon nitride.

In some example embodiments, the upper insulating layer 51 may have a thickness smaller than that of the lower insulating layer 39. Alternatively, the upper insulating layer 51 may have a thickness greater than that of the lower insulating layer 39.

Figure 9J:
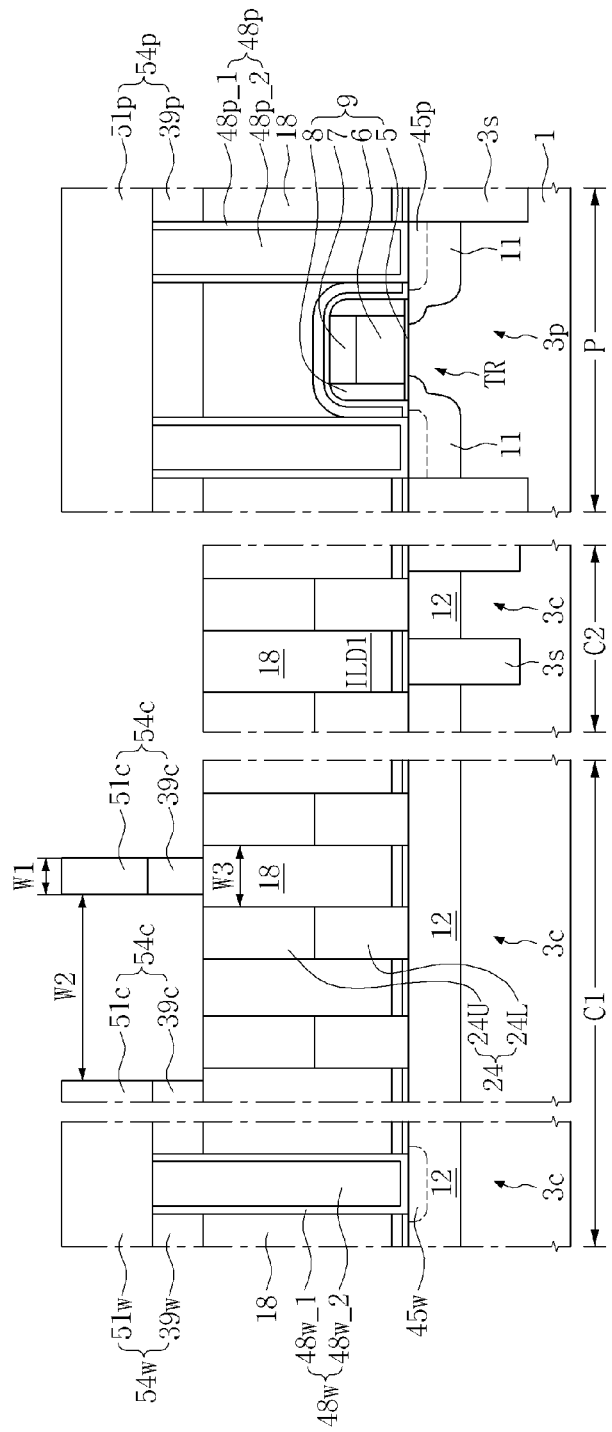

Referring to FIGS. 1 and 9J, the upper insulating layer 51 and the lower insulating layer 39 may be patterned to form insulating patterns which expose the semiconductor patterns 24 and cover the word line contact structures 48w, the peripheral contact structures 48p, and the gate contact structure 48g.

The insulating patterns may include first insulating patterns 54c, a second insulating pattern 54w, and a peripheral insulating pattern 54p.

The first insulating patterns 54c may be formed on the lower interlayer insulating layer 18 between the semiconductor patterns 24. Each of the first insulating patterns 54c may include a sequentially stacked first lower insulating pattern 39c and first upper insulating pattern 51c. The first insulating patterns 54c may have line shapes spaced apart from each other. Each of the first insulating patterns 54c may have a first width W1. A distance W2 between the first insulating patterns 54c adjacent to each other may be greater than the first width W1. A distance W2 between the first insulating patterns 54c adjacent to each other may be greater than a distance W3 between the semiconductor patterns 24 adjacent to each other.

The second insulating pattern 54w may be formed on the word line contact structures 48w. The second insulating pattern 54w may include a sequentially stacked second lower insulating pattern 39w and second upper insulating pattern 51w. The second lower insulating pattern 39w may be formed on sides of the word line contact structures 48w. The second upper insulating pattern 51w may cover an upper surface of the second lower insulating pattern 39w and upper surfaces of the word line contact structures 48w.

The peripheral insulating pattern 54p may include a sequentially stacked peripheral lower insulating pattern 39p and peripheral upper insulating pattern 51p. The peripheral insulating pattern 54p may be formed on the peripheral contact structures 48p and the gate contact structure 48g. The peripheral lower insulating pattern 39p may be formed on sides of the peripheral contact structures 48p and the gate contact structure 48g. The peripheral upper insulating pattern 51p may cover upper surfaces of the peripheral contact structures 48p and the gate contact structure 48g, and an upper surface of the peripheral lower insulating pattern 39p.

Sides of each of the word line contact structures 48w may be surrounded by the lower interlayer insulating layer 18 and the second lower insulating pattern 39w, and the upper surface of each of the word line contact structures 48w may be covered by the second upper insulating pattern 51w. Upper sides of the word line contact structures 48w may be surrounded by the second lower insulating pattern 39w.

Sides of each of the peripheral contact structures 48p and gate contact structure 48g may be surrounded by the lower interlayer insulating layer 18 and the peripheral lower insulating pattern 39p, and the upper surface of each of the peripheral contact structures 48p and gate contact structure 48g may be covered by the peripheral upper insulating pattern 51p. Upper sides of the peripheral contact structures 48p and the gate contact structure 48g may be surrounded by the peripheral lower insulating pattern 39p.

Figure 9K:
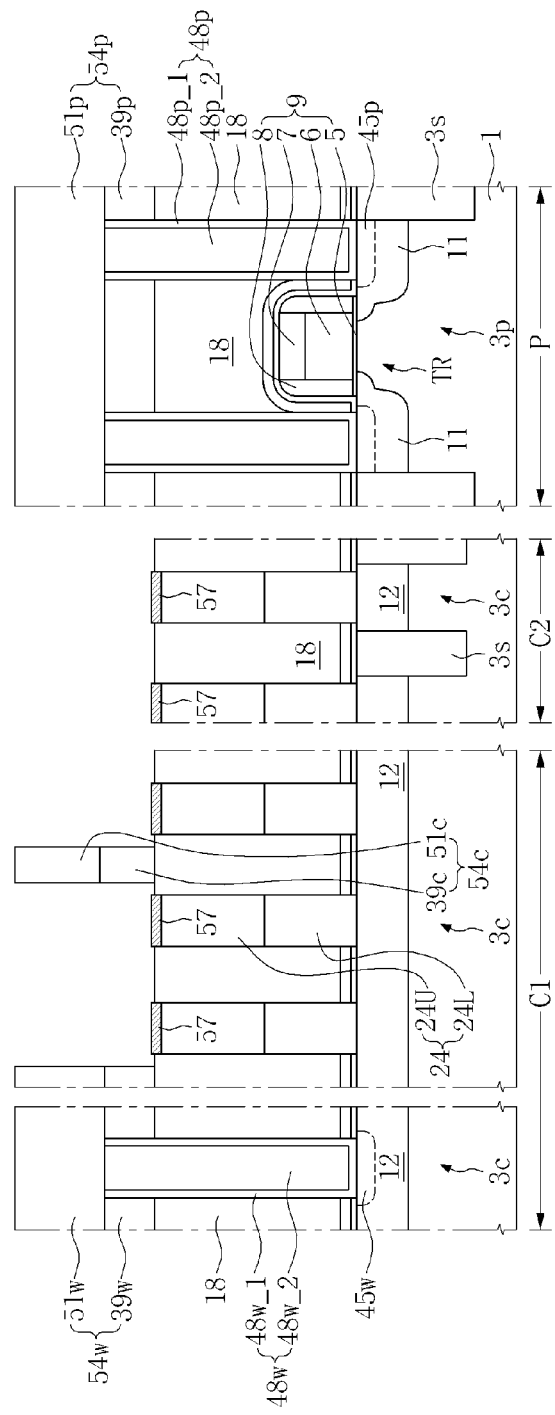

Referring to FIGS. 1 and 9K, after forming the insulating patterns 54c, 54w, and 54p, metal-semiconductor compounds 57 may be formed on the exposed semiconductor patterns 24.

The process of forming the metal-semiconductor compounds 57 may include forming a metal layer on the substrate including the insulating patterns 54c, 54w, and 54p, performing a silicide annealing process on the substrate including the metal layer to cause the metal layer to react with the semiconductor patters 24, thereby forming the metal-semiconductor compounds 57, and removing a unreacted metal layer. The metal-semiconductor compounds 57 may be formed of metal silicide. The metal-semiconductor compounds 57 may include any material selected from the group consisting of a Co—Si compound, a Ti—Si compound, a Ta—Si compound, a W—Si compound, and a Ni—Si compound.

Since the metal-semiconductor compounds 57 may be formed after the word line contact structures 48w and the peripheral contact structures 48p, degradation of the metal-semiconductor compounds 57 can be prevented. As described in FIG. 9G, since the metal-semiconductor compounds 57 are formed after the second impurity implantation process 43 including the annealing process performed at the temperature of about 1000° C. to about 1200° C. to activate the implanted impurities, the metal-semiconductor compounds 57 are not degraded by the annealing process of the second impurity implantation process 43.

Figure 9L:
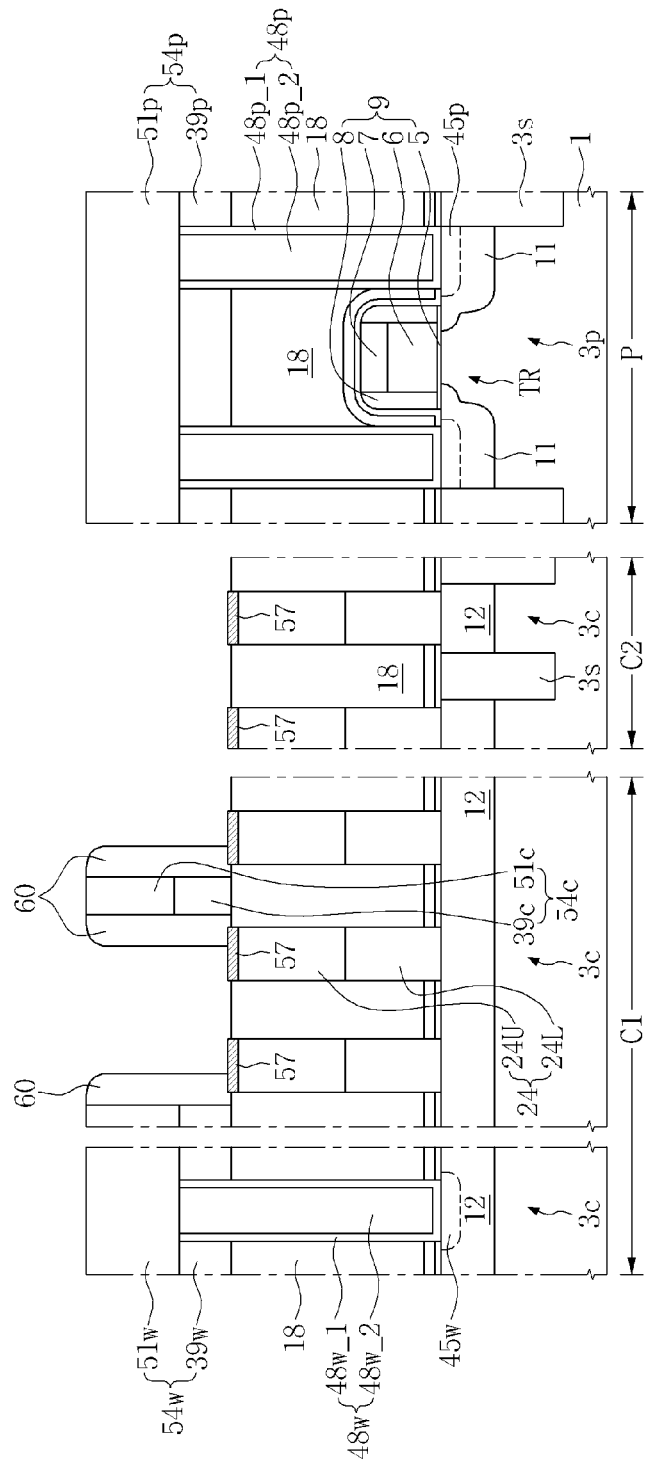

Referring to FIGS. 1 and 9L, first spacers 60 may be formed on the sides of the insulating patterns 54c, 54w, and 54p. For example, the first spacers 60 may be formed on the sides of the first insulating patterns 54c. The process of forming the first spacers 60 may include forming a first spacer layer on the substrate including the insulating patterns 54c, 54w, and 54p, and anisotropically etching the first spacer layer so that the first spacer layer remains on the sides of the insulating patterns 54c, 54w, and 54p. The first spacers 60 may be formed of an insulating material such as silicon oxide or silicon nitride. The first spacers 60 may have a width smaller than that of the semiconductor patterns 24.

The first spacers 60 formed on the sides of the first insulating patterns 54c in the cell array area CR may partially cover the metal-semiconductor compounds 57. A portion of each of the metal-semiconductor compounds 57 may be covered by each of the spacers 60 and a remaining portion thereof may be exposed.

Figure 9M:
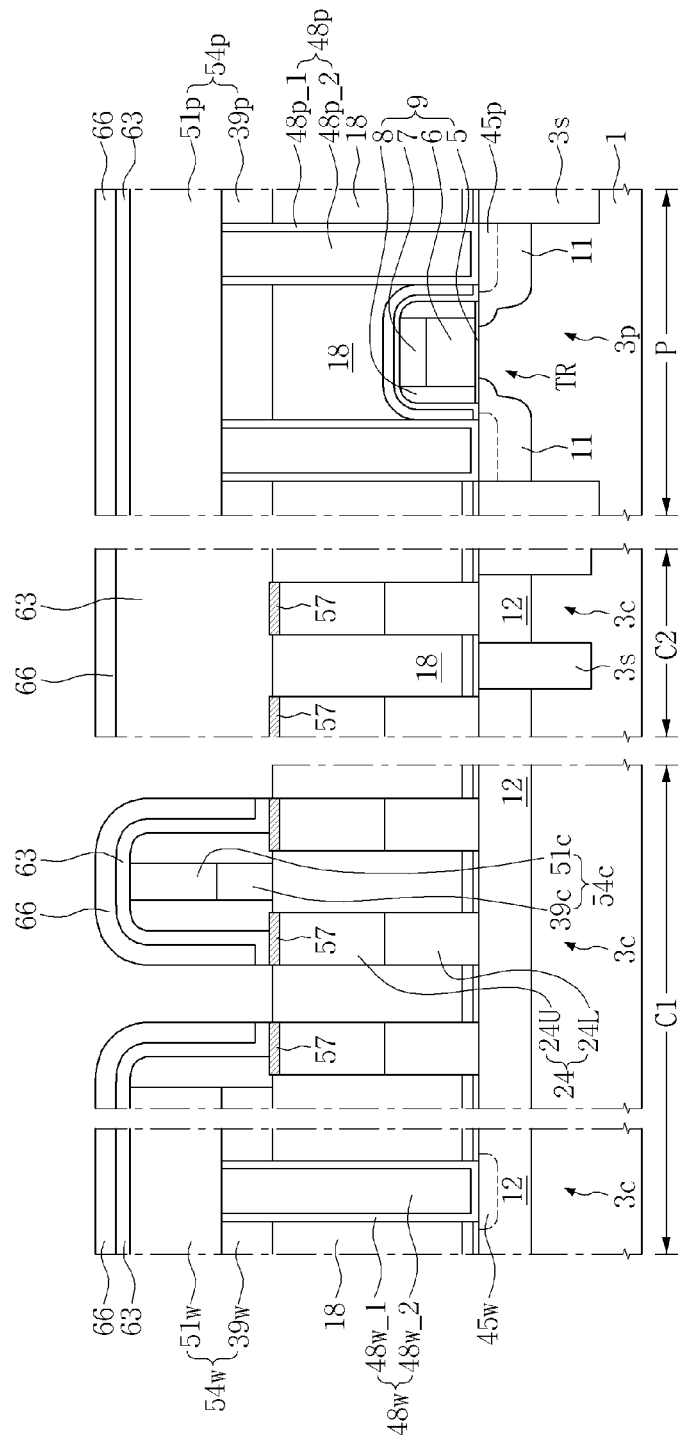

Referring to FIGS. 1 and 9M, a lower electrode layer 63 may be conformally formed on the substrate including the first spacers 60. The lower electrode layer 63 may include any material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

A spacer layer 66 may be conformally formed on the lower electrode layer 63. The spacer layer 68 may be formed of an insulating material such as silicon oxide or silicon nitride.

Figure 9N:
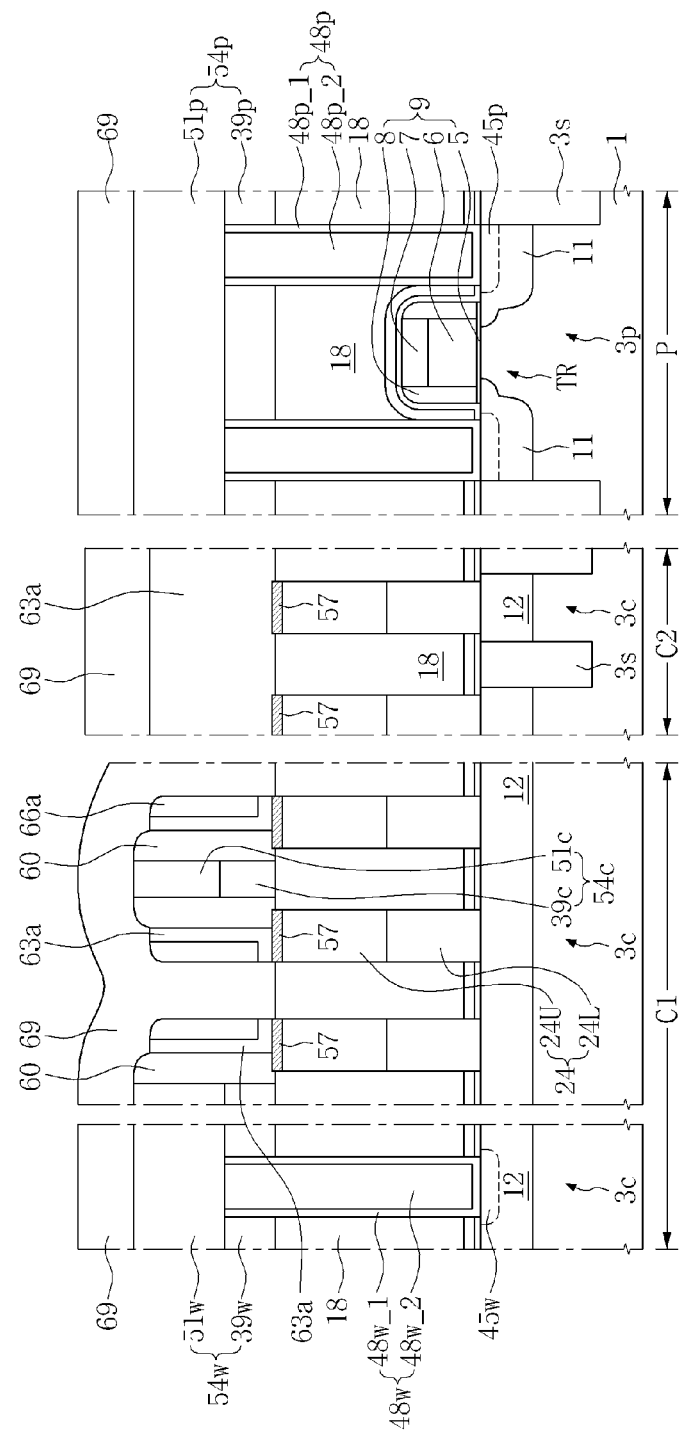
Figure 90:
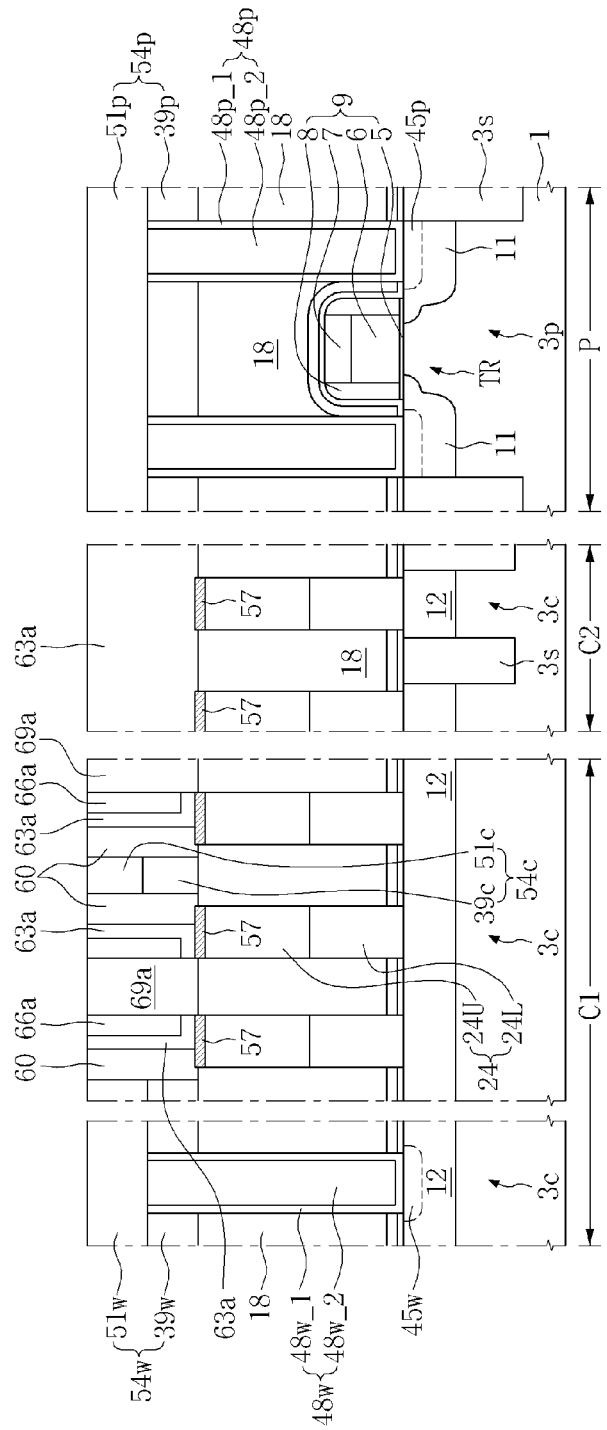

Referring to FIGS. 1 and 9N, the spacer layer 66 and the lower electrode layer 63 may be sequentially anisotropically etched to form second spacers 66a and the lower electrode lines 63a. Since the first insulating patterns 54c may be formed in line shapes, the second spacers 66a and the lower electrode lines 63a may also be formed in line shapes.

A first separation layer 69 may be formed on the substrate including the second spacers 66a and the lower electrode lines 63a. The first separation layer 69 may be formed of an insulating layer such as silicon oxide or silicon nitride.

Referring to FIGS. 1 and 9O, the first separation layer 69 may be planarized to form first separation patterns 69a. The first separation patterns 69a may be formed in line shapes to be spaced apart from each other. The process of forming first separation patterns 69a may include planarizing the first separation layer 69 using a planarization process such a CMP process. While planarizing the first separation layer 69 using the planarization process such as a CMP process, vertical thicknesses of the first insulating patterns 54c, the second insulating pattern 54w, and the peripheral insulating pattern 54p may be reduced by the planarization process. Each of the first insulating patterns 54c may include a sequentially stacked first lower insulating pattern 39c and first upper insulating pattern 51c, the second insulating patterns 54w may include a sequentially stacked second lower insulating pattern 39w and upper insulating pattern 51w, and the peripheral insulating pattern 54p may include a sequentially stacked peripheral lower insulating pattern 39p and peripheral upper insulating pattern 51p.

In some example embodiments, the first upper insulating patterns 51c, the second upper insulating pattern 51w, and the peripheral insulating pattern 51p may have a vertical thickness smaller than that of the first lower insulating patterns 39c, the second lower insulating patterns 39w, and the peripheral lower insulating pattern 39p.

Alternatively, the first upper insulating patterns 51c, the second upper insulating pattern 51w, and the peripheral upper insulating pattern 51p may have a vertical thickness equal to or greater than that of the first lower insulating patterns 39c, the second lower insulating patterns 39w, and the peripheral lower insulating pattern 39p.

The first separation patterns 69a may be disposed between the first insulating patterns 54c. For example, one first separation pattern 69a may be disposed between two first insulating patterns 54c adjacent to each other. Further, one first insulating pattern 54c may be disposed between two first separation patterns 69a adjacent to each other.

The first spacer 60, the lower electrode line 63a, and the second spacer 66a may be disposed between the first insulating pattern 54c and the first separation pattern 69a adjacent to each other. Further, the first spacer 60 may be disposed closer to the first insulating pattern 54c than the first separation pattern 69a, and the second spacer 66a may be disposed closer to the first separation pattern 69a than the first insulating pattern 54c. The lower electrode line 63a may include a portion interposed between the first spacer 60 and the second spacer 66a, and a portion extending between the second spacer 66a and the metal-semiconductor compound 57.

Figure 9P:
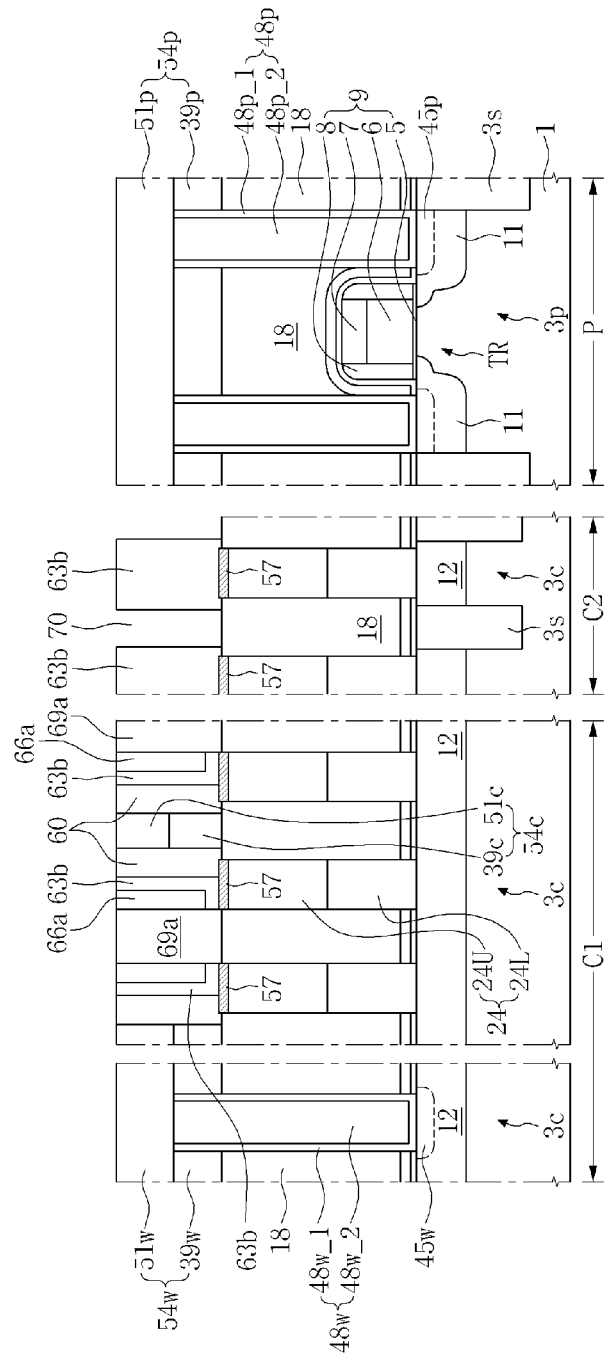

Referring to FIGS. 1 and 9P, trenches 70 for cutting the lower electrode lines 63a may be formed. Lower electrode lines 63b cut by the trenches 70 may be disposed on the metal-semiconductor compounds 57 and to be electrically connected to the metal-semiconductor compounds 57. The cut lower electrode lines 63b may be referred to as lower electrode patterns.

The trenches 70 may be formed by patterning the lower electrode lines 63a and the second spacers 66a. The trenches 70 may be formed in line shapes by patterning the lower electrode lines 63a, the second spacers 66a, the first spacers 60, the first separation patterns 69a, and the first insulating patterns 54c.

Figure 9Q:
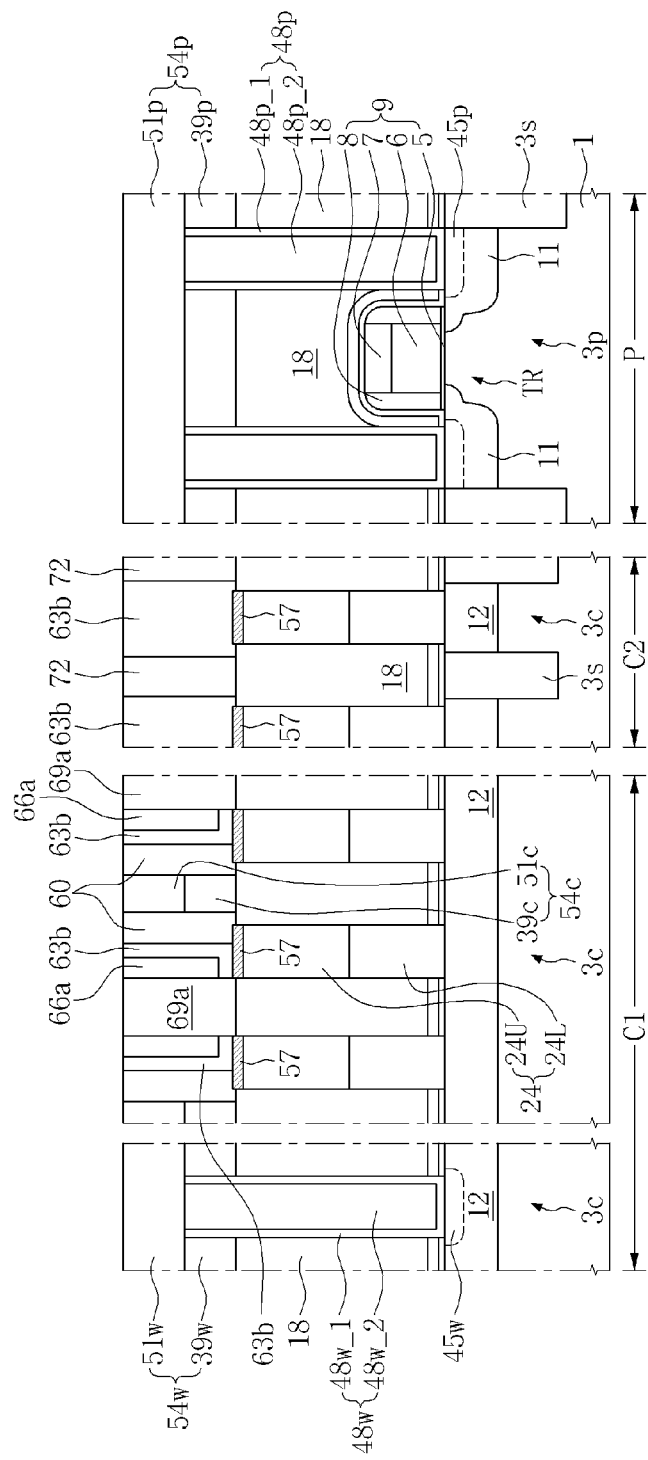

Referring to FIGS. 1 and 9Q, second separation patterns 72 filling the trenches 70 may be formed. The second separation patterns 72 may be formed of silicon oxide or silicon nitride. The process of forming the second separation patterns 72 may include forming an insulating layer on the substrate including the trenches 70, and planarizing the insulating layer to be defined within the trenches 70.

Figure 9R:
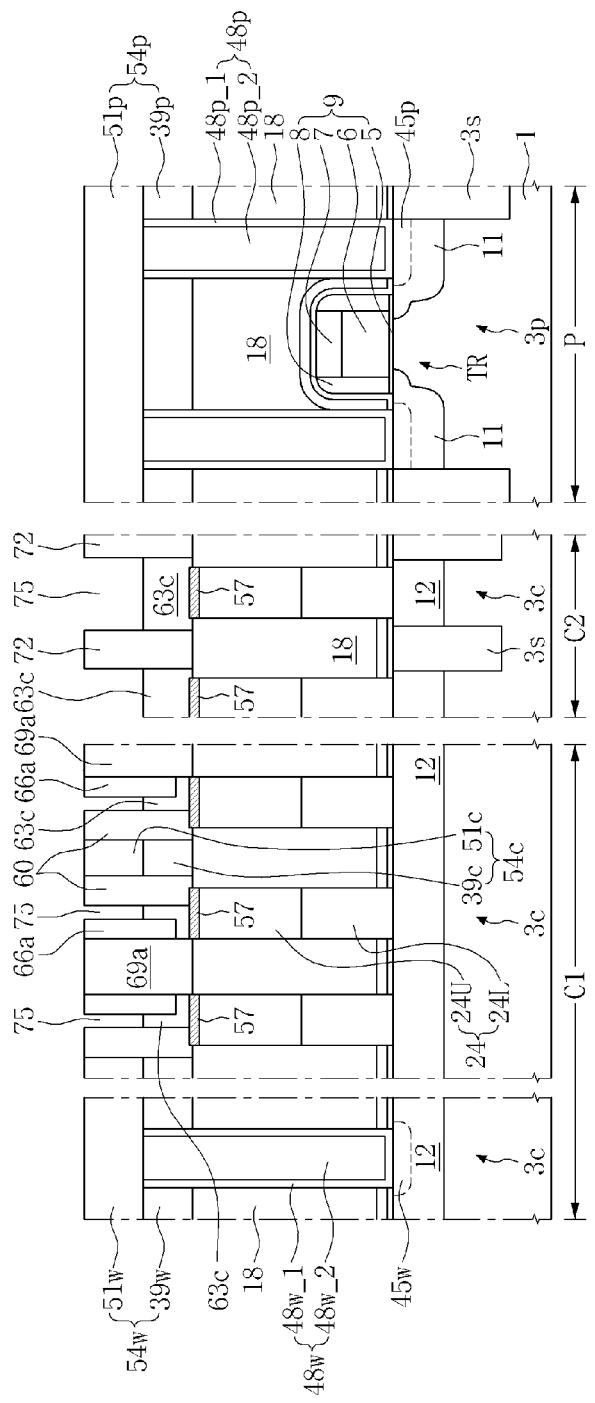

Referring to FIGS. 1 and 9R, the lower electrode patterns 63b may be partially etched to form lower electrodes 63c. Upper surfaces of the lower electrodes 63c may be at a level lower than upper surfaces of the first and second spacers 60 and 66a, upper surfaces of the first and second separation patterns 69a and 72, and upper surfaces of the first and second insulating patterns 54c and 54w. Holes 75 defined by the first and second spacers 60 and 66a and the second separation patterns 72 may be formed by the partial etching of the lower electrode patterns 63b.

Figure 9S:
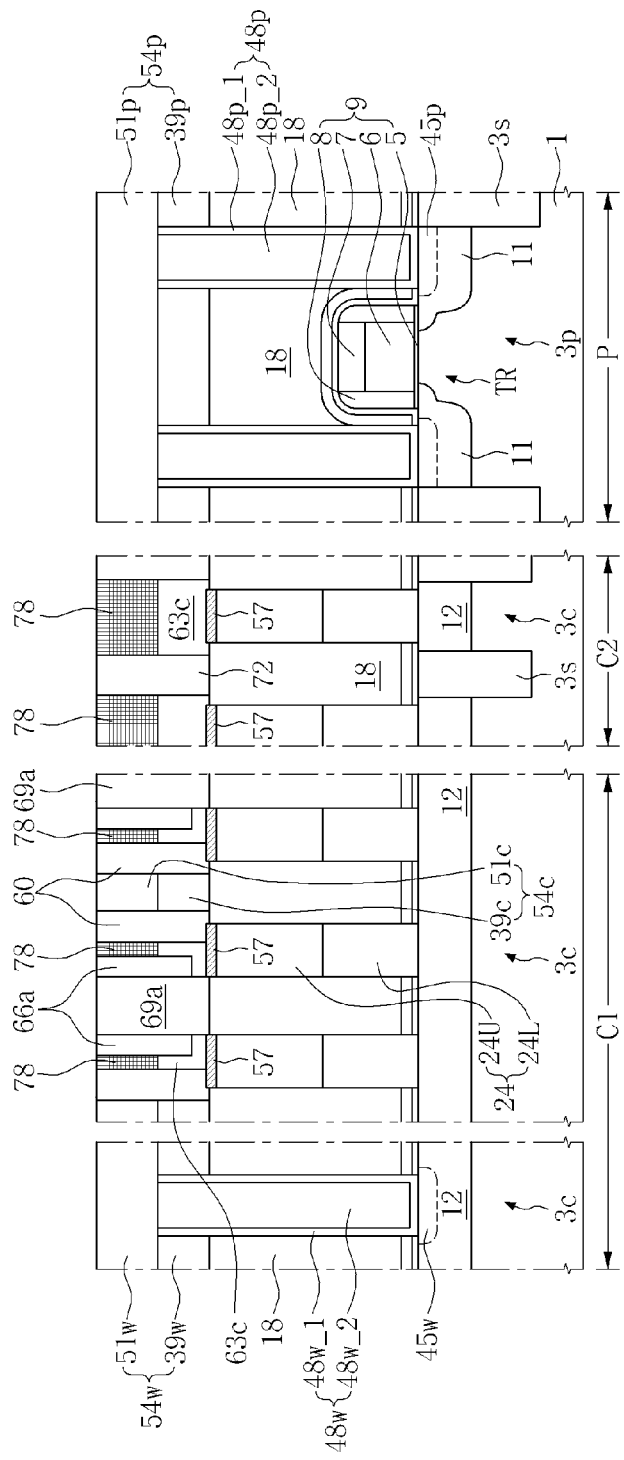

Referring to FIGS. 1 and 9S, data storage patterns 78 may be formed within the holes 75. The data storage patterns 78 may be directly connected to the lower electrodes 63c. The data storage patterns 78 may include a material layer for storage of information of the PCRAM. For example, the data storage patterns 78 may include a phase-changeable material having an amorphous phase with high resistivity and a crystalline phase with low resistivity according to heating temperature and heating time. For example, the data storage patterns may include a material including a chalcogenide compound, such as any material selected from the group consisting of GeSbTe, GeTeAs, SnTeSn, GeTe, SbTe, SeTeSn, GeTeSe, SbSeBi, GeBiTe, GeTeTi, InSe, GaTeSe, and InSbTe. Alternatively, the data storage patterns 78 may include a doped chalcogenide compound, for example, a material layer in which any element selected from C, Ni, Si, and O is contained in any material selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, a InSe layer, a GaTeSe layer, and a InSbTe layer.

The process of forming the data storage patterns 78 may include forming a material layer for data storage on the substrate including the holes 75, and planarizing the material layer until the upper surfaces of the first and second spacers 60 and 66a, the second separation patterns 72, the first and second insulating patterns 54c and 54w, and the peripheral insulating patterns 54p are exposed. The planarization may be performed using an etch back process and/or a CMP process.

Figure 9T:
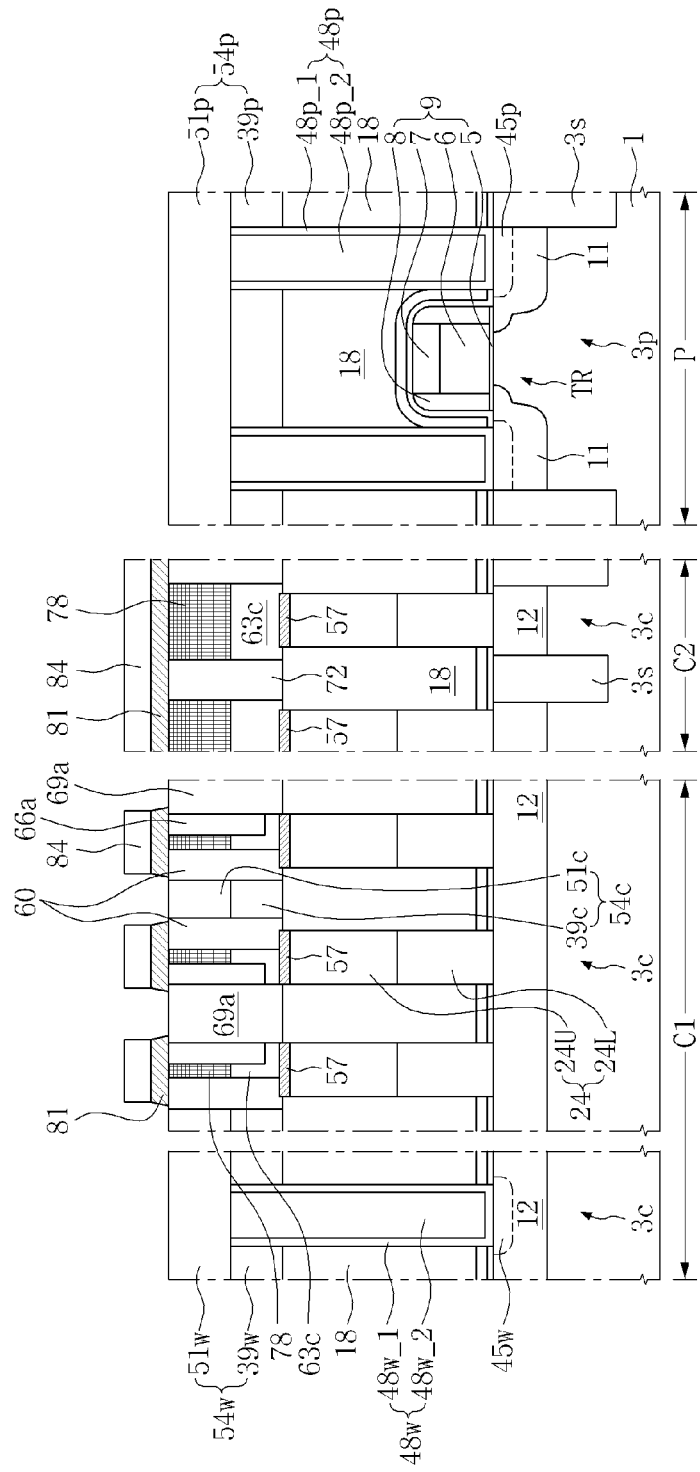

Referring to FIGS. 1 and 9T, an upper electrode layer may be formed on the substrate including the data storage patterns 78. Upper electrode capping patterns 84 may be formed on the upper electrode layer. The upper electrode layer may be etched using the upper electrode capping patterns 84 as an etch mask to form the upper electrodes 81. The upper electrodes 81 may be formed in line shapes crossing the word lines 12. The upper electrodes 81 may be formed on the data storage patterns 78. The upper electrodes 81 may be electrically connected to the data storage patterns 78.

Figure 9U:
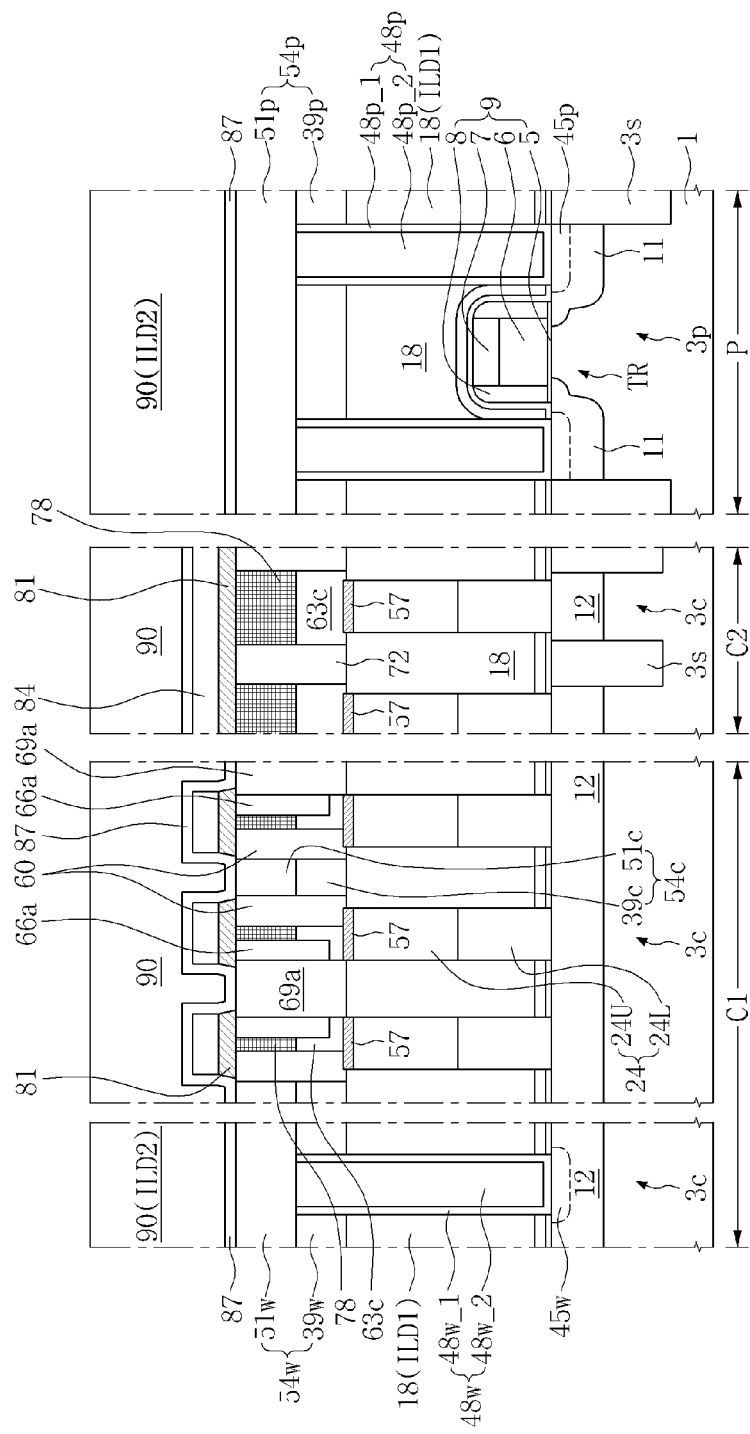

Referring to FIGS. 1 and 9U, an etch stop layer 87 may be formed on the substrate including the upper electrodes 81. An upper interlayer insulating layer 90 (ILD2) may be formed on the etch stop layer 87. The upper interlayer insulating layer 90 may be formed of an insulating material having an etch selectivity to the etch stop layer 87. For example, the etch stop layer 87 may be formed of silicon nitride, and the upper interlayer insulating layer 90 may be formed of silicon oxide or low-k dielectric.

Figure 9V:
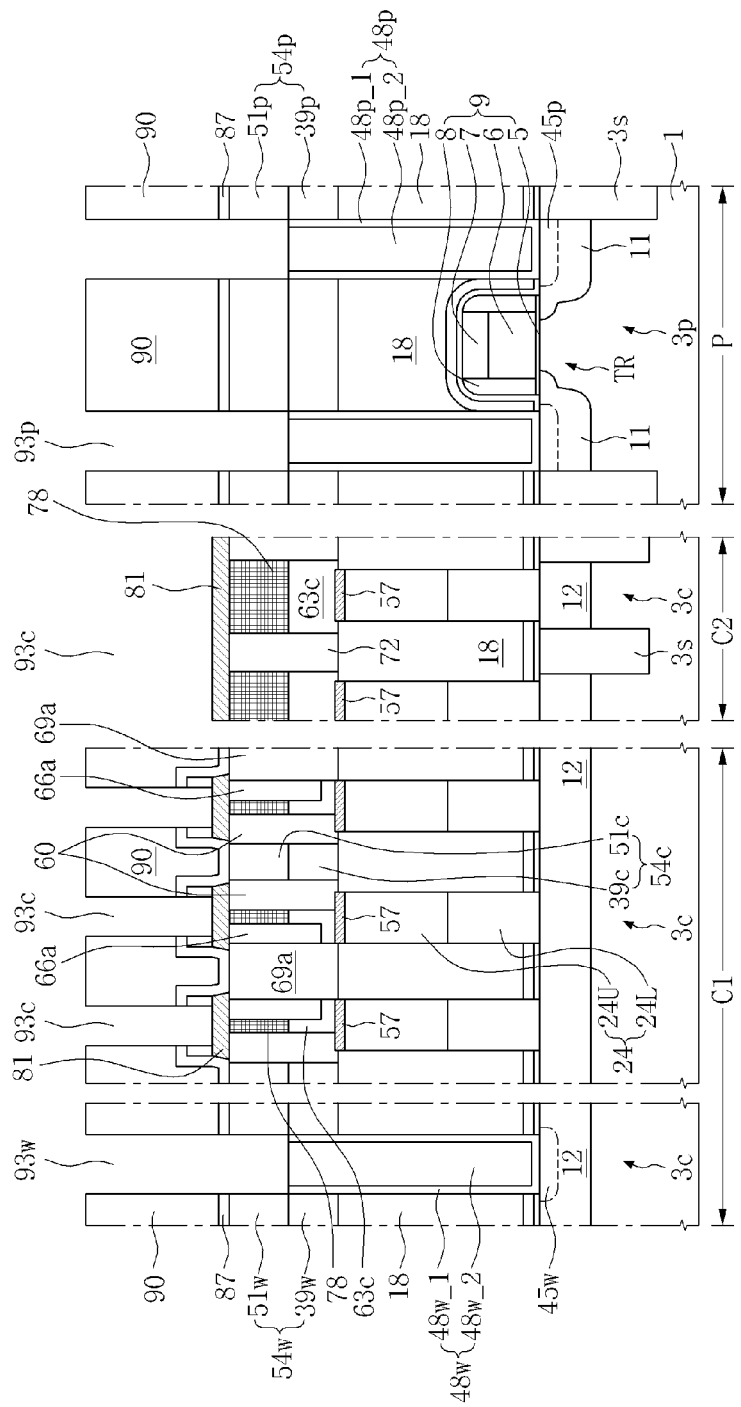
Figure 9W:
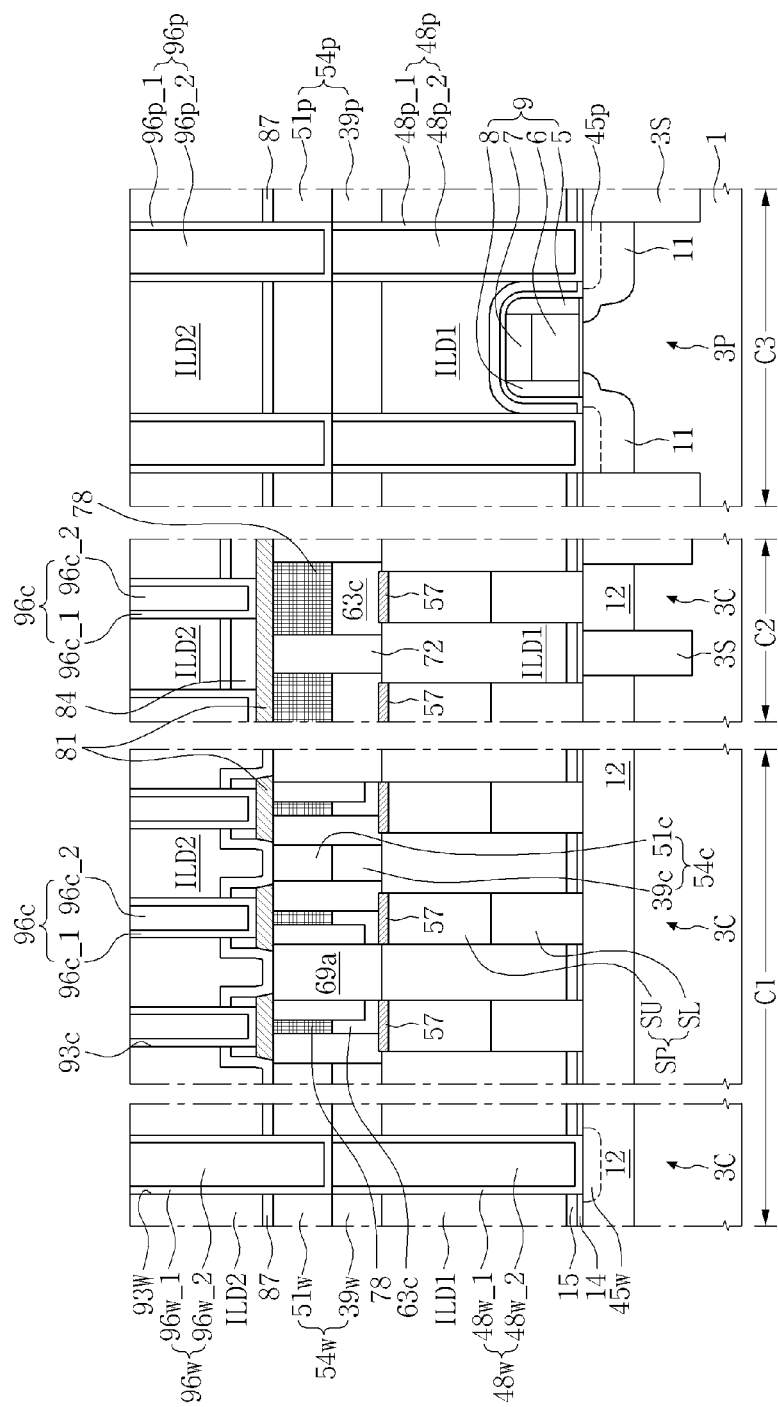

Referring to FIGS. 1 and 9V, first grooves 93c, which sequentially penetrate the upper interlayer insulating layer 90, the etch stop layer 87, and the upper electrode capping patterns 84 and expose the upper electrodes 81, second grooves 93w, which sequentially penetrate the upper interlayer insulating layer 90, the etch stop layer 87, and the second upper insulating pattern 51w and expose the word line contact structures 48w, and peripheral grooves 93p, which sequentially penetrate the upper interlayer insulating layer 90, the etch stop layer 87, and the peripheral upper insulating pattern 51p and expose the peripheral contact structures 48p, may be formed. Further, a gate groove, which sequentially penetrates the upper interlayer insulating layer 90, the etch stop layer 87, and the peripheral upper insulating pattern 51p and exposes the gate contact structure 48g, may be formed.

The first grooves 93c, which expose the upper electrodes 81, may have line shapes spaced apart from each other. The first grooves 93c may vertically overlap the data storage patterns 78, the second grooves 93w may vertically overlap the word line contact structure 48w, and the peripheral grooves 93p may vertically overlap the peripheral contact structures 48p.

Referring to FIGS. 1 and 9W, a first conductive material layer may be conformally formed on the substrate including the first grooves 93c, the second grooves 93w, the peripheral grooves 93p, and the gate groove, a second conductive material layer filling the first grooves 93c, the second grooves 93w, the peripheral grooves 93p, and the gate groove may be formed on the first conductive material layer, planarizing the first and second conductive material layers until the upper interlayer insulating layer 90 is exposed. Therefore, first conductive structures 96c including a first conductive material layer 96c_1 and a second conductive material layer 96c_2 remaining in the first grooves 93c may be formed, second conductive structures 96w including a first conductive material layer 96w_1 and a second conductive material layer 96w_2 remaining in the second grooves 93w may be formed, peripheral conductive structures 96p including a first conductive material layer 96p_1 and a second conductive material layer 96p_2 remaining in the peripheral grooves 93p may be formed, and a gate conductive structure 96g including the first conductive material layer and the second conductive material layer remaining in the gate groove may be formed.

The first conductive structures 96c formed in the cell array area CR may be electrically connected to the upper electrodes 81. The first conductive structures 96c may be bit lines of a memory device. The first conductive structures 96c may be formed in line shapes crossing the word lines 12.

The second conductive structures 96w may be electrically connected to the word line contact structures 48w. Therefore, the second conductive structures 96w may be electrically connected to the word lines 12 through the word line contact structures 48w.

The peripheral conductive structures 96p may be electrically connected to the peripheral contact structures 48p, and the gate conductive structure 96g may be electrically connected to the gate contact structure 48g.

Figure 10A:
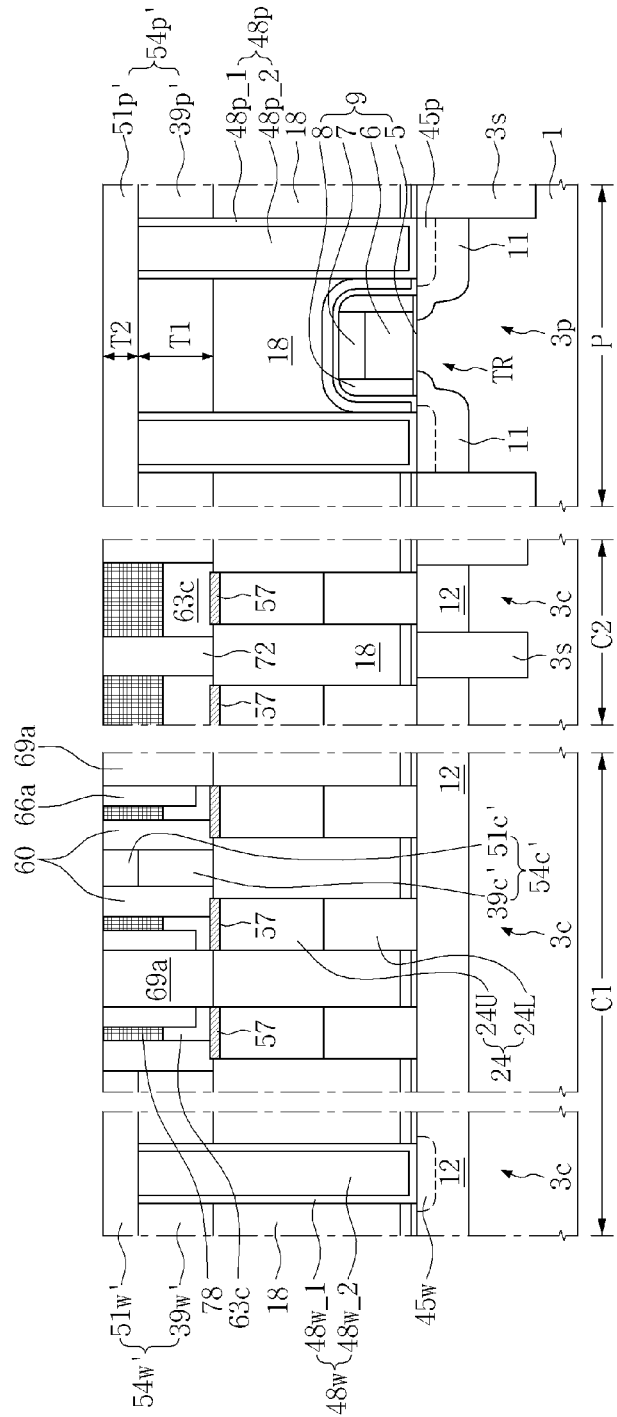
FIGS. 10A to 10C are cross-sectional views illustrating a method of fabricating a semiconductor device according to an example embodiment of inventive concepts.
Figure 10B:
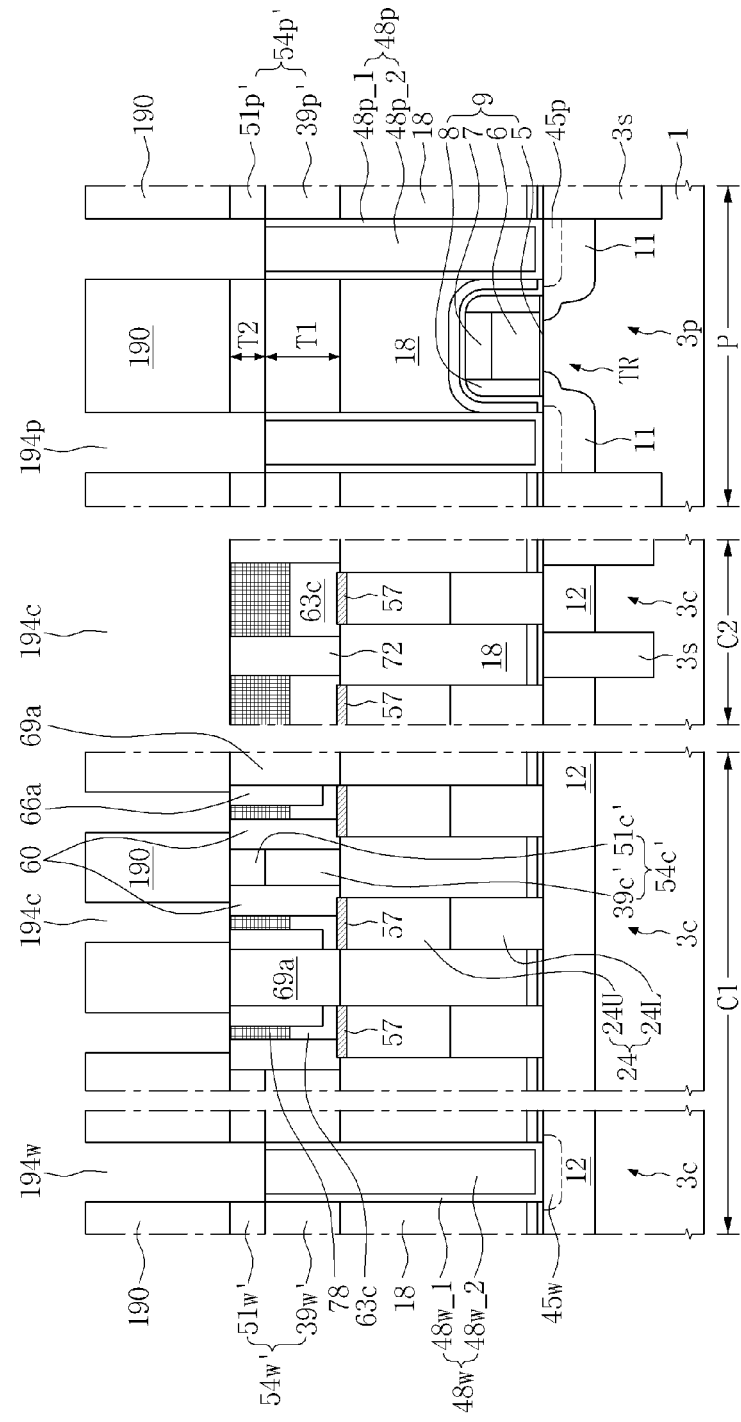
Figure 10C:
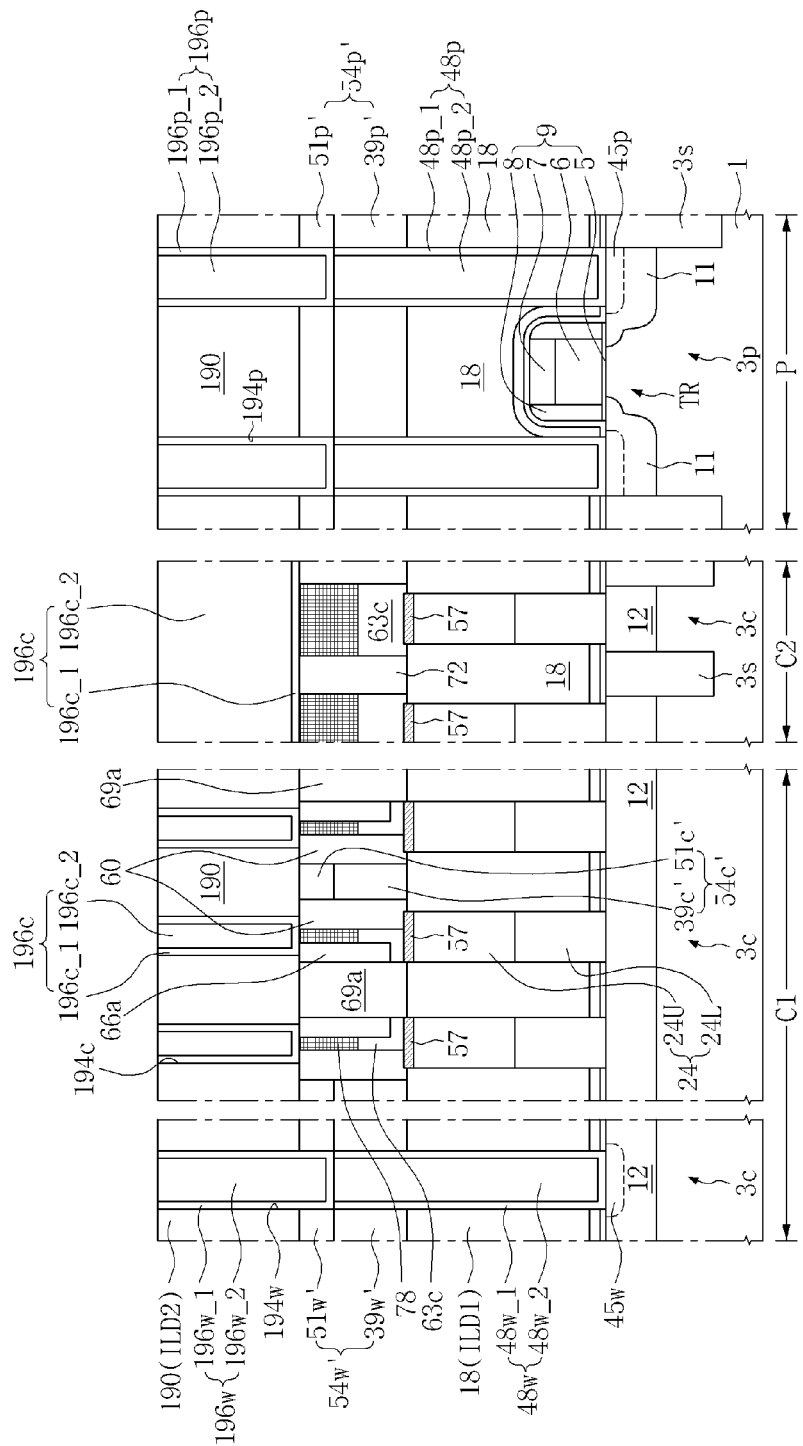

Hereinafter, a method of fabricating a semiconductor device according to some example embodiments of inventive concepts will be described with reference to FIGS. 10A to 10C. In FIGS. 10A to 10C, a portion indicated by "C1" shows a region taken along line I-I' of FIG. 1, a portion indicated by "C2" shows a region taken along line II-II' of FIG. 1, and a portion indicated by "P" shows a region taken along line III-III' of FIG. 1.

Referring to FIGS. 1 and 10A, a substrate fabricated by the method described in FIGS. 9A to 9S may be prepared. In some example embodiments, as described in FIG. 9I, the upper insulating layer 51 may have a vertical thickness smaller than that of the lower insulating layer 39. When the upper insulating layer 51 having the vertical thickness smaller than that of the lower insulating layer 39 is formed, first insulating patterns 54c', a second insulating pattern 54w', and a peripheral insulating pattern 54p' corresponding to the first insulating patterns 54c, the second insulating pattern 54w, and the peripheral insulating pattern 54p described in FIG. 9J, may be formed. Each of the first insulating patterns 54c'may include a sequentially stacked first upper insulating pattern 39c' and first upper insulating pattern 51c'. The second insulating pattern 54w' may include a sequentially stacked second lower insulating pattern 39w' and second upper insulating pattern 51w'. The peripheral insulating pattern 54p' may include a sequentially stacked peripheral lower insulating pattern 39p' and peripheral upper insulating pattern 51'.

The first lower insulating pattern 39c', the second lower insulating pattern 39w', and the peripheral lower insulating pattern 39p' may have a first vertical thickness T1 and the first upper insulating pattern 51c', the second upper insulating pattern 51w', and the peripheral upper insulating pattern 51p' may have a second vertical thickness T2 smaller than the first vertical thickness T1.

Meanwhile, as described in FIG. 9O, the first insulating patterns 54c', the second insulating pattern 54w', and the peripheral insulating pattern 54p', in which the vertical thicknesses are reduced by the planarization process such as a CMP process for planarizing the first separation layer (see 69 of FIG. 9N) to form the first separation patterns 39a, may be formed. As described above, in the first insulating patterns 54c', the second insulating pattern 54w', and the peripheral insulating pattern 54p' having the reduced vertical thickness, the first upper insulating patterns 51c', the second upper insulating pattern 51w', and the peripheral upper insulating pattern 51p' may have a vertical thickness smaller than that of the first lower insulating patterns 39c', the second lower insulating pattern 39w', and the peripheral lower insulating pattern 39p'.

Referring to FIGS. 1 and 10B, an upper interlayer insulating layer 190 may be formed on the substrate including the first insulating patterns 54c', the second insulating pattern 54w', the peripheral insulating pattern 54p', and the data storage patterns 78. The upper interlayer insulating layer 190 may be formed of silicon oxide or low-k dielectric.

First grooves 194c, which penetrate the upper interlayer insulating layer 190 and expose the data storage patterns 78, second grooves 194w, which penetrate the upper interlayer insulating layer 190 and the second upper insulating pattern 51w' and expose the word line contact structures 48w, and peripheral grooves 194p, which penetrate the upper interlayer insulating layer 190 and the peripheral upper insulating pattern 51p' and expose the peripheral contact structures 48p, may be formed. Further, a gate groove, which penetrates the upper interlayer insulating layer 190 and the peripheral upper insulating pattern 51p' and exposes the gate contact structure 48g, may be formed.

Since the second upper insulating pattern 51w' and the peripheral upper insulating pattern 51p', which are penetrated by the second grooves 194w, the peripheral grooves 194p, and the gate grooves, may have a vertical thickness smaller than that of the second lower insulating pattern 39w' and the peripheral lower insulating pattern 39p', a height difference between bottoms of the second groove 194w, the peripheral grooves 194p, and the gate groove and bottoms of the first grooves 194c can be minimized.

In some example embodiments, the first upper insulating pattern 51c', the second upper insulating pattern 51w', and the peripheral upper insulating pattern 51p' may include a material having a different etch selectivity from the first and second spacers 60 and 66a and the first and second separation patterns 69a and 72 surrounding sides of the data storage patterns 78. For example, the first upper insulating pattern 51c', the second upper insulating pattern 51w', and the peripheral upper insulating pattern 51p' may be formed of silicon oxide, and the first and second spacers 60 and 66a and the first and second separation patterns 69a and 72 may be formed of silicon nitride. The upper interlayer insulating layer 190 may include a material having a different etch selectivity from the first and second spacers 60 and 66a and the first and second separation patterns 69a and 72. For example, the upper interlayer insulating layer 190 may be formed of silicon oxide, and the first and second spacers 60 and 66a and the first and second separation patterns 69a and 72 may be formed of silicon nitride. Therefore, after the upper interlayer insulating layer 190 is patterned to form the first grooves 194c, which penetrate the upper interlayer insulating layer 190 and simultaneously form portions of the second grooves 194w, peripheral grooves 194p, and the gate groove, the second upper insulating pattern 51w' and the peripheral upper insulating pattern 51p' may be selectively etched to form the final second grooves 194w, the final peripheral grooves 194p, and the final gate groove.

Referring to FIGS. 1 and 10C, first conductive structures 196c, second conductive structures 196w, peripheral conductive structures 196p, and a gate conductive structure 196g may be formed in the first grooves 194c, the second grooves 194w, the peripheral grooves 194p, and the gate groove, respectively.

The forming the first conductive structures 196c, the second conductive structures 196w, the peripheral conductive structures 196p, and the gate conductive structure 196g may include conformally forming a first conductive material layer on the substrate including the first grooves 194c, the second grooves 194w, the peripheral grooves 194p, and the gate groove, forming a second conductive material layer to be filled in the first grooves 194c, the second grooves 194w, the peripheral grooves 194p, and the gate groove on the first conductive material layer, and planarizing the first and second conductive material layers until the upper interlayer insulating layer 190 is exposed. Therefore, the first conductive structures 196c including first conductive material layers 196c_1 and second conductive material layers 196c_2 remaining within the first grooves 194c may be formed, the second conductive structures 196w including first conductive material layers 196w_1 and second conductive material layers 196w_2 remaining within the second grooves 194w may be formed, the peripheral conductive structures 196p including first conductive material layers 196p_1 and second conductive material layers 196p_2 remaining within the peripheral grooves 194p may be formed, and the gate conductive structure 196g including the first conductive material layer and the second conductive material layer remaining within the gate groove may be formed.

The first conductive structures 196c may be upper electrodes and bit lines of a memory device. For example, each of the first conductive structures 196c may include the first conductive material layer 196c_1 which may be used as the upper electrode of the memory device, and the second conductive material layer 196c_2 which may be used as the bit line of the memory device.

The second upper insulating pattern 51w' and the peripheral upper insulating pattern 51p' may have a vertical thickness smaller than that of the second lower insulating pattern 39w' and the peripheral lower insulating pattern 39p'. Further, the first and second spacers 60 and 66a and the first and second separation patterns 69a and 72 surrounding sides of the data storage patterns 78 may include a material having a different etch selectivity from the upper interlayer insulating layer 190, the second lower insulating pattern 39w' and the peripheral lower insulating pattern 39p'. Therefore, while forming the first grooves 194c, the second grooves 194w, the peripheral grooves 194p, and the gate groove, etching of the first and second spacers 60 and 66a and the first and second separation patterns 69a and 72 surrounding the sides of the data storage patterns 78 can be prevented or minimized. Therefore, failure such as malfunction of the memory device which can occur by narrowing the distance spaced between the first conductive patterns 196c and the lower electrode 63c.

Next, a method of fabricating a semiconductor device according to some example embodiments of inventive concepts will be described with reference to FIGS. 11A to 11I. In FIGS. 11A to 11I, a portion indicated by "C1" shows a region taken along line I-I' of FIG. 1, a portion indicated by "C2" shows a region taken along line II-II' of FIG. 1, and a portion indicated by "P" shows a region taken along line III-III' of FIG. 1.

Figure 11A:
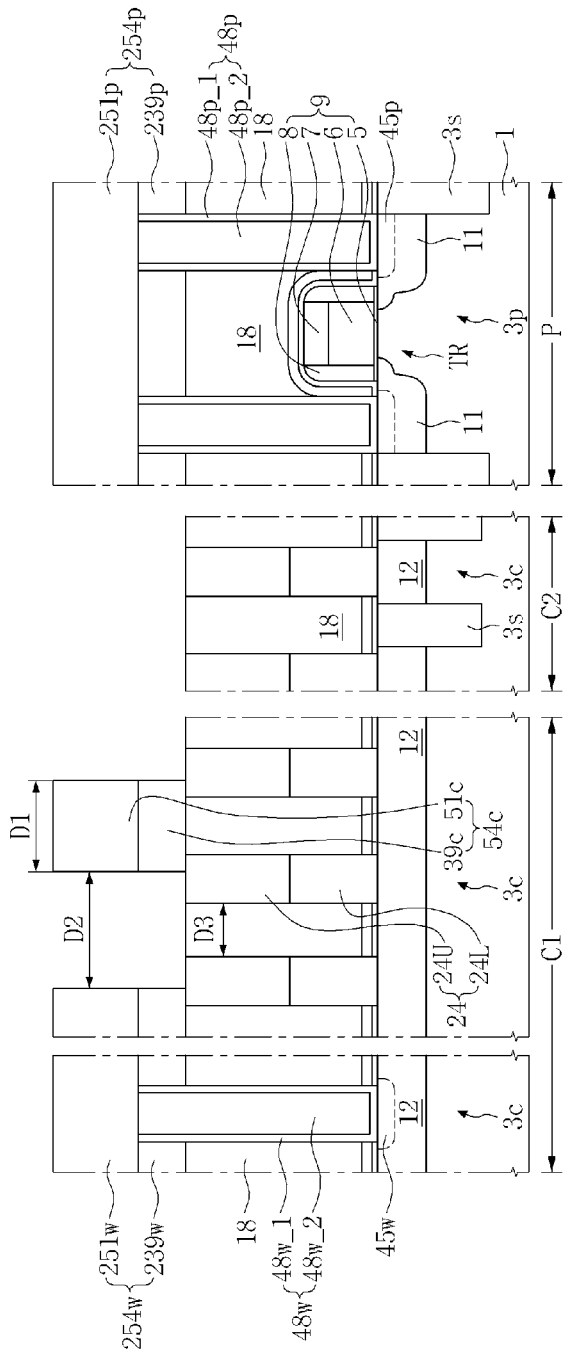
FIGS. 11A to 11I are cross-sectional views illustrating a method of fabricating a semiconductor device according to another example embodiment of inventive concepts.

Referring to FIGS. 1 and 11A, a substrate fabricated by the method described with reference to FIGS. 9A to 9I may be prepared. Therefore, the substrate, in which the upper insulating layer 51 has been formed as described in FIG. 9I, may be prepared. The upper insulating layer 51 and the lower insulating layer 39 are patterned to form insulating patterns which expose portions of the semiconductor pattern 24 and cover the word line contact structures 48w, the peripheral contact structures 48p, and the gate contact structure 48g. The insulating patterns may include first insulating patterns 254c, a second insulating pattern 254w, and a peripheral insulating pattern 254p.

The first insulating patterns 254c may be disposed between the semiconductor patterns 24 in a cell array area CR and have portions overlapping portions of the semiconductor patterns 24. Each of the first insulating patterns 254c may include a sequentially stacked first lower insulating pattern 239c and first upper insulating pattern 251c. The first insulating patterns 254c may have line shapes spaced apart from each other. Each of the first insulating patterns 254c may have a width D1 greater than a distance D3 spaced between the semiconductor patterns 24 adjacent to each other. A distance D2 spaced between the first insulating patterns 254c may be greater than the distance D3 spaced between the semiconductor patterns 24 adjacent to each other. The first insulating patterns 254c may be disposed on the lower interlayer insulating layer 18 between the semiconductor patterns 24 adjacent to each other and may extend onto the semiconductor patterns 24 adjacent to each other to partially cover the semiconductor patterns 24.

The second insulating pattern 254w may be formed on the word line contact structures 48w. The second insulating pattern 254w may include a sequentially stacked second lower insulating pattern 239w and second upper insulating pattern 251w. The second lower insulating pattern 239w may be formed on sides of the word line contact structures 48w, and the second upper insulating pattern 251w may cover upper surfaces of the word line contact structures 48w and an upper surface of the second lower insulating pattern 239w.

The peripheral insulating pattern 254p may be disposed in a peripheral circuit area PR and formed on the peripheral contact structures 48p and the gate contact structure 48g. The peripheral insulating pattern 254p may include a sequentially stacked peripheral lower insulating pattern 239p and peripheral upper insulating pattern 251p. The peripheral lower insulating pattern 239p may be formed on sides of the peripheral contact structures 48p and a side of the gate contact structure 48g. The peripheral upper insulating pattern 251p may cover upper surfaces of the peripheral contact structures 48p and an upper surface of the gate contact structure 48g, and cover an upper surface of the peripheral lower insulating pattern 239p.

Figure 11B:
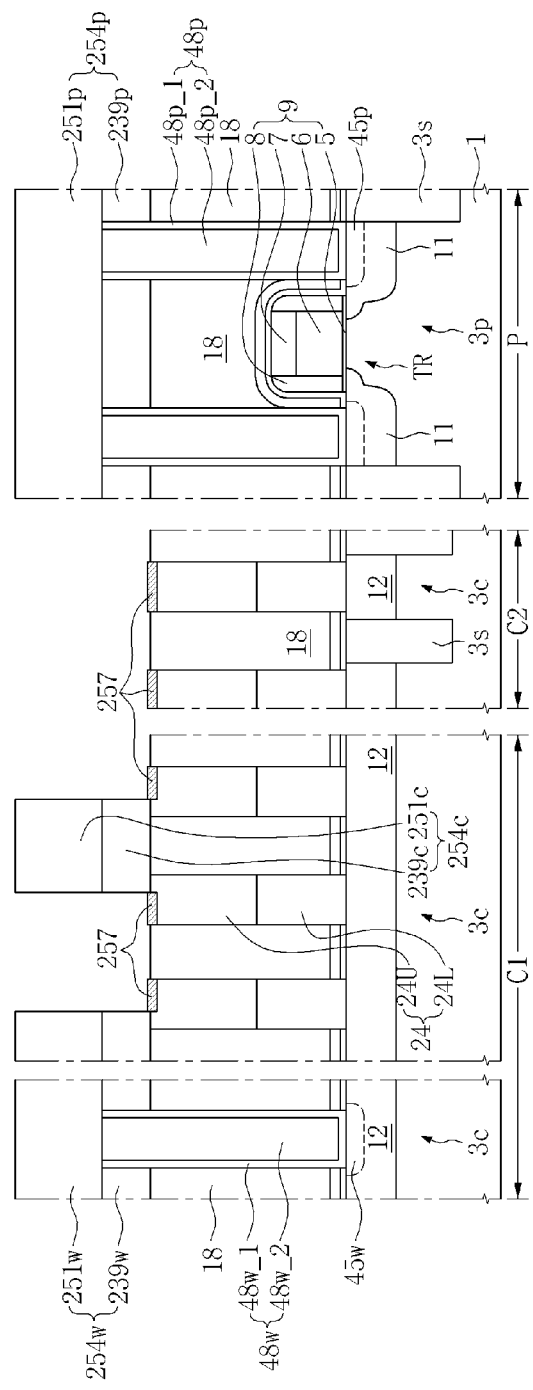

Referring to FIGS. 1 and 11B, metal-semiconductor compounds 257 may be formed on the exposed portions of the semiconductor patterns 24. A portion of an upper surface of each of the semiconductor patterns 24 may be covered by each of the first insulating patterns 254c, and the remaining portion of the upper surface may be exposed. Therefore, the metal-semiconductor compounds 257 may be formed on the exposed portions of the upper surfaces of the semiconductor patterns 24. The metal-semiconductor compounds 257 may be formed on the semiconductor patterns 24 at both sides of the first insulating patterns 254c.

The metal-semiconductor compounds 257 may have a plane area smaller than that of the upper surfaces of the semiconductor patterns 24. The metal-semiconductor compounds 257 may have a width smaller than that of the semiconductor patterns 24.

Figure 11C:
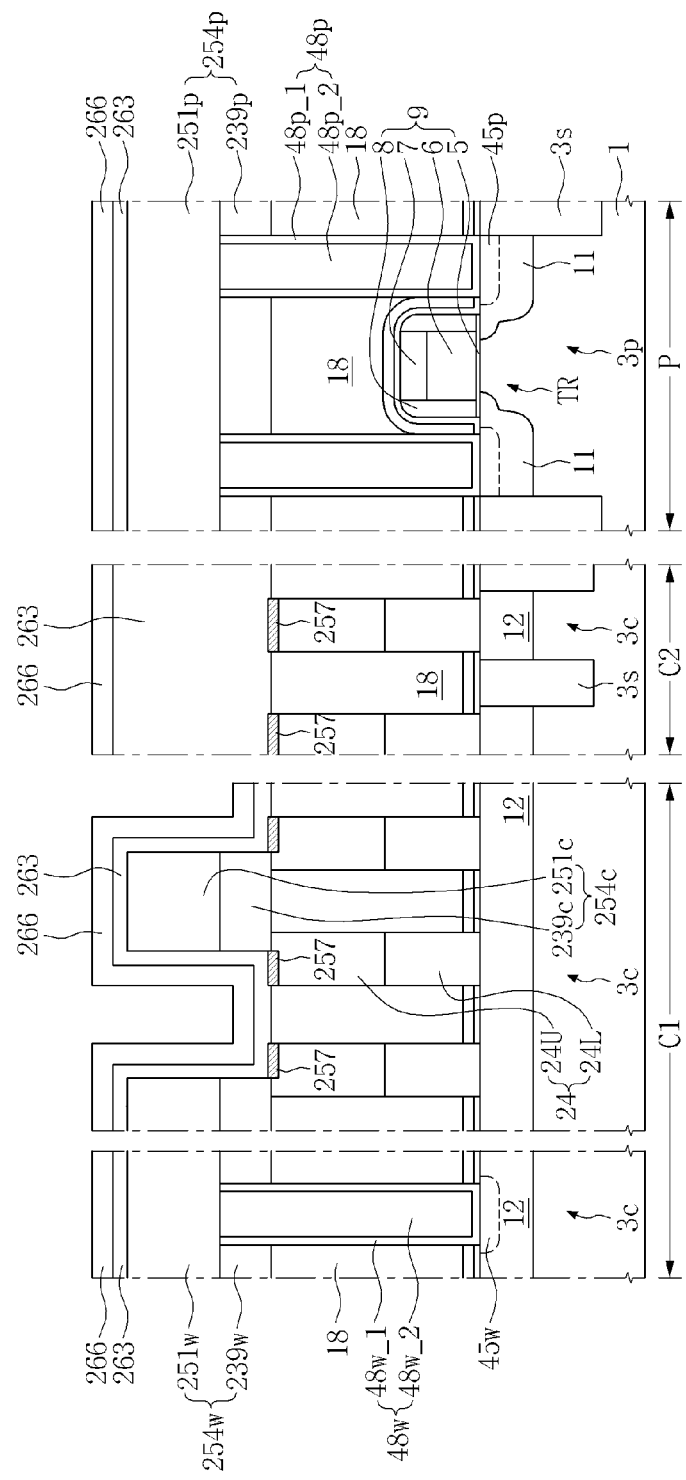

Referring to FIGS. 1 and 11C, a conductive lower electrode layer 263 may be conformally formed on the substrate including the metal-semiconductor compounds 257. The insulating spacer layer 266 may be conformally formed on the lower electrode layer 263.

Figure 11D:
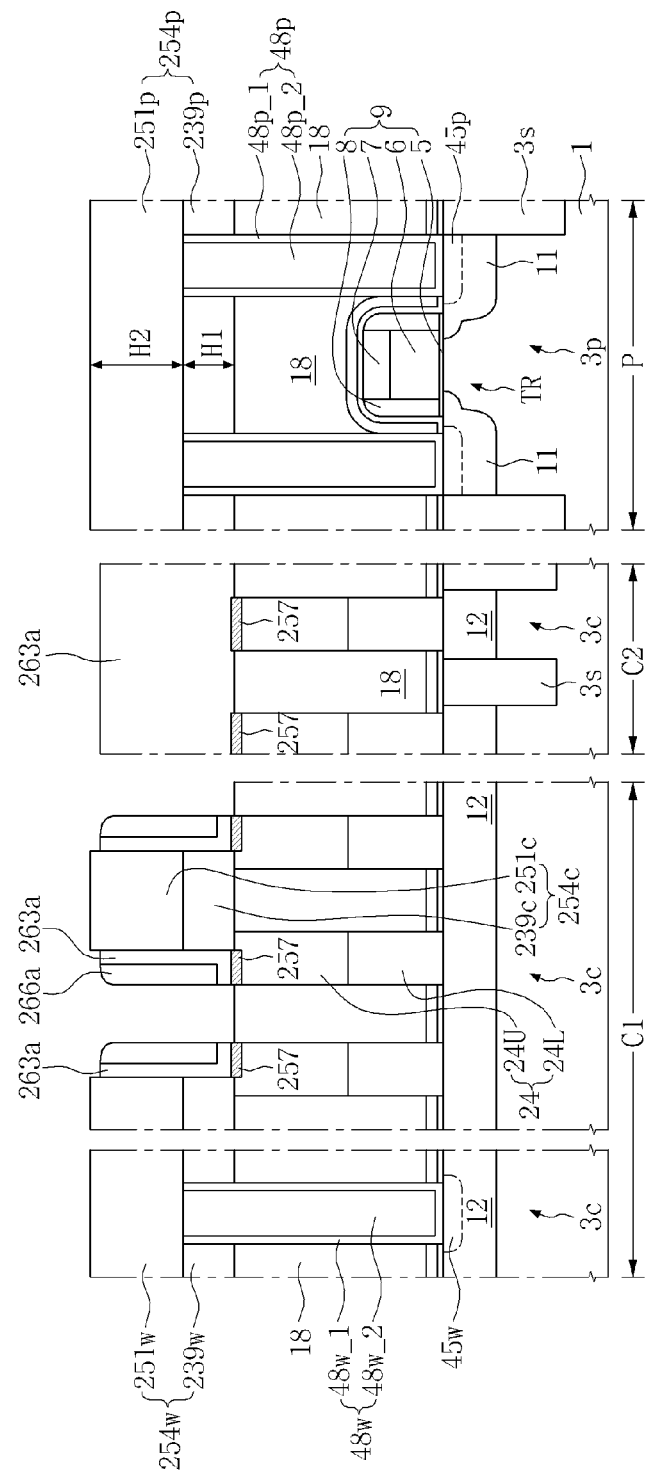

Referring to FIGS. 1 and 11D, the spacer layer 266 and the lower electrode layer 263 may be anisotropically etched to form spacers 263a and lower electrode lines 266a. The spacers 263a and the lower electrode lines 266a may be formed on the sides of the first insulating patterns 254c. Each of the lower electrode lines 266a may overlap a portion of each of the semiconductor patterns 24. Therefore, each of the semiconductor patterns 24 may include a portion vertically overlapping each of the lower electrode lines 266a, and a second portion vertically overlapping each of the first insulating patterns 254c.

Figure 11E:
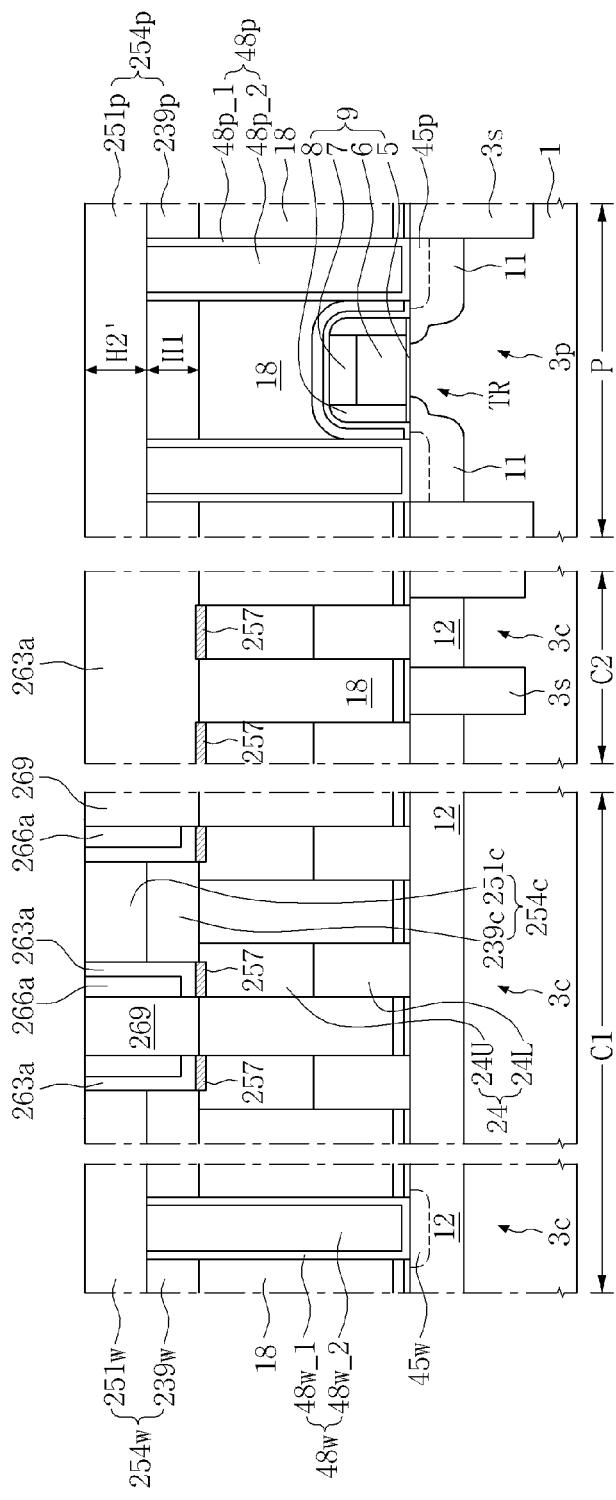

Referring to FIGS. 1 and 11E, an insulating first separation layer may be formed on the substrate including the spacers 263a and the lower electrode lines 266a and then planarized until the first and second insulating patterns 254c and 254w and the peripheral insulating patterns 254p are exposed to form first separation patterns 269. The first separation patterns 269 may be formed in line shapes. The first separation patterns 269 may be formed of an insulating material such as silicon oxide or silicon nitride. The process of forming the separation patterns 269 may include planarizing the first separation layer using a planarization process such as a CMP process.

While planarizing the first separation layer using the planarization process such as a CMP process to form the first separation patterns 269, vertical thicknesses of the first insulating patterns 254c, the second insulating patterns 254w, and the peripheral insulating patterns 254p can be reduced by the planarization process. Each of the first insulating patterns 254c may include a sequentially stacked first lower insulating pattern 239c and thickness-reduced upper insulating pattern 251c, the second insulating pattern 254w may include a sequentially stacked second lower insulating pattern 239w and thickness-reduced upper insulating pattern 251w, and the peripheral insulating pattern 254p may include a sequentially stacked peripheral lower insulating pattern 239p and thickness-reduced peripheral upper insulating pattern 251p. For example, the vertical thickness (H2 of FIG. 11C) of the first upper insulating patterns 251c, the second upper insulating pattern 251w, and the peripheral upper insulating pattern 251p formed before the planarization process is performed, may be greater than a vertical thickness H2' of the thickness-reduced first upper insulating patterns 251c, the thickness-reduced second upper insulating pattern 251w, and the thickness-reduced peripheral upper insulating pattern 251p formed after the planarization process is performed. A vertical thickness H1 of the first lower insulating patterns 239c, the second lower insulating pattern 239w, and the peripheral lower insulating pattern 239p after the planarization process, may be equal to the vertical thickness H1 of the first lower insulating patterns 239c, the second lower insulating pattern 239w, and the peripheral lower insulating pattern 239p before the planarization.

In some example embodiments, the vertical thickness H2' of the thickness-reduced first upper insulating patterns 251c, the thickness-reduced second upper insulating patterns 251w, and the thickness-reduced peripheral upper insulating pattern 251p may be smaller than the vertical thickness H1 of the first lower insulating patterns 239c, the second lower insulating pattern 239w, and the peripheral lower insulating pattern 239p.

In another example embodiment, the thickness-reduced first upper insulating patterns 251c, the thickness-reduced second upper insulating patterns 251w, and the thickness-reduced peripheral upper insulating pattern 251p may have a vertical thickness equal to or greater than that of the first lower insulating patterns 239c, the second lower insulating pattern 239w, and the peripheral lower insulating pattern 239p.

Figure 11F:
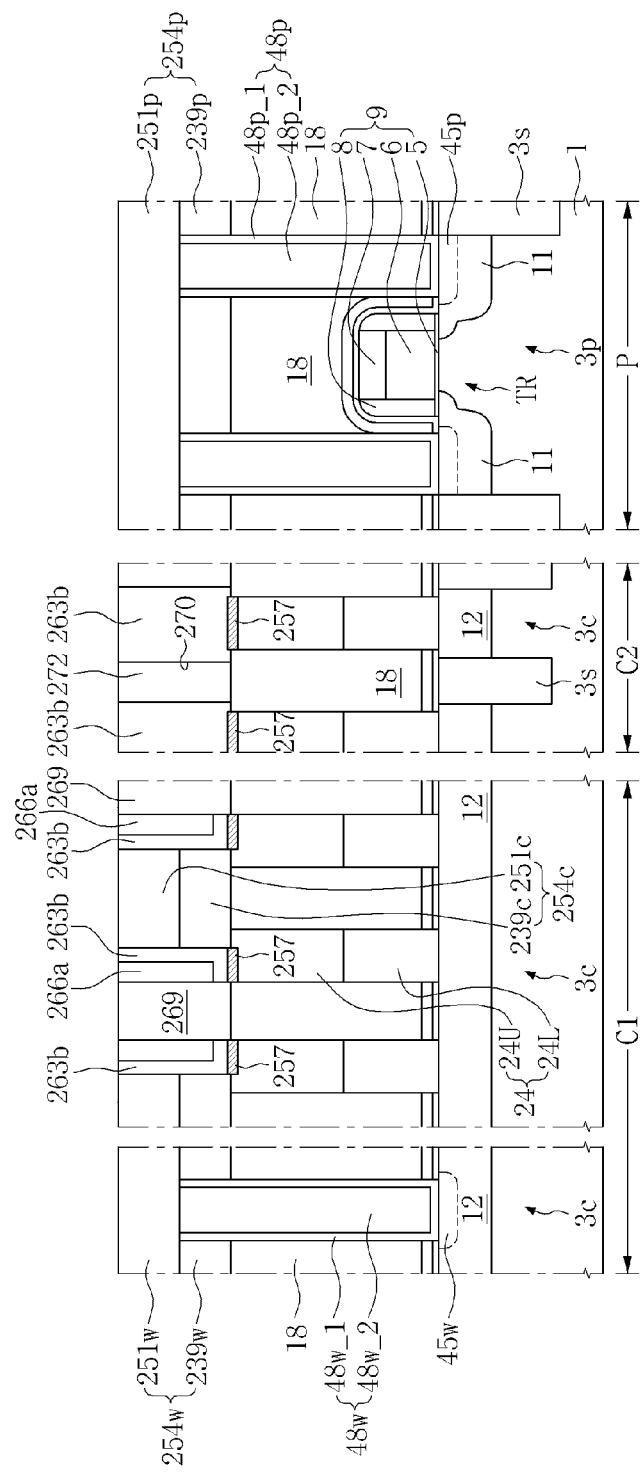

Referring to FIGS. 1 and 11F, trenches 270 for cutting the lower electrode lines 263a may be formed. The lower electrode lines 263b cut by the trenches 270 may be formed on the metal-semiconductor compounds 257. The cut lower electrode lines 263b may be referred to as lower electrode patterns.

The trenches 270 may be formed by patterning the lower electrode lines 263a and the spacers 266a. While patterning the lower electrode lines 263a and the spacers 266a, the first insulating patterns 254c and the first separation patterns 269 may also be patterned. The trenches 270 may be formed in line shapes spaced apart from each other. The trenches 270 may be formed in the line spaces crossing the first insulating patterns 254c. Therefore, a plurality of lower electrode patterns 263b may be spaced apart from each other between the trenches 270. The first insulating patterns 254c, the spacers 266a, and the first separation patterns 269 may be formed from the line shape into an island shape by the line-shaped trenches 270.

Second separation patterns 272 filling the trenches 270 may be formed. The second separation patterns 272 may be formed of an insulating material such as silicon oxide or silicon nitride. A plurality of lower electrode patterns 263b may be disposed to be spaced apart from each other between the second separation patterns 272 adjacent to each other. The first insulating patterns 254c cut by the trenches 270, the spacers 266a, and the first separation patterns 269 may be disposed between the second separation patterns 272 adjacent to each other and between the lower electrode patterns 263b adjacent to each other.

Figure 11G:
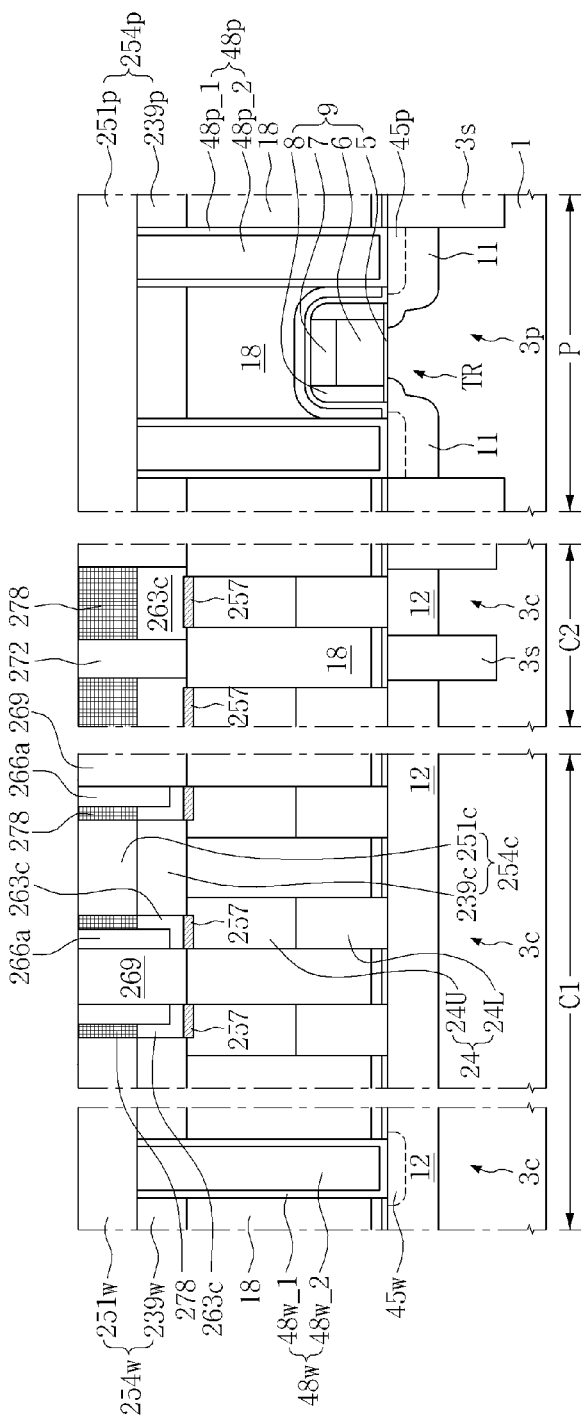

Referring to FIGS. 1 and 11G, as described in FIG. 9R, to lower the upper surfaces of the lower electrode patterns 263b, the lower electrode patterns 263b may be selectively partially etched to form lower electrodes 263c. Subsequently, as described in FIG. 9S, data storage patterns 278 may be formed in empty spaces or holes from which the lower electrode patterns 263b are partially etched and removed.

Figure 11H:
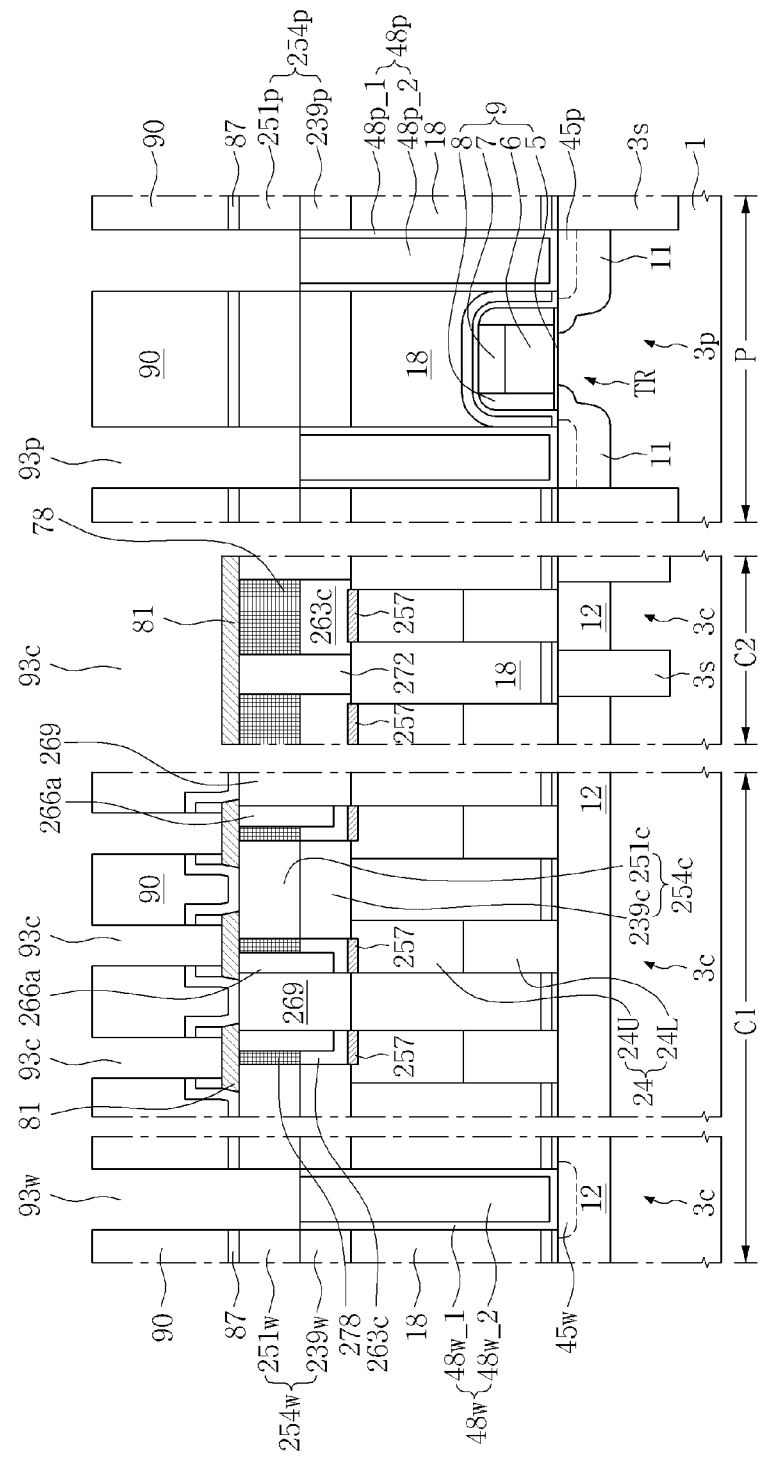

Referring to FIGS. 1 and 11H, as described in FIG. 9T, conductive upper electrodes 81 and insulating upper electrode capping patterns 84 sequentially stacked on the substrate including the data storage patterns 278 may be formed. The upper electrodes 81 and the upper electrode capping patterns 84 may have line shapes crossing word lines 12. As described in FIG. 9U, an etch stop layer 87 and an upper interlayer insulating layer 90 may be formed on the substrate including the upper electrodes 81 and the upper electrode capping patterns 84.

First grooves 93c, which sequentially penetrate the upper interlayer insulating layer 90, the etch stop layer 87, and the upper electrode capping patterns 84 and expose the upper electrodes 81, second grooves 93w, which sequentially penetrate the upper interlayer insulating layer 90, the etch stop layer 87, and the second upper insulating pattern 51w and expose the word line contact structures 48w, and peripheral grooves 93p, which sequentially penetrate the upper interlayer insulating layer 90, the etch stop layer 87, and the peripheral upper insulating pattern 51p and expose the peripheral contact structures 48p, may be formed. Further, a gate groove, which sequentially penetrates the upper interlayer insulating layer 90, the etch stop layer 87, and the peripheral upper insulating pattern 51p and exposes the gate contact structure 48g, may be formed.

Figure 11I:
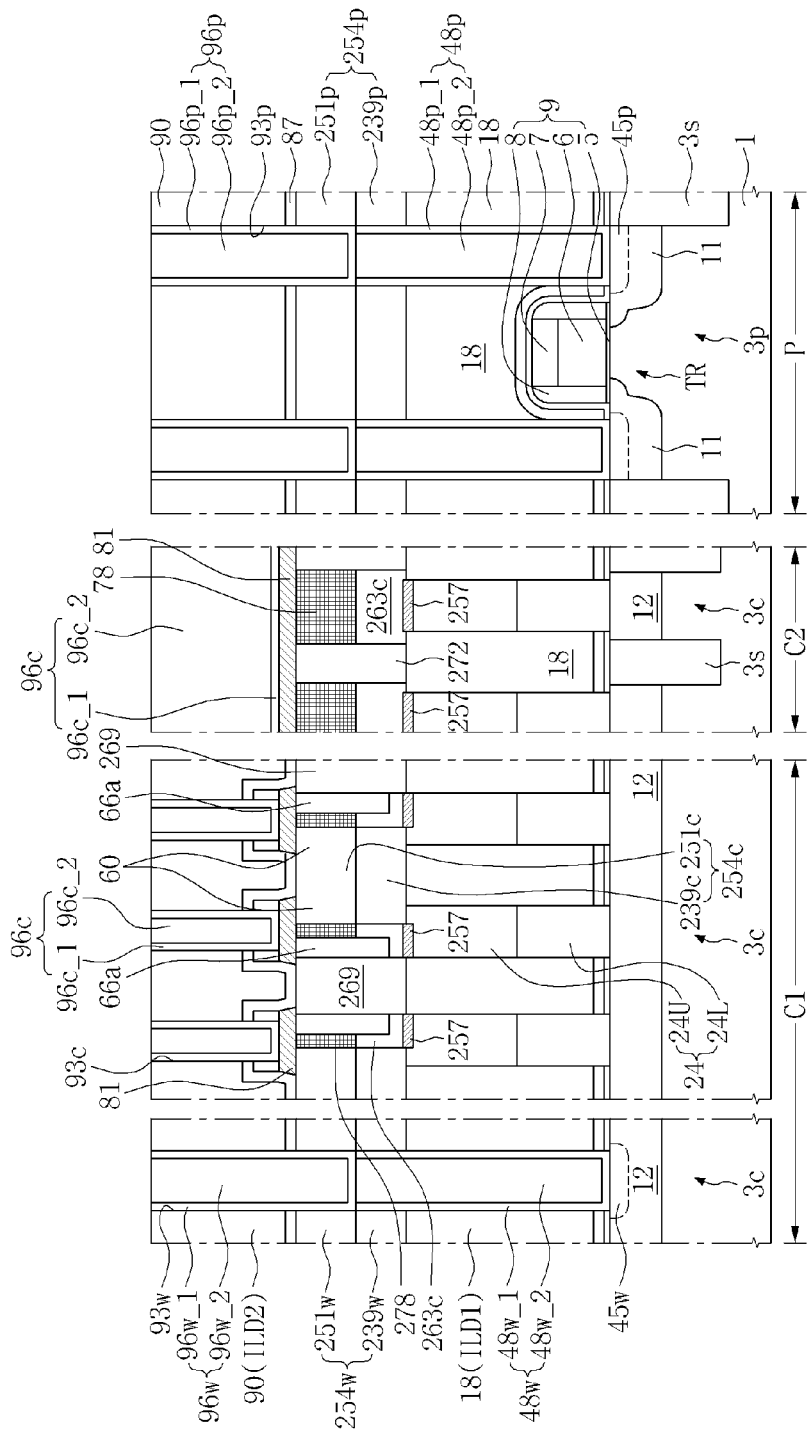

Referring to FIGS. 1 and 11I, as described in FIG. 9W, first conductive structures 96c may be formed in the first grooves 93c, the second conductive structures 96w may be formed in the second grooves 93w, peripheral conductive structures 96p may be formed in the peripheral grooves 93p, and a gate conductive structure 96g may be formed in the gate groove.

Figure 12A:
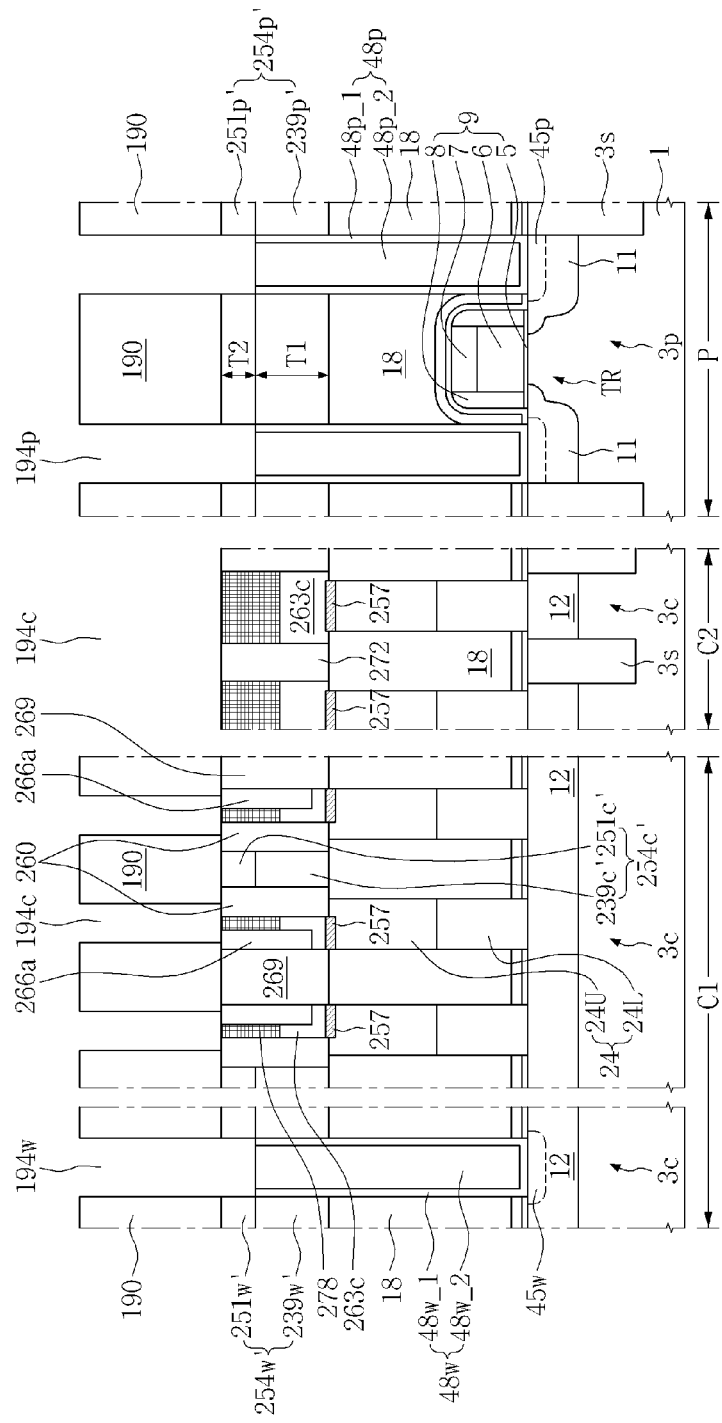
FIGS. 12A and 12B are cross-sectional views illustrating a method of fabricating a semiconductor device according to another example embodiment of inventive concepts.
Figure 12B:
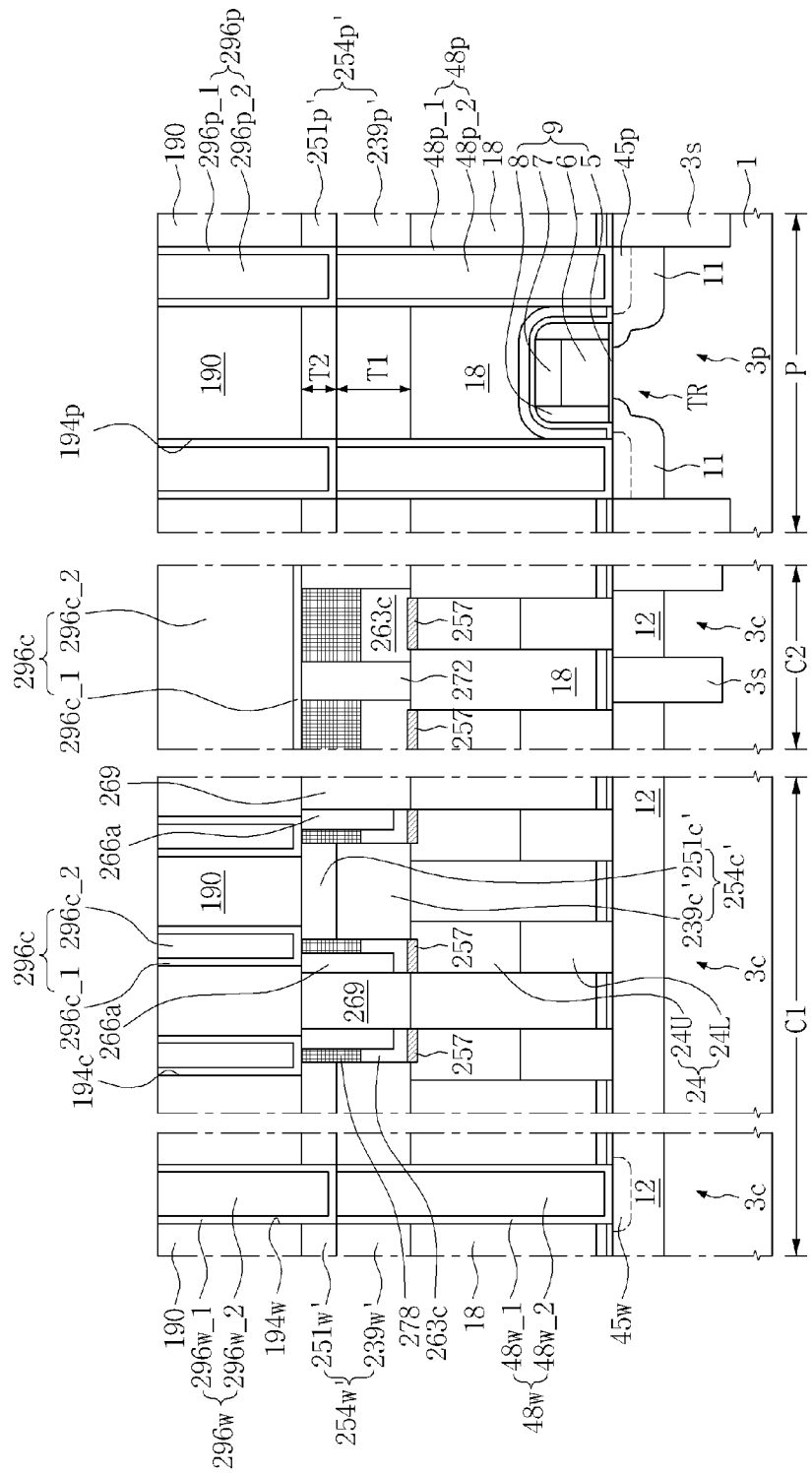

Hereinafter, a method of fabricating a semiconductor device according to some example embodiments of inventive concepts will be described with reference to FIGS. 12A and 12B. In FIGS. 12A and 12B, a portion indicated by "C1" shows a region taken along line I-I' of FIG. 1, a portion indicated by "C2" shows a region taken along line II-II' of FIG. 1, and a portion indicated by "P" shows a region taken along line III-III' of FIG. 1.

Referring to FIGS. 1 and 12A, a substrate fabricated by the method described with reference to FIGS. 11A to 11G may be prepared. As described in FIG. 11E, in some example embodiments, the first upper insulating patterns 251c, the second upper insulating pattern 251w, and the peripheral upper insulating pattern 251p may have the vertical thickness smaller than that of the first lower insulating patterns 239c, the second lower insulating pattern 239w, and the peripheral lower insulating pattern 239p. Therefore, first insulating patterns 254c' including sequentially first lower insulating patterns 239c' and vertical thickness-reduced first upper insulating patterns 251c', a second insulating pattern 254w' including a sequentially stacked second lower insulating pattern 239w' and vertical thickness-reduced second upper insulating pattern 251w', and a peripheral insulating pattern 254p' including a sequentially stacked peripheral lower insulating pattern 239p' and vertical thickness-reduced peripheral upper insulating pattern 251p' may be provided. The first lower insulating patterns 239c', the second lower insulating pattern 239w', and the peripheral lower insulating pattern 239p' may have a first vertical thickness T1. The first upper insulating patterns 251c', the second upper insulating pattern 251w', and the peripheral upper insulating pattern 251p' may have a second vertical thickness T2 smaller than the first vertical thickness T1.

As described in FIG. 11G, an upper interlayer insulating layer 190 may be formed on the substrate including the data storage patterns 278. First grooves 194c, which sequentially penetrate the upper interlayer insulating layer 190 and expose the data storage patterns 278, second grooves 194w, which sequentially penetrate the upper interlayer insulating layer 190 and the second upper insulating pattern 251w' and expose the word line contact structures 48w, and peripheral grooves 194p, which sequentially penetrate the upper interlayer insulating layer 190 and the peripheral upper insulating pattern 251p' and expose the peripheral contact structures 48p, may be formed. Further, a gate groove, which sequentially penetrates the upper interlayer insulating layer 190 and the peripheral upper insulating pattern 251p' and exposes the gate contact structure 48g, may be formed.

Referring to FIGS. 1 and 12B, a first conductive material layer may be conformally formed on the substrate including the first grooves 194c, the second grooves 194w, the peripheral grooves 194p, and the gate groove on the first conductive material, and a second conductive material layer may be filled in the first grooves 194c, the second grooves 194w, the peripheral grooves 194p, and the gate groove, and the first and second conductive material layers may be planarized until the upper interlayer insulating layer 190 is exposed.

Therefore, the first conductive structures 296c including first conductive material layers 296c_1 and second conductive material layers 296c_2 remaining within the first grooves 194c may be formed, the second conductive structures 296w including first conductive material layers 296w_1 and second conductive material layers 296w_2 remaining within the second grooves 194w may be formed, the peripheral conductive structures 296p including first conductive material layers 296p_1 and second conductive material layers 296p_2 remaining within the peripheral grooves 194p may be formed, and the gate conductive structure 196g including the first conductive material layer and the second conductive material layer remaining within the gate groove may be formed According to some example embodiments of inventive concepts, a semiconductor device and a method of fabricating the same capable of preventing agglomerations of a metal-semiconductor compound such as a silicide, can be provided. Further, a method of forming the metal-semiconductor compound on a semiconductor pattern for a vertical diode after forming a contact structure, can be provided to prevent agglomerations of the metal-semiconductor compound.

According to some example embodiments of inventive concepts, productivity of the semiconductor device can be improved using insulating material patterns used for formation of the contact structure as one of molding patterns for formation of a lower electrode and a data storage pattern of a memory device.

According to some example embodiments of inventive concepts, a process margin of a semiconductor process to be performed later can be controlled by adjusting the height of an upper surface of the contact structure disposed at a higher level than an upper surface of the semiconductor pattern.

Figure 13:
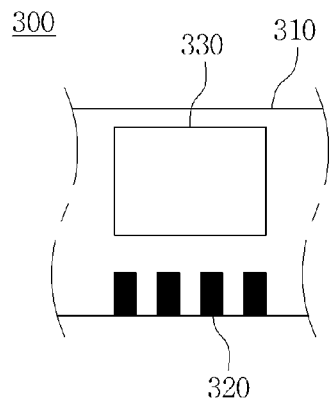
FIG. 13 is a schematic view illustrating a memory card according to some example embodiments of inventive concepts.

FIG. 13 is a schematic diagram illustrating a memory card including a semiconductor device according to some example embodiments of inventive concepts.

Referring to FIG. 13, a memory card 300 includes a card substrate 310, at least one semiconductor device 330 disposed on the card substrate 310, and contact terminals 320 formed parallel to each other in one edge of the card substrate 310 and electrically connected to each of the semiconductor devices 330. The semiconductor device 330 may be a memory chip or a memory package including the semiconductor device according to any one of the above-described example embodiments of inventive concepts. The memory card 300 may be used for an electronic device, such as a digital camera, a computer, a portable storage device, and a portable communication apparatus.

The card substrate 310 may be a printed circuit board (PCB). Both surfaces of the card substrate 310 may be used. For example, the semiconductor devices 330 may be disposed on a front surface and a rear surface of the card substrate 310. The semiconductor devices 330 disposed on the front surface and/or the rear surface of the card substrate 310 may be mechanically and electrically connected to the card substrate 310. The contact terminals 320 may be formed of metal and have oxidation resistance. The contact terminals 320 may be variously set according to kind and standard specification of the memory card 300. Therefore, the number of illustrated contact terminals 320 may be different depending on the kind of an electronic device.

Figure 14:
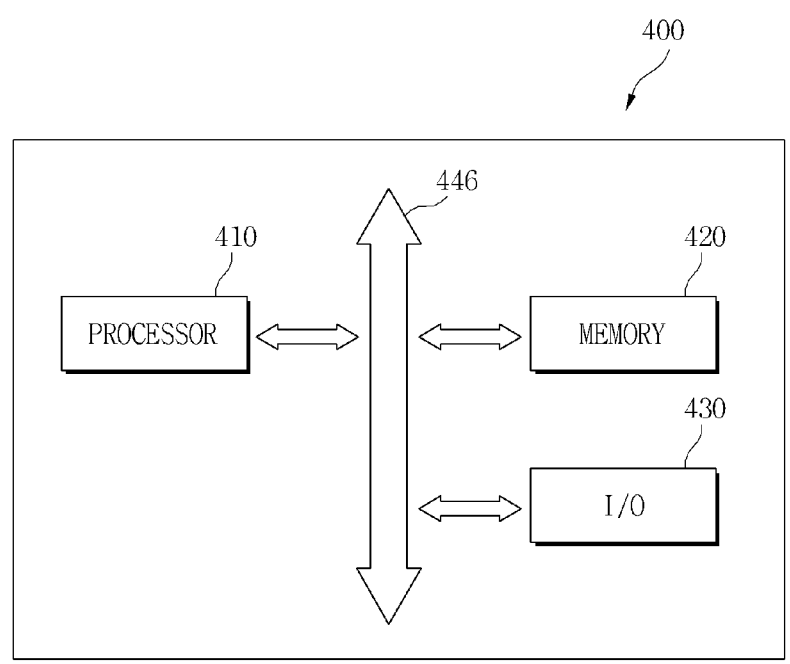
FIG. 14 is a block diagram illustrating an electronic system according to some example embodiments of inventive concepts.

FIG. 14 is a block diagram showing an electronic system including a semiconductor device according to some example embodiments of inventive concepts.

Referring to FIG. 14, an electronic device 400 may be provided. The electronic system 400 may include a processor 410, a memory 420, and an input/output (I/O) device 430. The processor 410 may be electrically connected with the memory 420, and the input/output device 430 through a bus 446.

The memory 420 may receive a control signal such as row address strobe (RAS*), write enable (WE*), and column address strobe (CAS*) from the processor 410. The memory 420 may store codes and data for an operation of the processor 410. The memory 420 may be used to store data accessed through the bus 446.

The memory 420 may include the semiconductor device according to any one of the example embodiments of inventive concepts. An additional circuit and control signals for specific implementation and modification may be provided.

The electronic device 400 may constitute various electronic control devices requiring the memory 420. For example, the electronic device 400 may be used for a computer system or a wireless communication apparatus, such as a personal digital assistant (PDA), a laptop computer, a portable computer, a web tablet, a wireless phone, a mobile phone, a digital music player, an MP3 player, a navigation, a solid state disk (SSD), a household appliance, or all devices which enable information to be received/transmitted in wireless environments.

Figure 15:
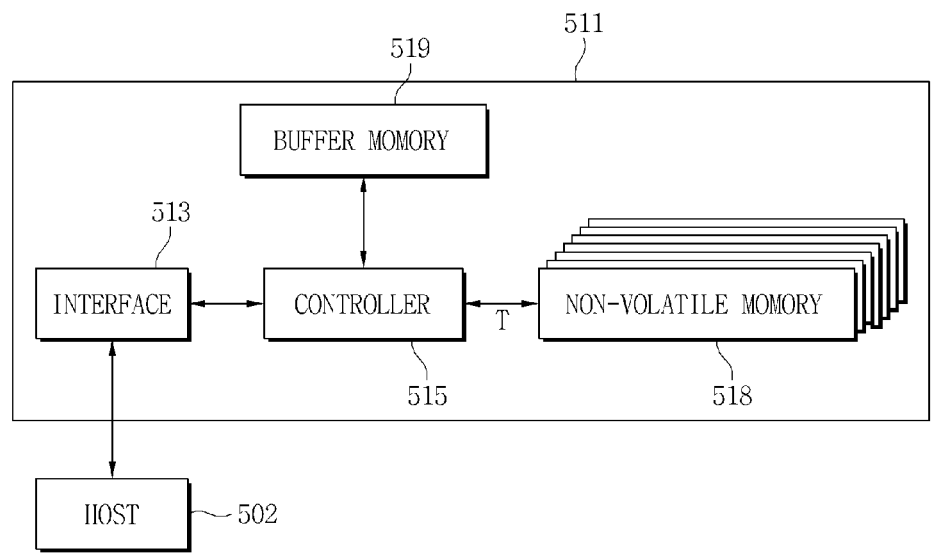
FIG. 15 is a block diagram illustrating a data storage device according to some example embodiments of inventive concepts.

FIG. 15 is a block diagram illustrating a data storing device including a semiconductor device according to some example embodiments of inventive concepts.

Referring to FIG. 15, an electronic device may be a data storing device such as a solid state disk (SSD) 511. The SSD 511 may include an interface 513, a controller 515, a non-volatile memory 518, and a buffer memory 519. The non-volatile memory 518 may include any one of the semiconductor devices according to some example embodiments of inventive concepts.

The SSD 511 may be a device storing data by using the semiconductor device. The SSD 511 may be faster in speed, and with less mechanical delay or failure, heating, and noise as compared with a hard disk drive (HDD), and thereby formed small and light. The SSD 511 may be used in a notebook personal computer (PC), a desktop PC, an MP3 player, a portable computer, a web tablet, or a portable storage device The controller 515 may be formed adjacent to and electrically connected with the interface 513. The controller 515 may be a microprocessor including a memory controller and a buffer controller. The non-volatile memory 518 may be formed adjacent to and electrically connected with the controller 515 via a connection terminal T. Data storage capacity of the data storing device 511 may correspond to the non-volatile memory 518. The buffer memory 519 may be formed adjacent to and electrically connected with the controller 515.

The interface 513 may be connected with a host 502 and may serve as a transceiver of electric signals such as data. For example, the interface 513 may be a device that uses a standard such as serial advanced technology attachment (SATA), integrated device electronics (IDE), small computer system interface (SCSI), and/or combination thereof. The non-volatile memory 518 may be connected with the interface 513 via the controller 515.

The non-volatile memory 518 may serve as storage of data that is received through the interface 513. Although power to the SSD 511 may be interrupted, the SSD 511 has a data retention characteristic in which data is stored in the non-volatile memory 518. The buffer memory 519 may include a volatile memory. The volatile memory may be a dynamic random access memory (DRAM) and/or a static random access memory (SRAM). The buffer memory 519 shows relatively fast operation speed as compared with the non-volatile memory 518.

Data processing speed of the interface 513 may be relatively fast compared with operation speed of the non-volatile memory 518. The buffer memory 519 may serve as temporary storage of data. Data received through the interface 513 may be temporarily stored in the buffer memory 519 via the controller 515, and then may be permanently stored in the non-volatile memory 518 corresponding to data writing speed of the non-volatile memory 518. Also, frequently used data of the stored data in the non-volatile memory 518 may be previously read to temporarily store in the buffer memory 519. For example, the buffer memory 519 may increase effective operation speed of the SSD 511 and reduce error rate.

Figure 16:
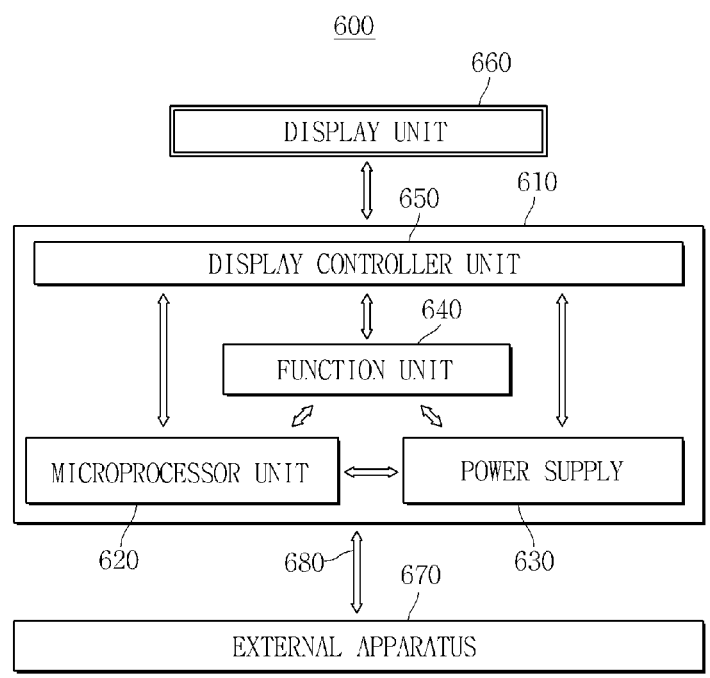
FIG. 16 is a block diagram illustrating an electronic device according to some example embodiments of inventive concepts.

FIG. 16 is a system block diagram of an electronic device including a semiconductor device according to some example embodiments of inventive concepts.

Referring to FIG. 16, the semiconductor device according to some example embodiments of inventive concepts may be applied to an electronic system 600. The electronic system 600 may include a body 610, a microprocessor unit (MPU) 620, a power unit 630, a function 640, and a display controller unit 650. The body 610 may be a motherboard including a printed circuit board (PCB). The MPU 620, the power unit 630, the function unit 640, and the display controller unit 650 may be mounted on the body 610. A display unit 660 may be disposed inside or outside the body 610. For example, the display unit 660 may be disposed on the surface of the body 610 and display an image processed by the display controller unit 650.

The power unit 630 may receive a desired voltage from an external battery (not shown), divide the voltage into required voltage levels, and supply the divided voltages to the MPU 620, the function unit 640, and the display controller unit 650.

The MPU 620 may receive the voltage from the power unit 630 and control the function unit 640 and the display unit 660. The function unit 640 may perform various functions of the electronic system 600. For example, when the electronic system 600 is a portable phone, the function unit 640 may include several components capable of portable phone functions, such as the output of an image to the display unit 660 or the output of a voice to a speaker, by dialing or communication with an external apparatus 670. Also, when the electronic system 600 includes a camera, the electronic system 600 may serve as a camera image processor.

In some example embodiments, when the electronic system 600 is connected to a memory card to increase capacity thereof, the function unit 640 may be a memory card controller. The function unit 640 may transmit/receive signals to/from the external apparatus 670 through a wired or wireless communication unit 680. Further, when the electronic system 600 requires a universal serial bus (USB) to expand functions thereof, the function unit 640 may serve as an interface controller. The semiconductor devices according to some example embodiments of inventive concepts may be applied to at least one of the MPU 620 and the function unit 640.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of example embodiments of inventive concepts as defined in the claims. In the claims, means-plus-function clauses are intended to cover the structures described herein as performing the recited function, and not only structural equivalents but also equivalent structures.

What is claimed is:

1. A method of fabricating a semiconductor device, comprising:
   forming semiconductor patterns at regular intervals on a semiconductor substrate, such that spaces between the semiconductor patterns are filled with a lower interlayer insulating layer;
   forming a lower insulating layer covering the semiconductor patterns and the lower interlayer insulating layer;
   removing a portion of the lower insulating layer and the lower interlayer insulating layer;
   forming a contact structure where the portion of the lower insulating layer and the lower interlayer insulating layer was removed, an upper surface of the contact structure being higher than the semiconductor pattern;
   forming an upper insulating layer that covers the contact structure and the lower insulating layer;
   selectively removing the upper and lower insulating layers to expose the semiconductor patterns without exposing the contact structure; and
   forming metal-semiconductor compounds on the exposed semiconductor patterns after removing the upper and lower insulating layers,
   wherein the selectively removing the upper and lower insulating layers forms first insulating patterns formed between the semiconductor patterns, and a second insulating pattern formed on the contact structure, and
   wherein a distance spaced between the first insulating patterns is greater than a distance spaced between the semiconductor patterns.

2. The method of claim 1, further comprising:
   forming a contact hole, before forming the contact structure, the contact hole penetrating the lower insulating layer and the lower interlayer insulating layer and exposing the semiconductor substrate; and
   forming an impurity region in the semiconductor substrate exposed by the contact hole before forming the contact structure.

3. The method of claim 1, further comprising:
   forming lower electrodes on the metal-semiconductor compounds; and
   forming data storage patterns on the lower electrodes.

4. The method of claim 3, further comprising:
   forming an upper interlayer insulating layer on the semiconductor substrate having the data storage patterns;
   forming a first groove and a second groove, the first groove penetrating the upper interlayer insulating layer and having a portion overlapping the data storage patterns, and the second groove penetrating the upper interlayer insulating layer and
   the upper insulating layer and having a portion overlapping the contact structure; and forming a first conductive pattern in the first groove, and a second conductive pattern in the second groove,
   wherein a lower surface of the second conductive pattern is at a level lower than lower surfaces of the first conductive patterns.

5. The method of claim 4, wherein the first conductive pattern is formed in a line shape.

6. The method of claim 4, further comprising:
   forming upper electrodes on the data storage patterns before forming the upper interlayer insulating layer,
   wherein the upper electrodes are electrically connected to the data storage patterns and the first conductive pattern.

* * * * *